(12) United States Patent
Ji et al.

(10) Patent No.: US 10,854,573 B2
(45) Date of Patent: Dec. 1, 2020

(54) SEMICONDUCTOR DIE SINGULATION USING A SACRIFICIAL BONDING MATERIAL LAYER AND AN ANISOTROPIC CHANNEL ETCH

(71) Applicant: SANDISK TECHNOLOGIES LLC, Addison, TX (US)

(72) Inventors: Zhongli Ji, Shanghai (CN); Ning Ye, San Jose, CA (US); Tong Zhang, Palo Alto, CA (US); Hem Takiar, Fremont, CA (US); Yangming Liu, Shanghai (CN)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/248,923

(22) Filed: Jan. 16, 2019

(65) Prior Publication Data
US 2020/0219842 A1 Jul. 9, 2020

(30) Foreign Application Priority Data
Jan. 9, 2019 (CN) .......................... 2019 1 0019750

(51) Int. Cl.
*H01L 21/00* (2006.01)
*H01L 23/00* (2006.01)
(Continued)

(52) U.S. Cl.
CPC ........ *H01L 24/96* (2013.01); *H01L 21/30608* (2013.01); *H01L 21/76832* (2013.01);
(Continued)

(58) Field of Classification Search
CPC ......... H01L 21/02304; H01L 21/02334; H01L 21/02345; H01L 21/31105; H01L 21/6835;
(Continued)

(56) References Cited

U.S. PATENT DOCUMENTS 5,915,167 A 6/1999 Leedy
8,236,611 B1 * 8/2012 Anderson ............... H01L 21/78
257/E21.483
(Continued)

OTHER PUBLICATIONS

M. Liebens, et. al., "In-line Metrology for Characterization and Control of Extreme Wafer Thinning of Bonded Wafers," ASMC 2017 Proceedings, pp. 331-336.
(Continued)

*Primary Examiner* — Meiya Li
(74) *Attorney, Agent, or Firm* — The Marbury Law Group, PLLC

(57) ABSTRACT

A substrate semiconductor layer is attached to a carrier substrate through a sacrificial bonding material layer. A plurality of semiconductor dies included within continuous material layers are formed on a front side of the substrate semiconductor layer. Each of the continuous material layers continuously extends over areas of the plurality of semiconductor dies. A plurality of dicing channels is formed between neighboring pairs among the plurality of semiconductor dies by anisotropically etching portions of the continuous material layers located between neighboring pairs of semiconductor dies. The plurality of dicing channels extends to a top surface of the sacrificial bonding material layer. The sacrificial bonding material layer is removed selective to materials of surface portions of the plurality of semiconductor dies using an isotropic etch process. The plurality of semiconductor dies is singulated from one another upon removal of the sacrificial bonding material layer.

17 Claims, 50 Drawing Sheets

(51) Int. Cl.
- *H01L 23/31* (2006.01)
- *H01L 27/11582* (2017.01)
- *H01L 21/306* (2006.01)
- *H01L 21/822* (2006.01)
- *H01L 21/768* (2006.01)
- *H01L 27/1157* (2017.01)

(52) U.S. Cl.
CPC ...... *H01L 21/8221* (2013.01); *H01L 23/3171* (2013.01); *H01L 27/1157* (2013.01); *H01L 27/11582* (2013.01)

(58) Field of Classification Search
CPC ..... H01L 21/76251; H01L 2221/68318; H01L 2221/68327; H01L 2221/6834; H01L 2221/68381; H01L 27/1203; H01L 21/76256; H01L 21/78
See application file for complete search history.

(56) References Cited

U.S. PATENT DOCUMENTS

| | | | |
|---|---|---|---|
| 2004/0209402 A1* | 10/2004 | Chai | C30B 25/02 438/122 |
| 2012/0244683 A1* | 9/2012 | Akagi | H01L 21/187 438/464 |
| 2014/0167209 A1* | 6/2014 | Meiser | H01L 21/76224 257/506 |
| 2016/0035616 A1* | 2/2016 | Cheng | H01L 21/78 257/637 |

OTHER PUBLICATIONS

U.S. Appl. No. 15/873,101, filed Jan. 17, 2018, SanDisk Technologies LLC.
U.S. Appl. No. 15/892,648, filed Feb. 9, 2018, SanDisk Technologies LLC.
U.S. Appl. No. 15/928,340, filed Mar. 22, 2018, SanDisk Technologies LLC.
U.S. Appl. No. 15/928,407, filed Mar. 22, 2018, SanDisk Technologies LLC.
U.S. Appl. No. 15/960,267, filed Apr. 23, 2018, SanDisk Technologies LLC.
U.S. Appl. No. 15/979,885, filed May 15, 2018, SanDisk Technologies LLC.
U.S. Appl. No. 16/231,752, filed Dec. 24, 2018, SanDisk Technologies LLC.
U.S. Appl. No. 62/720,327, filed Aug. 21, 2018, SanDisk Technologies LLC.

* cited by examiner

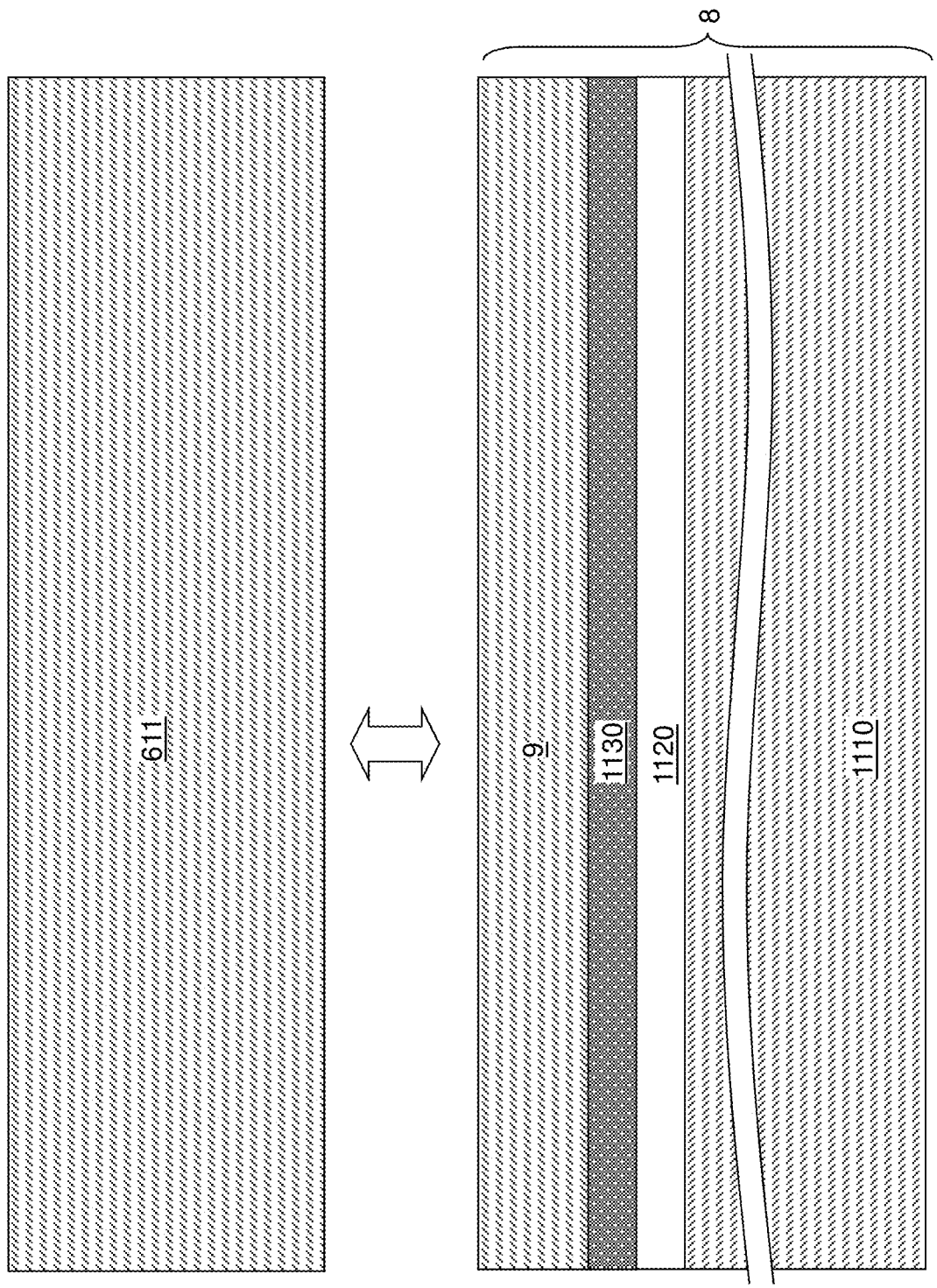

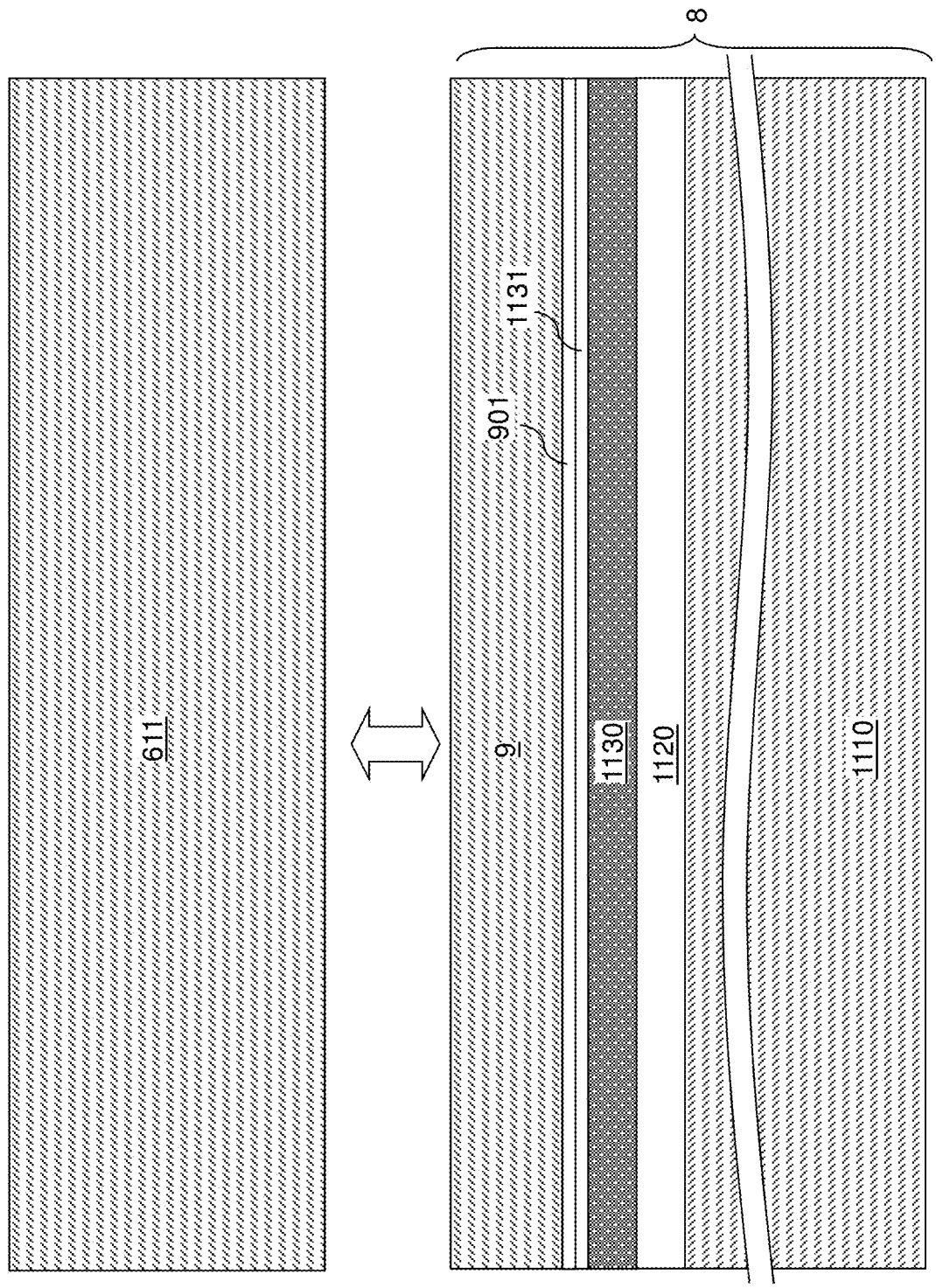

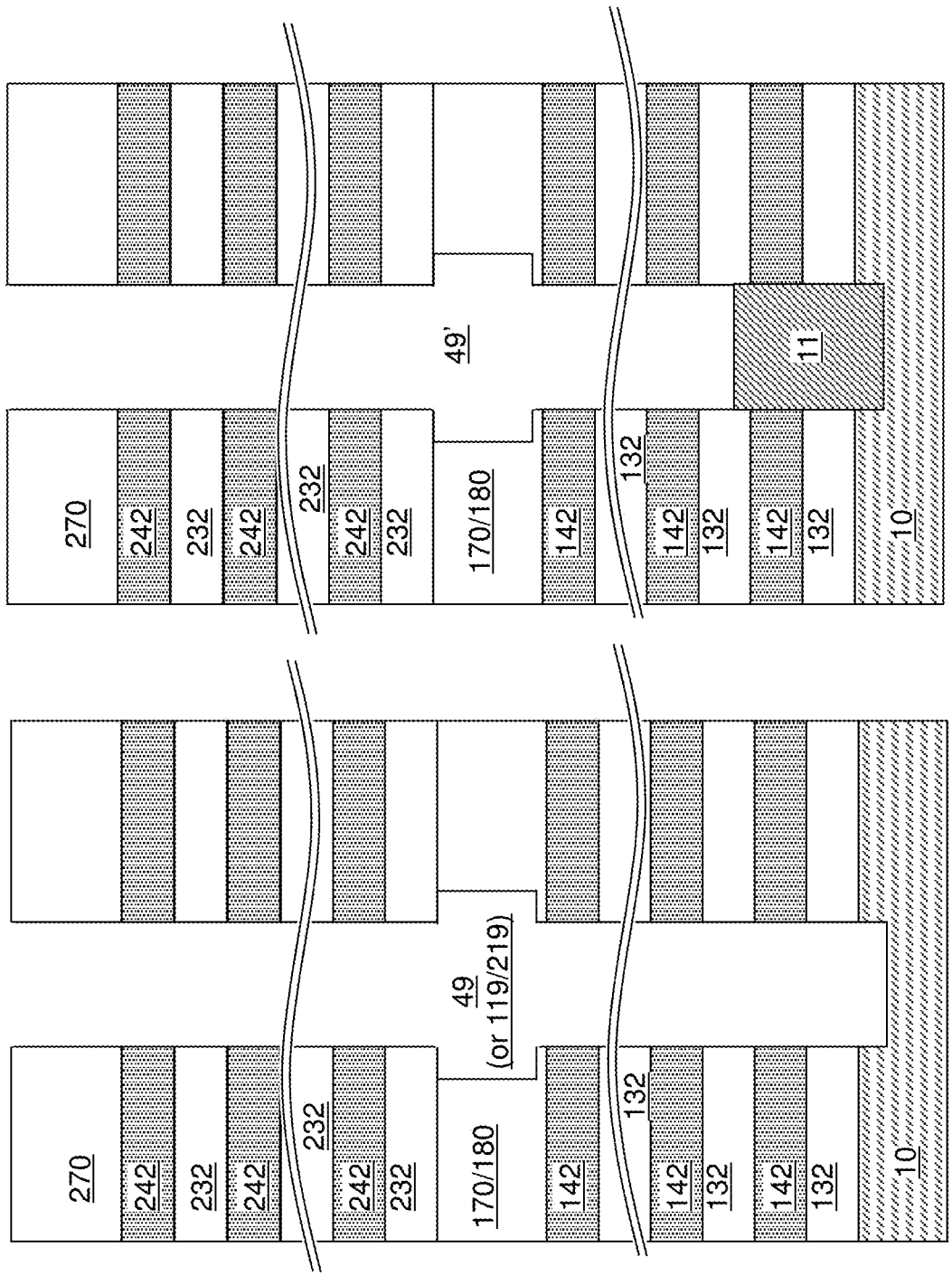

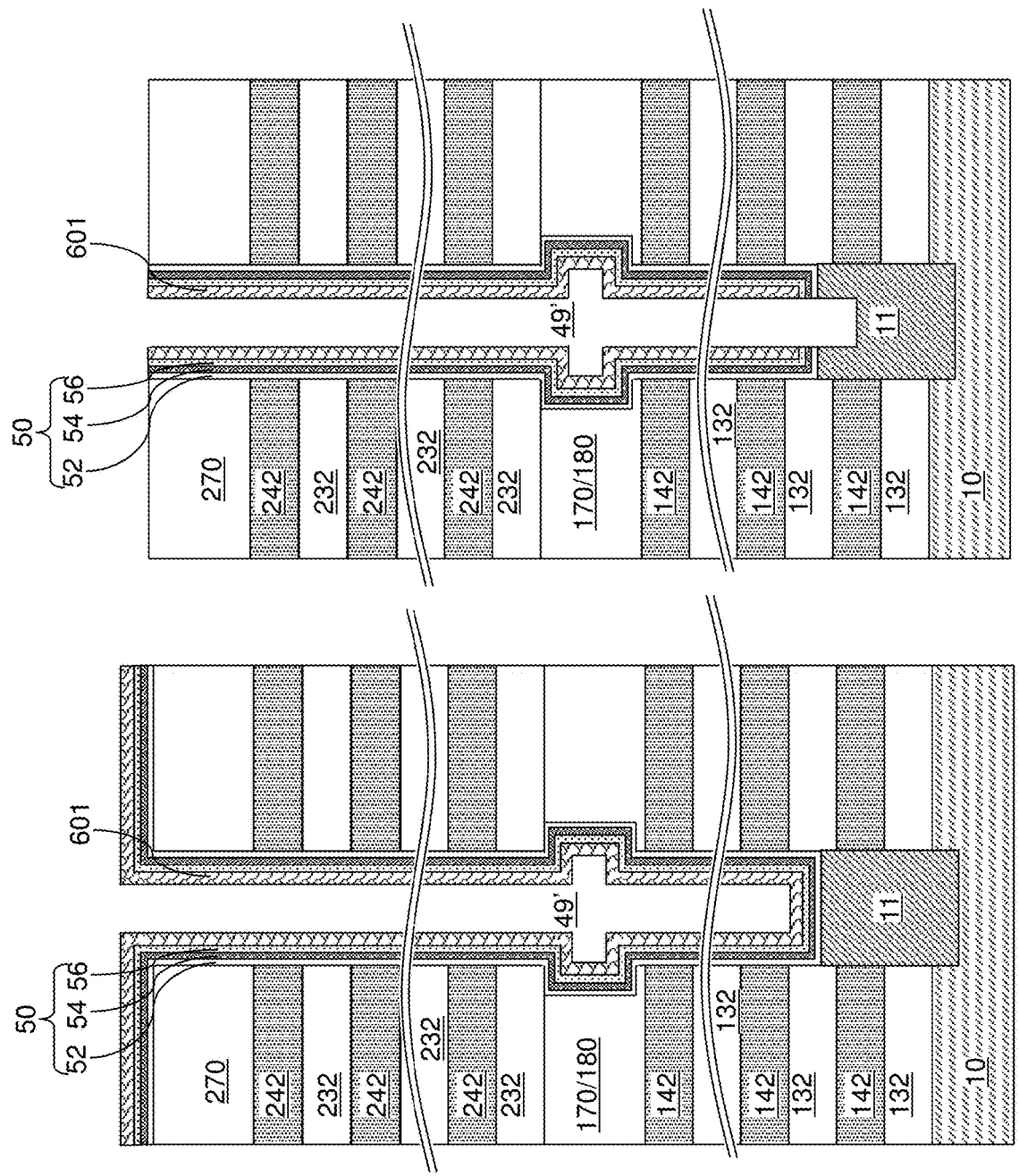

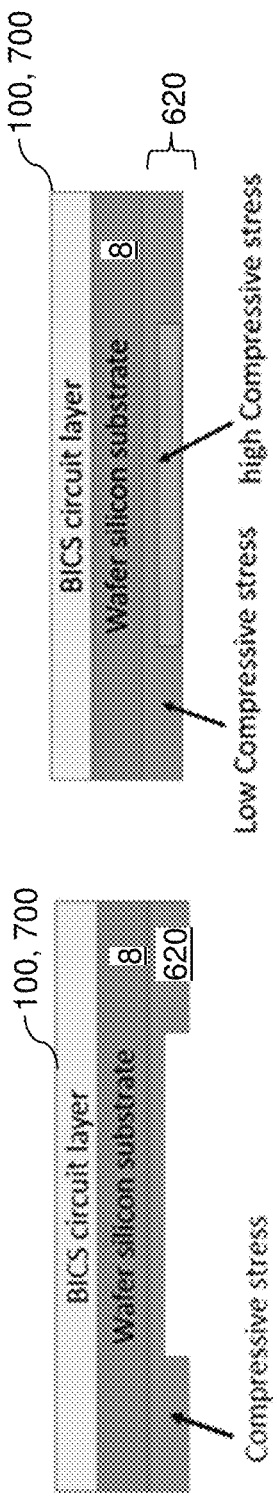
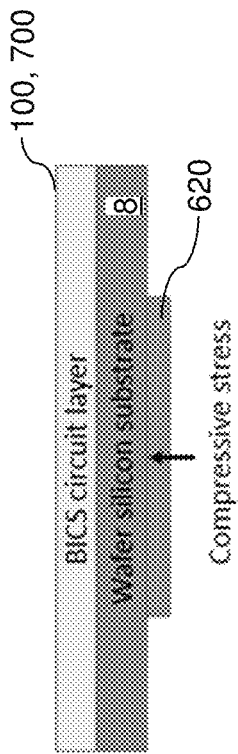
FIG. 26A
FIG. 26B
FIG. 26C

SEMICONDUCTOR DIE SINGULATION USING A SACRIFICIAL BONDING MATERIAL LAYER AND AN ANISOTROPIC CHANNEL ETCH

FIELD

The present disclosure relates generally to the field of semiconductor devices, and specifically to a method of singulating semiconductor dies using a sacrificial bonding material layer and an anisotropic channel etch process and singulated dies formed by the same.

BACKGROUND

A semiconductor wafer includes multiple semiconductor dies that need to be singulated before the packaging process in which each semiconductor die is electrically connected to leads in a chip package. The process of singulation typically uses dicing, in which the semiconductor wafer is diced along dicing channels provided between neighboring pairs of semiconductor dies. A mechanical saw is used to cut through each of the dicing channels. The dicing process imposes significant mechanical stress on the semiconductor devices located within the semiconductor dies, and can cause device failure. Further, mechanical dicing can be time consuming and costly because the semiconductor wafer has a significant thickness that is typically greater than 600 microns. While the backside of the semiconductor wafer can be ground prior to mechanical dicing to alleviate the stress during mechanical dicing, backside grinding is time-consuming and costly.

SUMMARY

According to an aspect of the present disclosure, a method of forming singulated semiconductor dies is provided, which comprises: forming a sacrificial bonding material layer on a front side surface of a carrier substrate; attaching a substrate semiconductor layer to a front side of the sacrificial bonding material layer; forming a plurality of semiconductor dies included within continuous material layers on a front side of the substrate semiconductor layer, each of the continuous material layers continuously extending over areas of the plurality of semiconductor dies; forming a plurality of dicing channels between neighboring pairs among the plurality of semiconductor dies at least by anisotropically etching portions of the continuous material layers located between neighboring pairs of semiconductor dies, wherein the plurality of dicing channels extends to a top surface of the sacrificial bonding material layer; and removing the sacrificial bonding material layer selective to materials of surface portions of the plurality of semiconductor dies using an isotropic etch process, wherein the plurality of semiconductor dies is singulated from one another upon removal of the sacrificial bonding material layer.

According to another aspect of the present disclosure, a three-dimensional memory device is provided, which comprises: three-dimensional memory device structures located on a front side surface of a semiconductor substrate layer; a silicon nitride passivation layer contacting an entirety of a backside surface of the semiconductor substrate layer; interconnect level dielectric layers that include metal interconnect structures and located over the substrate semiconductor layer; a cap silicon nitride passivation layer contacting metallic contact pads electrically connected to the metal interconnect structures and located over the interconnect level dielectric layers; and a silicon nitride passivation liner contacting an entirety of outer sidewalls of the interconnect level dielectric layers and vertically extending between the silicon nitride passivation layer and the cap silicon nitride passivation layer.

According to still another aspect of the present disclosure, a singulated semiconductor die is provided, which comprises: semiconductor devices located on a front side surface of a semiconductor substrate layer; interconnect level dielectric layers that include metal interconnect structures and located over the substrate semiconductor layer; and a silicon nitride passivation liner contacting an entirety of outer sidewalls of the interconnect level dielectric layers and an entirety of outer sidewalls of the semiconductor substrate layer, wherein the singulated semiconductor die has a non-rectangular horizontal cross-sectional shape.

BRIEF DESCRIPTION OF THE DRAWINGS

FIGS. 1A-1E are sequential vertical cross-sectional views of an exemplary structure during formation of a composite substrate according to embodiment of the present disclosure.

FIG. 1F is a vertical cross-sectional view of an alternative embodiment of the exemplary structure.

FIGS. 10A-10H are sequential vertical cross-sectional views of an inter-tier memory opening during formation of a pillar channel portion, a memory stack structure, a dielectric core, and a drain region according to an embodiment of the present disclosure.

FIGS. 26A-26C illustrate various configurations for a patterned backside stress layer on a semiconductor die according to embodiments of the present disclosure.

DETAILED DESCRIPTION

Figure 1A:
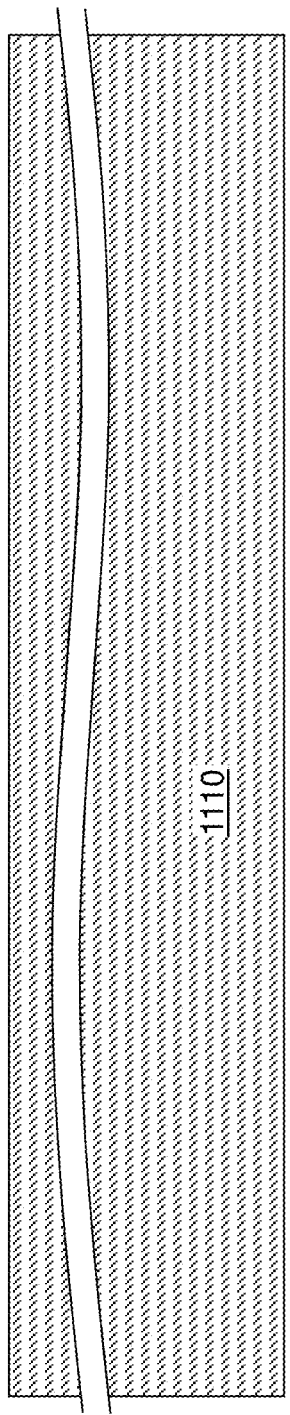

As discussed above, embodiments of the present disclosure are directed to a method of singulating semiconductor die using a sacrificial bonding material layer and an anisotropic channel etch process and singulated die formed by the same, the various aspects of which are described herein in detail. The embodiments of the present disclosure provide a method of forming singulated semiconductor dies without generating mechanical stress during the singulation process, and thus, can increase the dicing yield and die reliability.

The drawings are not drawn to scale. Multiple instances of an element may be duplicated where a single instance of the element is illustrated, unless absence of duplication of elements is expressly described or clearly indicated otherwise. Same elements and similar elements are referred to by a same reference numeral. Elements with a same reference numeral are presumed to have a same material composition unless expressly stated otherwise. Ordinals such as "first," "second," and "third" are used merely to identify similar elements, and different ordinals may be used across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device Three-dimensional memory devices according to various embodiments of the present disclosure include a monolithic three-dimensional NAND string memory device, and can be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

While the present disclosure is described using an embodiment in which each semiconductor die includes a three-dimensional memory device, various embodiments of the present disclosure can be practiced with any semiconductor chip including any semiconductor device known in the art. As such, generalization of the methods and structures of the present disclosure to all compatible devices is expressly contemplated herein.

Referring to FIG. 1A, a carrier substrate 1110 is illustrated, which is used as a structural support element for a substrate semiconductor layer to be subsequently bonded thereto. The carrier substrate 1110 can include a semiconductor substrate such as a commercially available silicon wafer having a diameter in a range from 100 mm to 450 mm and having a thickness in a range from 400 microns to 1 mm. Alternatively, the carrier substrate 1110 can include an insulating material such as sapphire and/or a conductive material such as a metal. The carrier substrate 1110 is thick enough to permit mechanical handling and thermal cycles to be subsequently performed during manufacture of semiconductor dies on the substrate semiconductor layer. As such, the carrier substrate 1110 includes material(s) that can withstand an anneal at elevated temperatures up to 1,000 degrees Celsius.

Figure 1B:
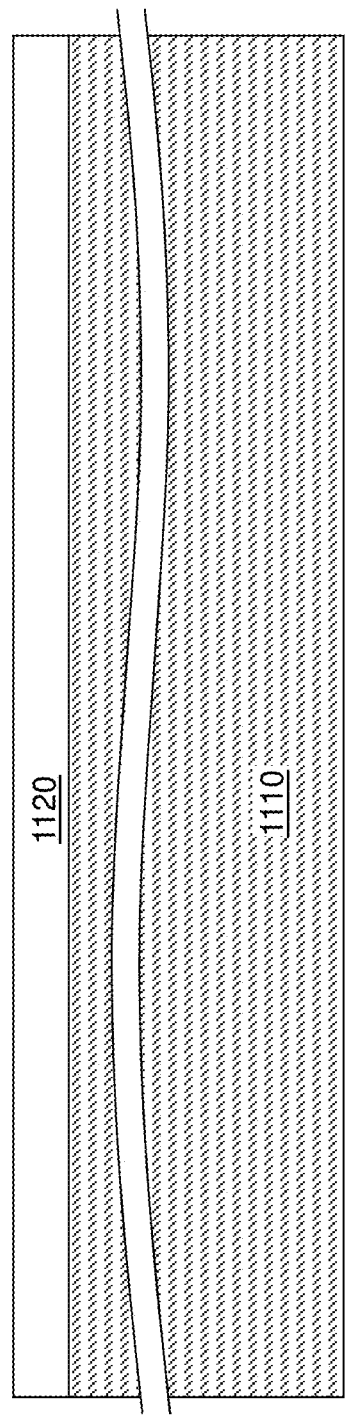

Referring to FIG. 1B, a sacrificial bonding material layer 1120 is formed on a front side surface of the carrier substrate 1110. The sacrificial bonding material layer 1120 includes a bonding material that permits bonding of the carrier substrate 1110 to the substrate semiconductor layer to be subsequently used. The sacrificial bonding material layer 1120 includes a material that can be subsequently removed selective to the carrier substrate 1110. For example, the sacrificial bonding material layer 1120 can include a material such as a doped silicate glass, undoped silicate glass, organosilicate glass, and/or thermal silicon oxide. The sacrificial bonding material layer 1120 can be formed by deposition of a sacrificial bonding material or by oxidation of a surface portion of the carrier substrate 1110. In one embodiment, a doped silicate glass (such as borosilicate glass), undoped silicate glass, or organosilicate glass can be deposited by chemical vapor deposition to form the sacrificial bonding material layer 1120. Alternatively, the carrier substrate 1110 can include a silicon wafer, and the sacrificial bonding material layer 1120 can be formed by thermal oxidation of an upper surface portion of the silicon wafer. In one embodiment, the sacrificial bonding material layer 1120 can include a silicon oxide-based material that can be etched by hydrofluoric acid, sodium peroxide, peroxide, or a combination or a mixture thereof. In one embodiment, the sacrificial bonding material layer 1120 can have a uniform thickness in a range from 5 microns to 20 microns, although lesser and greater thicknesses can also be used. The uniform thickness of the sacrificial bonding material layer 1120 is herein referred to as a first thickness.

Figure 1C:
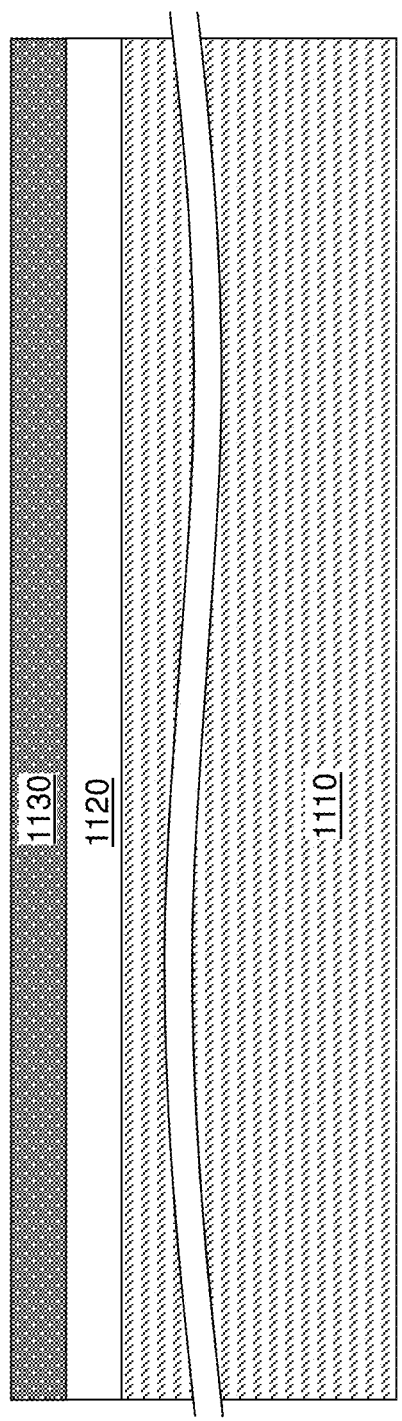

Referring to FIG. 1C, a backside silicon nitride passivation layer 1130 can be optionally formed on a top surface of the sacrificial bonding material layer 1120. The backside silicon nitride passivation layer 1130 is also referred to as a silicon nitride passivation layer. The backside silicon nitride passivation layer 1130 can be formed by deposition of silicon nitride by chemical vapor deposition. The backside silicon nitride passivation layer 1130 is an intermediate dielectric material layer that is disposed between the sacrificial bonding material layer 1120 and the substrate semiconductor layer to be subsequently used. The thickness of the backside silicon nitride passivation layer 1130 can be in a range from 200 nm to 2,000 nm, although lesser and greater thicknesses can also be used. The backside silicon nitride passivation layer 1130 can be used to assist the substrate bonding process to be subsequently used, and to minimize warpage of a composite substrate and dies to be subsequently formed.

Figure 1D:
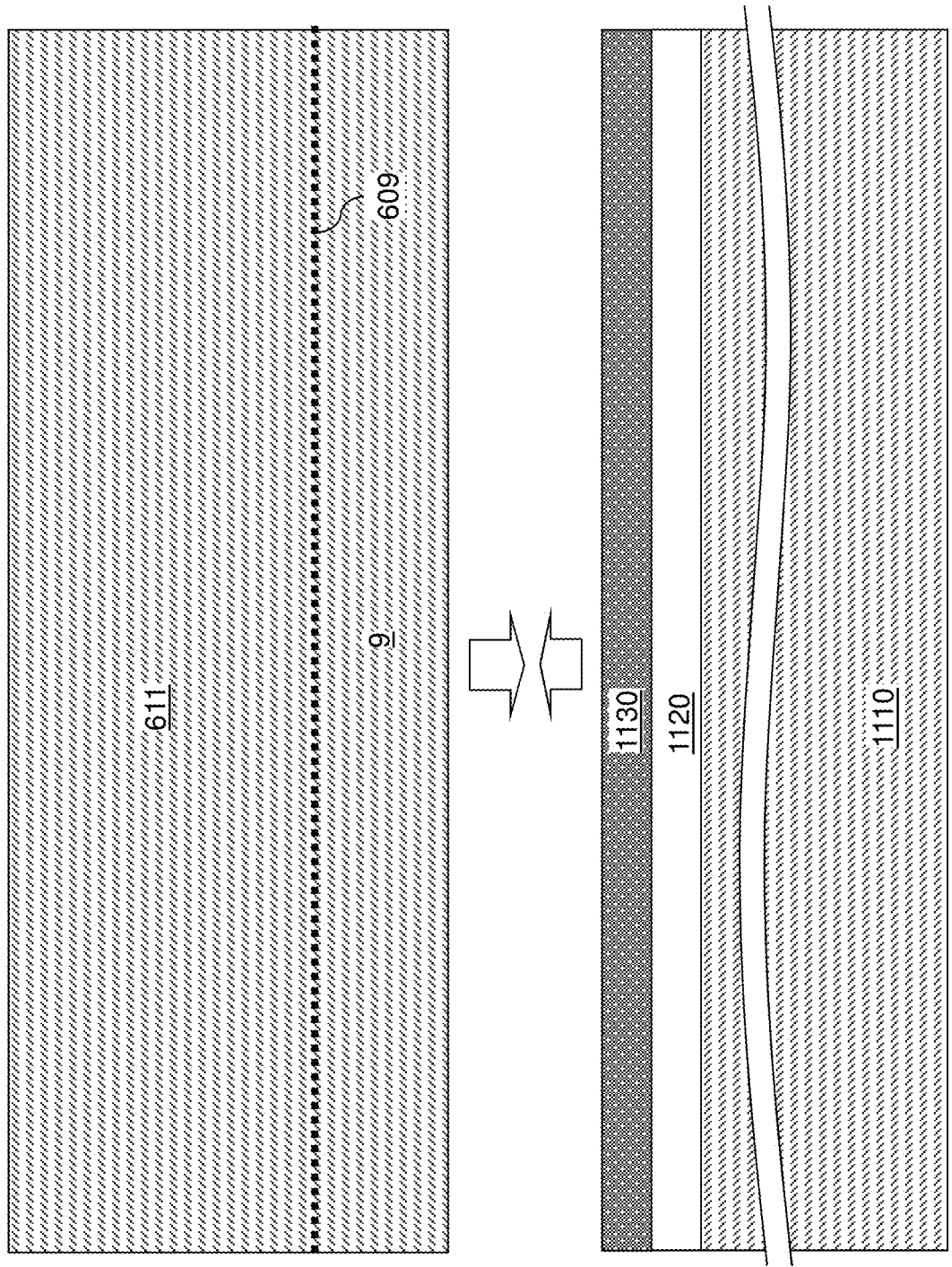

Referring to FIG. 1D, a substrate semiconductor layer 9 is provided, which includes a single crystalline semiconductor material such as single crystalline silicon. The substrate semiconductor layer 9 can have a thickness in a range from 200 nm to 10 microns, although lesser and greater thicknesses can also be used. The thickness of the substrate semiconductor layer 9 is herein referred to as a second thickness. The substrate semiconductor layer 9 can have about the same lateral extent as the carrier substrate 1110.

In one embodiment, the substrate semiconductor layer 9 can be provided within a source substrate (9, 609, 611) that includes a stack of the substrate semiconductor layer 9, a buried hydrogen separation layer 609, and a matrix semiconductor material layer 611. The source substrate (9, 609, 611) can be formed by providing a commercial semiconductor wafer such as a single crystalline silicon wafer, and by implanting hydrogen atoms from one side of the single crystalline silicon wafer. The implanted hydrogen atoms form the buried hydrogen separation layer 609, a proximal portion of the semiconductor wafer located on the ion-implanted side constitutes the substrate semiconductor layer 9, and a distal portion of the semiconductor wafer located on the opposite side of the ion-implanted side constitutes the matrix semiconductor material layer 611.

The source semiconductor substrate (9, 609, 611) can be bonded to the front side of the sacrificial bonding material layer 1120. Specifically, the substrate semiconductor layer 9 can be bonded to the sacrificial bonding material layer 1120 directly (if the backside silicon nitride passivation layer 1130 is not present) or through the backside silicon nitride passivation layer 1130. Optionally, at least one surface bonding assist layer may be formed on a physically exposed surface of the backside silicon nitride passivation layer 1130 and/or on a physically exposed surface of the substrate semiconductor layer 9.

Referring to FIG. 1E, the matrix semiconductor material layer 611 (i.e., the distal portion of the source semiconductor substrate (9, 609, 611)) can be separated from the sacrificial bonding material layer 1120 by cleaving the source semiconductor substrate 9 at the buried hydrogen implantation layer 609. In one embodiment, an anneal at an elevated temperature in a range from 200 degrees to 500 degrees can be used to separate the matrix semiconductor material layer 611 from the substrate semiconductor layer 9. The substrate semiconductor layer 9 is the remaining proximal portion of the source semiconductor substrate (9, 609, 611) that is attached to the sacrificial bonding material layer 1120. The substrate semiconductor layer 9 is attached to the front side of the sacrificial bonding material layer 1120, i.e., the side that does not contact the carrier substrate 1110. A compound substrate 8 is provided, which includes the carrier substrate 1110, the sacrificial bonding material layer 1120, the optional backside silicon nitride passivation layer 1130, and the substrate semiconductor layer 9.

Referring to FIG. 1F, an alternative embodiment of the exemplary structure is illustrated, which can be derived from the exemplary structure of FIG. 1E by forming at least one additional intermediate dielectric material layer (1131, 901). The at least one additional intermediate dielectric material layer (1131, 901) can include a carrier-side intermediate dielectric material layer 1131 and/or a device-side intermediate dielectric material layer 901. The carrier-side intermediate dielectric material layer 1131 can be formed on the backside silicon nitride passivation layer 1130, and/or the device-side intermediate dielectric material layer 901 can be formed on a surface of the substrate semiconductor layer 9. In one embodiment, the carrier-side intermediate dielectric material layer 1131 and/or the device-side intermediate dielectric material layer 901 can include a respective silicon oxide layer having a thickness in a range from 100 nm to 1,000 nm. In some embodiments, the bonding between the backside silicon nitride passivation layer 1130 (or the sacrificial bonding material layer 1120) and the substrate semiconductor layer 9 can be facilitated by the carrier-side intermediate dielectric material layer 1131 and/or the device-side intermediate dielectric material layer 901. In one embodiment, the bonding between the carrier substrate 1110 and the substrate semiconductor layer 9 may use an oxide-to-oxide bonding between the device-side intermediate dielectric material layer 901 and the carrier-side intermediate dielectric material layer 1131.

Figure 2:
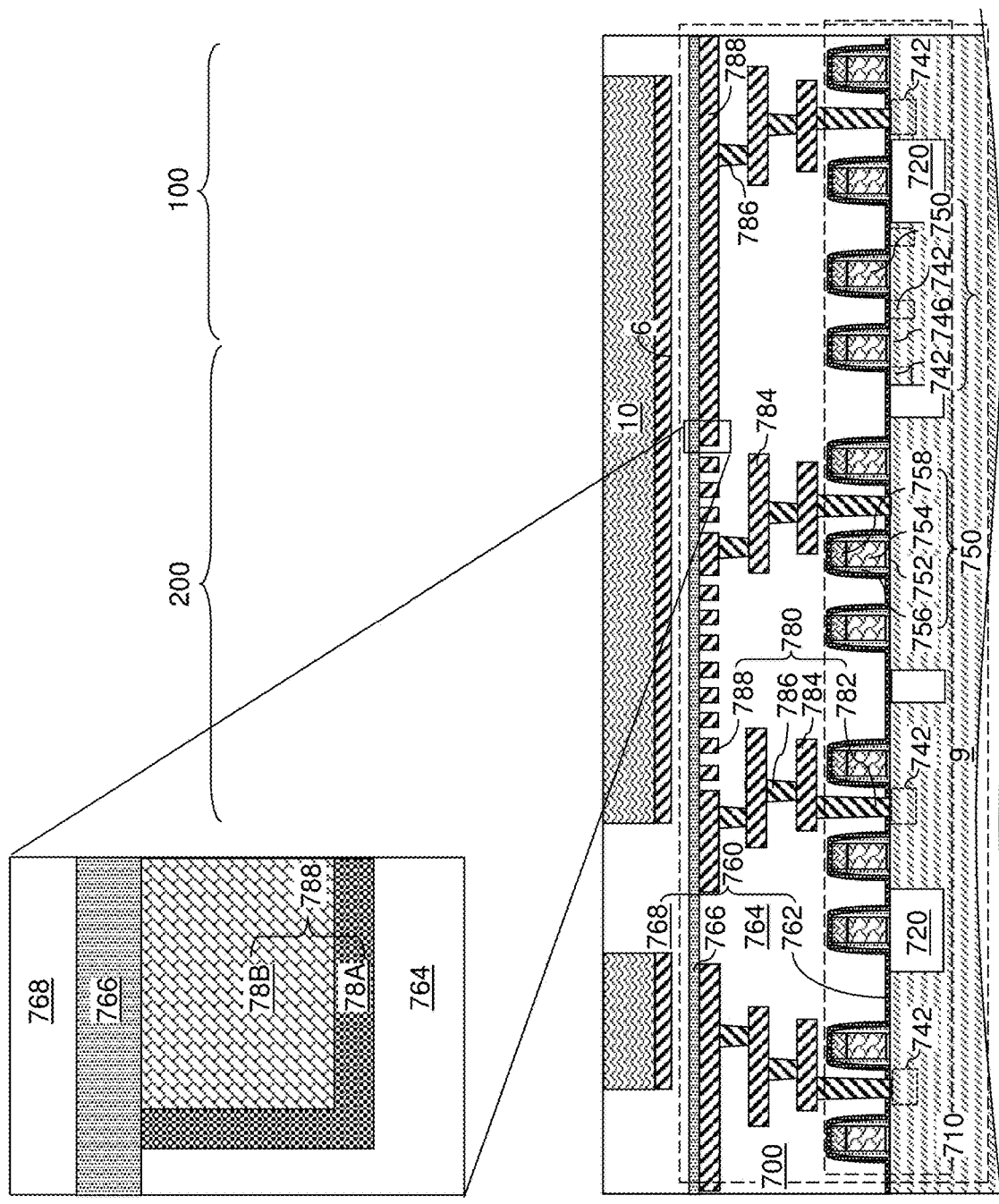
FIG. 2 is a vertical cross-sectional view of an exemplary structure after formation of semiconductor devices, lower interconnect level dielectric layers including a silicon nitride layer, lower metal interconnect structures, and a planar semiconductor material layer on a semiconductor substrate according to a first embodiment of the present disclosure.

Referring to FIG. 2, semiconductor devices 710 can be formed on the substrate semiconductor layer 9 in the composite substrate 8. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746 and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which is herein referred to as lower interconnect level dielectric layers 760. The lower interconnect level dielectric layers 760 constitute a dielectric layer stack in which each lower interconnect level dielectric layer 760 overlies or underlies other lower interconnect level dielectric layers 760. The lower interconnect level dielectric layers 760 can include, for example, a dielectric liner 762 such as a silicon nitride liner that blocks diffusion of mobile ions and/or apply appropriate stress to underlying structures, at least one first dielectric material layer 764 that overlies the dielectric liner 762, a silicon nitride layer (e.g., hydrogen diffusion barrier) 766 that overlies the dielectric material layer 764, and at least one second dielectric layer 768.

The dielectric layer stack including the lower interconnect level dielectric layers 760 functions as a matrix for lower metal interconnect structures 780 that provide electrical wiring among the various nodes of the semiconductor devices and landing pads for through-stack contact via structures to be subsequently formed. The lower metal interconnect structures 780 are included within the dielectric layer stack of the lower interconnect level dielectric layers 760, and comprise a lower metal line structure located under and optionally contacting a bottom surface of the silicon nitride layer 766.

For example, the lower metal interconnect structures 780 can be included within the at least one first dielectric material layer 764. The at least one first dielectric material layer 764 may be a plurality of dielectric material layers in which various elements of the lower metal interconnect structures 780 are sequentially included. Each dielectric material layer among the at least one first dielectric material layer 764 may include any of doped silicate glass, undoped silicate glass, organosilicate glass, silicon nitride, silicon oxynitride, and dielectric metal oxides (such as aluminum oxide). In one embodiment, the at least one first dielectric material layer 764 can comprise, or consist essentially of, dielectric material layers having dielectric constants that do not exceed the dielectric constant of undoped silicate glass (silicon oxide) of 3.9.

The lower metal interconnect structures 780 can include various device contact via structures 782 (e.g., source and drain electrodes which contact the respective source and drain nodes of the device or gate electrode contacts), intermediate lower metal line structures 784, lower metal via structures 786, and topmost lower metal line structures 788 that are configured to function as landing pads for through-stack contact via structures to be subsequently formed. In this case, the at least one first dielectric material layer 764 may be a plurality of dielectric material layers that are formed level by level while incorporating components of the lower metal interconnect structures 780 within each respective level.

The topmost lower metal line structures 788 can be formed within a topmost dielectric material layer of the at least one first dielectric material layer 764 (which can be a plurality of dielectric material layers). Each of the lower metal interconnect structures 780 can include a metallic nitride liner 78A and a metal fill portion 78B. Each metallic nitride liner 78A can include a conductive metallic nitride material such as TiN, TaN, and/or WN. Each metal fill portion 78B can include an elemental metal (such as Cu, W, Al, Co, Ru) or an intermetallic alloy of at least two metals. Top surfaces of the topmost lower metal line structures 788 and the topmost surface of the at least one first dielectric material layer 764 may be planarized by a planarization process, such as chemical mechanical planarization. In this case, the top surfaces of the topmost lower metal line structures 788 and the topmost surface of the at least one first dielectric material layer 764 may be within a horizontal plane that is parallel to the top surface of the substrate 8.

The silicon nitride layer 766 can be formed directly on the top surfaces of the topmost lower metal line structures 788 and the topmost surface of the at least one first dielectric material layer 764. The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass.

An optional layer of a metallic material and a layer of a semiconductor material can be deposited over, or within patterned recesses of, the at least one second dielectric material layer 768, and is lithographically patterned to provide an optional planar conductive material layer 6 and a planar semiconductor material layer 10. The optional planar conductive material layer 6, for example, may include a tungsten layer having a thickness in a range from 3 nm to 100 nm, although lesser and greater thicknesses can also be used. A metal nitride layer (not shown) may be provided as a diffusion barrier layer on top of the planar conductive material layer 6. Layer 6 may function as a special source line in the completed device. Alternatively, layer 6 may comprise an etch stop layer and may comprise any suitable conductive, semiconductor or insulating layer.

The planar semiconductor material layer 10 can include horizontal semiconductor channels and/or source regions for a three-dimensional array of memory devices to be subsequently formed. The optional planar conductive material layer 6 can include a metallic compound material such as a conductive metallic nitride (e.g., TiN) and/or a metal (e.g., W). The thickness of the optional planar conductive material layer 6 may be in a range from 5 nm to 100 nm, although lesser and greater thicknesses can also be used. The planar semiconductor material layer 10 includes a polycrystalline semiconductor material such as polysilicon or a polycrystalline silicon-germanium alloy. The thickness of the planar semiconductor material layer 10 may be in a range from 30 nm to 300 nm, although lesser and greater thicknesses can also be used. In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type. The optional planar conductive material layer 6 and the planar semiconductor material layer 10 may be patterned to provide openings in areas in which through-stack contact via structures and through-dielectric contact via structures are to be subsequently formed.

The region of the semiconductor devices 710 and the combination of the lower interconnect level dielectric layers 760 and the lower metal interconnect structures 780 is herein referred to an underlying peripheral device region 700, which is located underneath a memory-level assembly to be subsequently formed and includes peripheral devices for the memory-level assembly. The lower metal interconnect structures 780 are included in the lower interconnect level dielectric layers 760.

Figure 3:
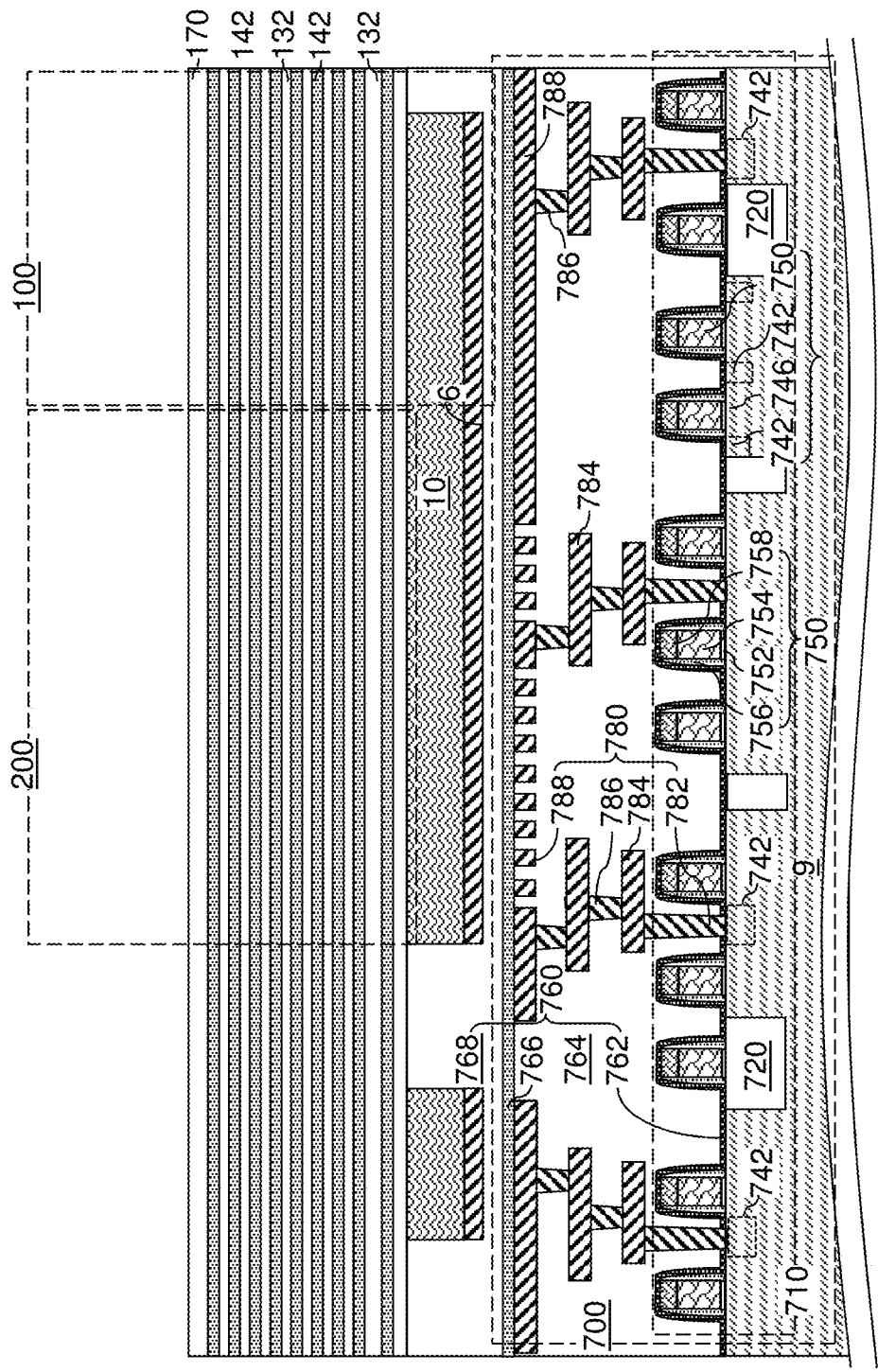
FIG. 3 is a vertical cross-sectional view of the exemplary structure after formation of a first-tier alternating stack of first insulating layers and first spacer material layers according to an embodiment of the present disclosure.

Referring to FIG. 3, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step. As used herein, an alternating stack of first elements and second elements refers to a structure in which instances of the first elements and instances of the second elements alternate. In one embodiment, an instance of the first elements and an instance of the second elements may form a unit that is repeated with periodicity within the alternating plurality.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. In one embodiment, the first insulating layers 132 can include silicon oxide, and sacrificial material layers can include silicon nitride sacrificial material layers.

The thicknesses of the first insulating layers 132 and the first sacrificial material layers 142 can be in a range from 20 nm to 50 nm, although lesser and greater thicknesses can be used for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be used. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be used for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be used.

Figure 4:
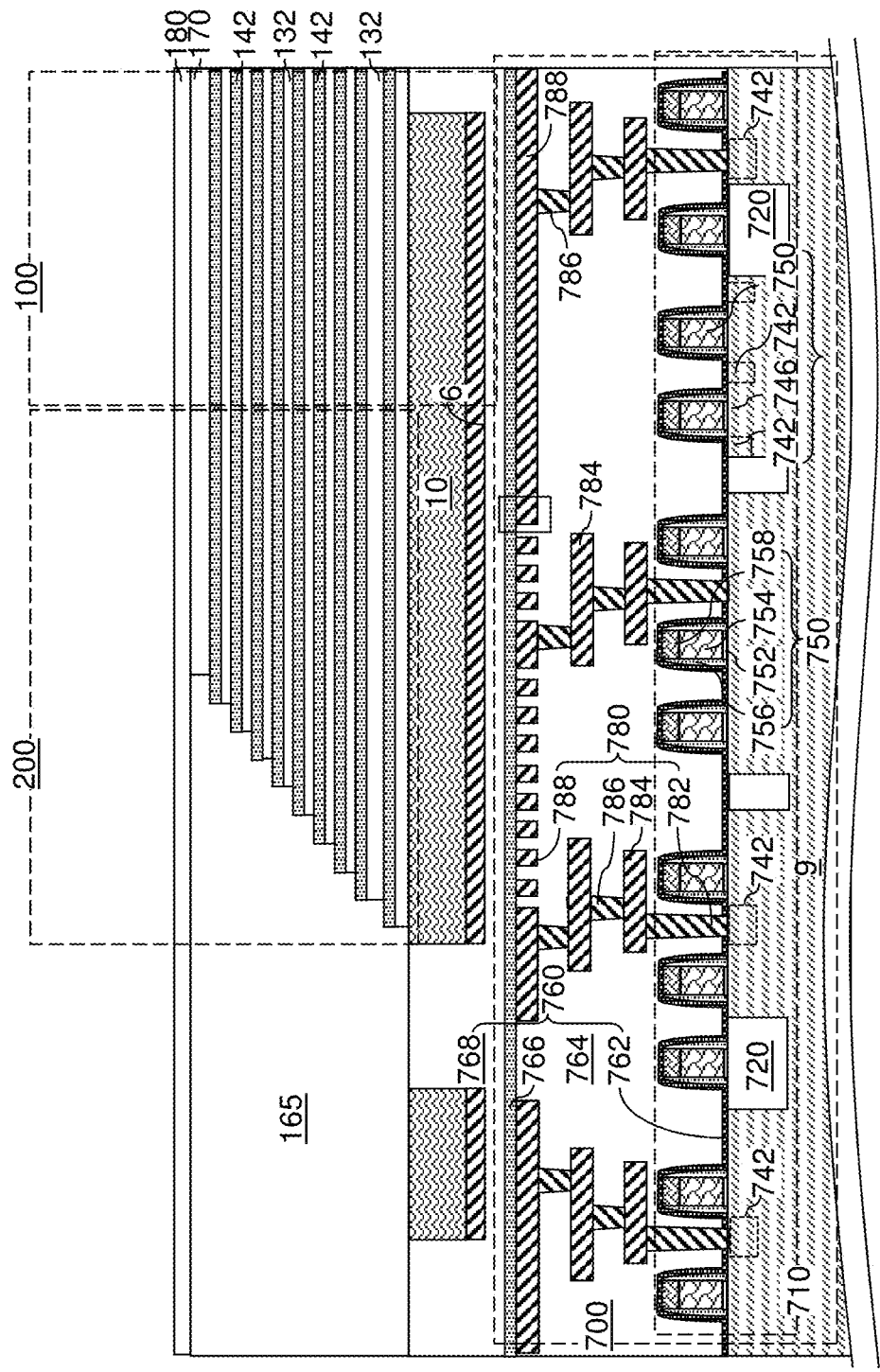
FIG. 4 is a vertical cross-sectional view of the exemplary structure after patterning first-tier staircase regions on the first-tier alternating stack and forming a first-tier retro-stepped dielectric material portion according to an embodiment of the present disclosure.

Referring to FIG. 4, the first insulating cap layer 170 and the first-tier alternating stack (132, 142) can be patterned to form first stepped surfaces in the word line contact via region 200. The word line contact via region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. A dielectric material can be deposited to fill the first stepped cavity to form a first-tier retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first-tier retro-stepped dielectric material portion 165 collectively constitute a first-tier structure, which is an in-process structure that is subsequently modified.

Figure 5A:
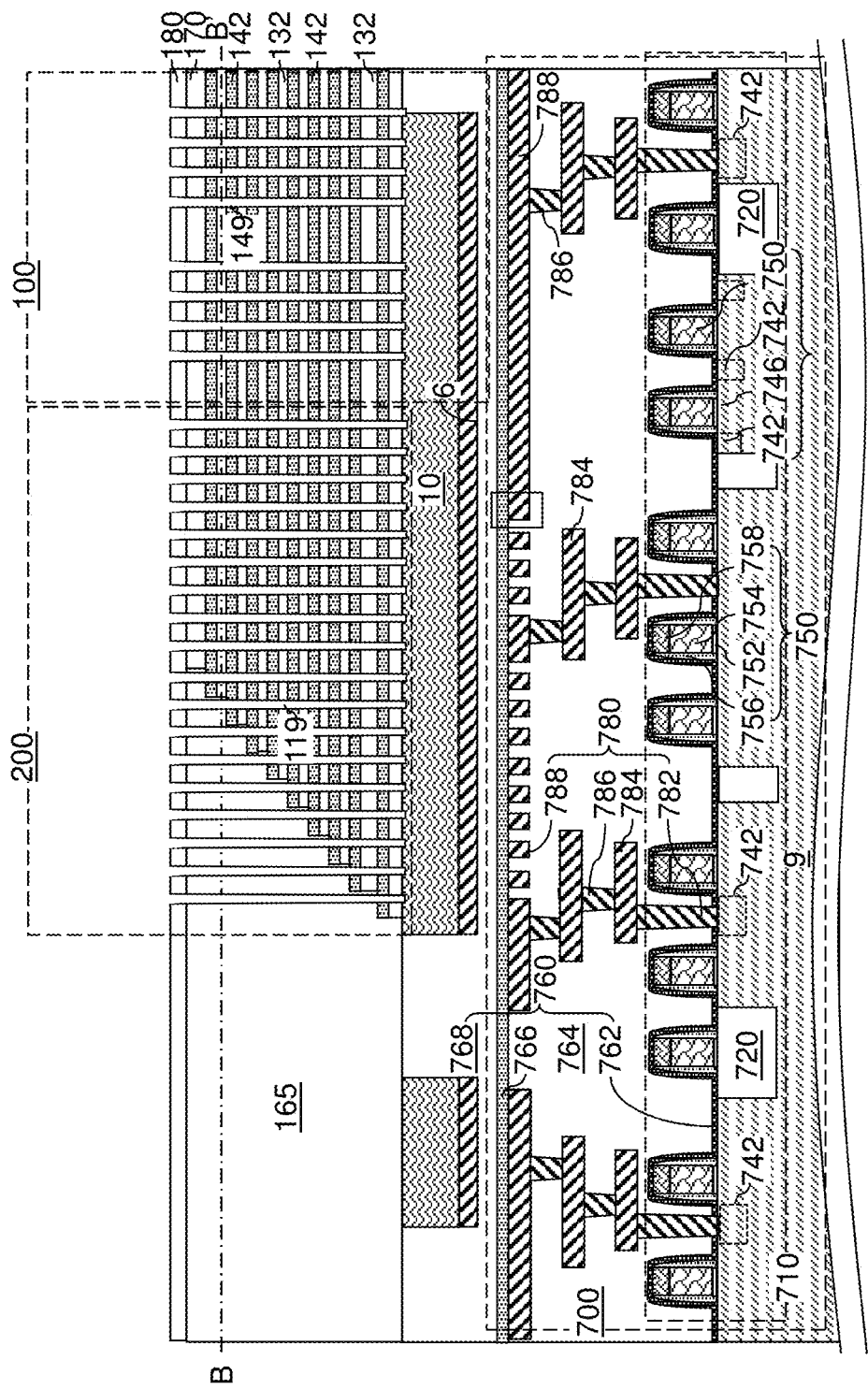
FIG. 5A is a vertical cross-sectional view of the exemplary structure after formation of first-tier memory openings and first tier support openings according to an embodiment of the present disclosure.
Figure 5B:
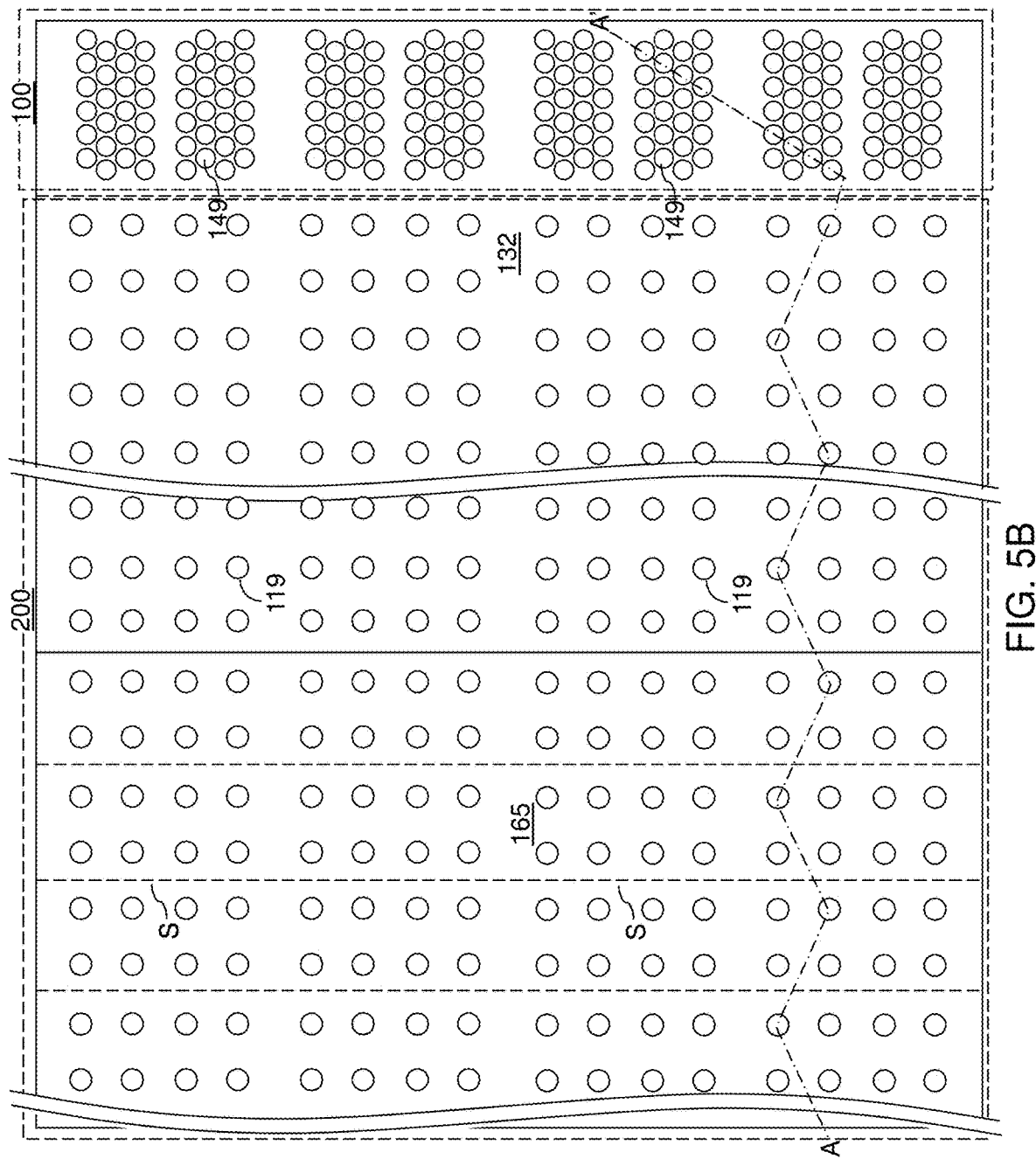
FIG. 5B is a horizontal cross-sectional view of the exemplary structure along the horizontal plane B-B' in FIG. 5A. The zig-zag vertical plane A-A' corresponds to the plane of the vertical cross-sectional view of FIG. 5A.

Referring to FIGS. 5A and 5B, an inter-tier dielectric layer 180 may be optionally deposited over the first-tier structure (132, 142, 165, 170). The inter-tier dielectric layer 180 includes a dielectric material such as silicon oxide. The thickness of the inter-tier dielectric layer 180 can be in a range from 30 nm to 300 nm, although lesser and greater thicknesses can also be used. Locations of steps S in the first-tier alternating stack (132, 142) are illustrated as dotted lines.

First-tier memory openings 149 and first-tier support openings 119 can be formed. The first-tier memory openings 149 and the first-tier support openings 119 extend through the first-tier alternating stack (132, 142) at least to a top surface of the planar semiconductor material layer 10. The first-tier memory openings 149 can be formed in the memory array region 100 at locations at which memory stack structures including vertical stacks of memory elements are to be subsequently formed. The first-tier support openings 119 can be formed in the word line contact via region 200. Optionally, the portions of the first-tier memory openings 149 and the first-tier support openings 119 at the level of the inter-tier dielectric layer 180 can be laterally expanded by an isotropic etch.

Figure 6:
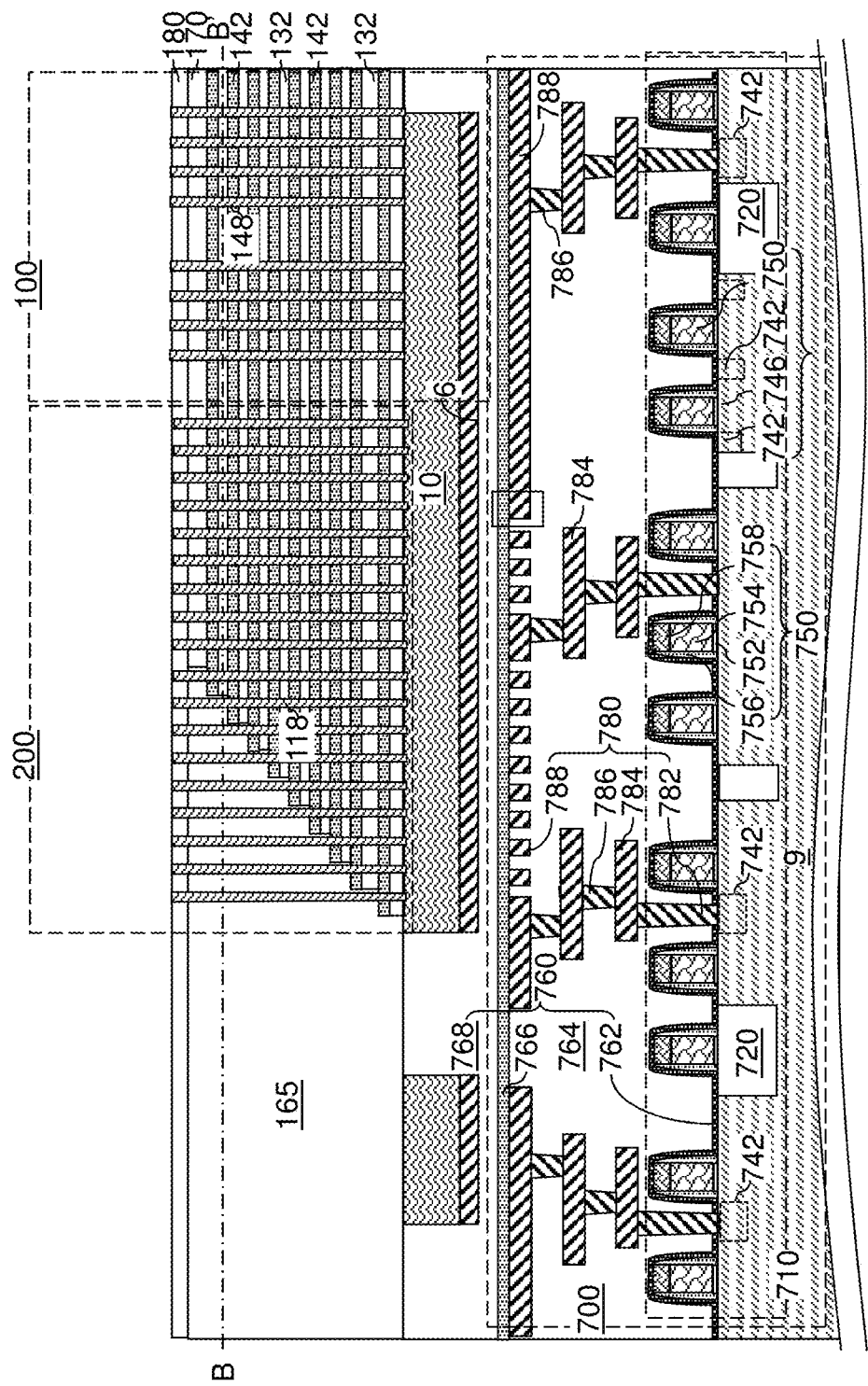
FIG. 6 is a vertical cross-sectional view of the exemplary structure after formation of sacrificial memory opening fill portions and sacrificial support opening fill portions according to an embodiment of the present disclosure.

Referring to FIG. 6, sacrificial memory opening fill portions 148 can be formed in the first-tier memory openings 149, and sacrificial support opening fill portions 118 can be formed in the first-tier support openings 119. For example, a sacrificial fill material layer is deposited in the first-tier memory openings 149 and the first-tier support openings 119. The sacrificial fill material layer includes a sacrificial material which can be subsequently removed selective to the materials of the first insulator layers 132 and the first sacrificial material layers 142. In one embodiment, the sacrificial fill material layer can include amorphous silicon or a carbon-containing material (such as amorphous carbon or diamond-like carbon) that can be subsequently removed by ashing.

Portions of the deposited sacrificial material can be removed from above the first insulating cap layer 170 (and the optional inter-tier dielectric layer 180, if present). Each remaining portion of the sacrificial material in a first-tier memory opening 149 constitutes a sacrificial memory opening fill portion 148. Each remaining portion of the sacrificial material in a first-tier support opening 119 constitutes a sacrificial support opening fill portion 118.

Figure 7:
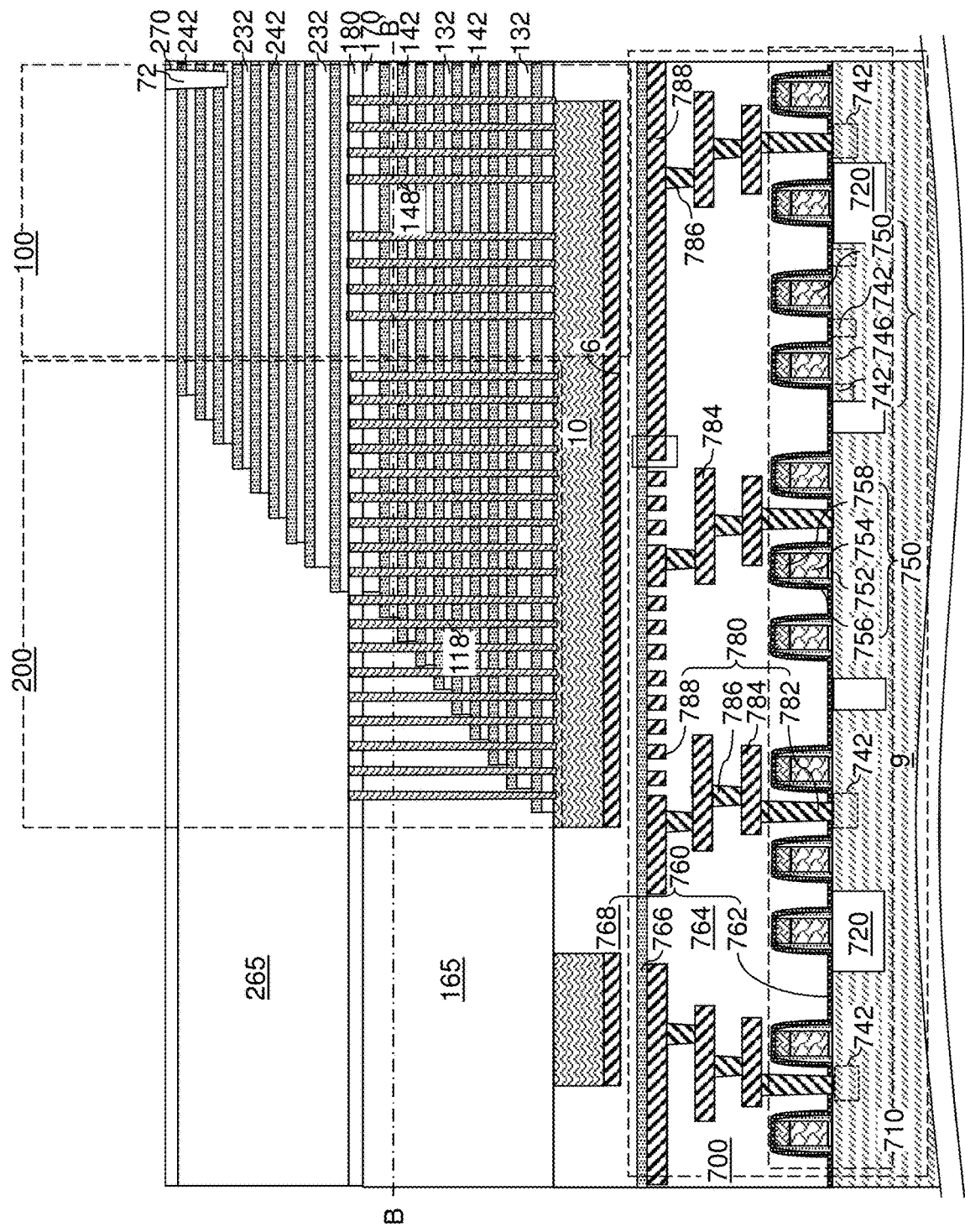
FIG. 7 is a vertical cross-sectional view of the exemplary structure after formation of a second-tier alternating stack of second insulating layers and second spacer material layers, a second-tier retro-stepped dielectric material portion, and a second insulating cap layer according to an embodiment of the present disclosure.

Referring to FIG. 7, a second-tier structure can be formed over the first-tier structure (132, 142, 170, 148, 118). The second-tier structure can include an additional alternating stack of insulating layers and spacer material layers, which can be sacrificial material layers. In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. Sacrificial materials that can be used for the second sacrificial material layers 242 can be any material that can be used for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be used for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be used.

Second stepped surfaces in the second stepped area can be formed in the word line contact via region 200 using a same set of processing steps as the processing steps used to form the first stepped surfaces in the first stepped area with suitable adjustment to the pattern of at least one masking layer. A second-tier retro-stepped dielectric material portion 265 can be formed over the second stepped surfaces in the word line contact via region 200. A second insulating cap layer 270 can be subsequently formed over the second alternating stack (232, 242). Generally speaking, at least one alternating stack of insulating layers (132, 232) and spacer material layers (such as sacrificial material layers (142, 242)) can be formed over the planar semiconductor material layer 10, and at least one retro-stepped dielectric material portion (165, 265) can be formed over the staircase regions on the at least one alternating stack (132, 142, 232, 242). Optionally, drain-select-level shallow trench isolation structures 72 can be formed through a subset of layers in an upper portion of the second-tier alternating stack (232, 242).

Figure 8A:
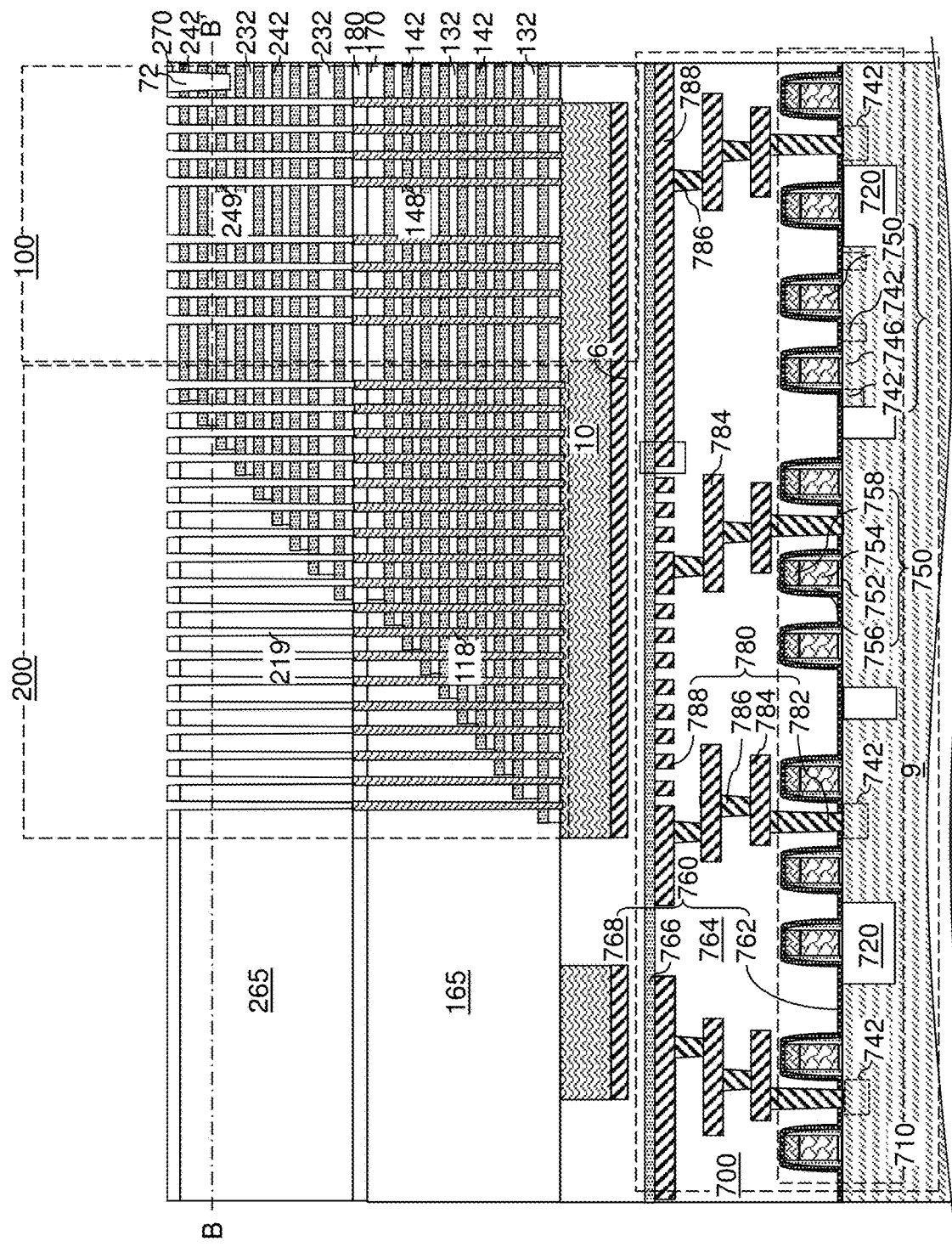
FIG. 8A is a vertical cross-sectional view of the exemplary structure after formation of inter-tier memory openings and inter-tier support openings according to an embodiment of the present disclosure.
Figure 8B:
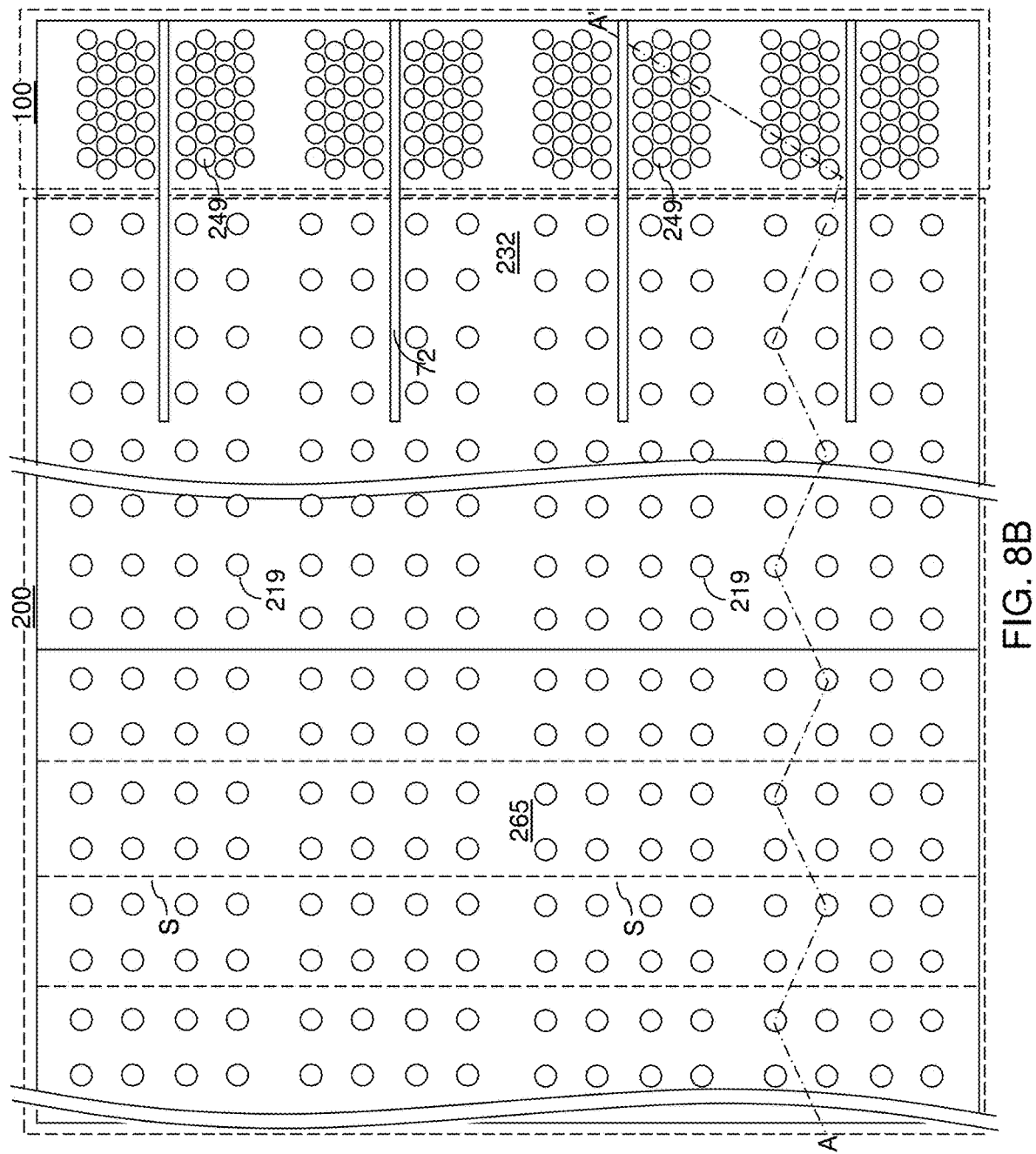
FIG. 8B is a horizontal cross-sectional view of the exemplary structure along the horizontal plane B-B' in FIG. 8A. The zig-zag vertical plane A-A' corresponds to the plane of the vertical cross-sectional view of FIG. 8A.

Referring to FIGS. 8A and 8B, second-tier memory openings 249 and second tier support openings 219 extending through the second-tier structure (232, 242, 270, 265) are formed in areas overlying the sacrificial memory opening fill portions 148. A top surface of an underlying sacrificial memory opening fill portion 148 can be physically exposed at the bottom of each second-tier memory opening 249. A top surface of an underlying sacrificial support opening fill portion 118 can be physically exposed at the bottom of each second-tier support opening 219. After the top surfaces of the sacrificial memory opening fill portions 148 and the sacrificial support opening fill portions 118 are physically exposed, an etch process can be performed, which removes the sacrificial material of the sacrificial memory opening fill portions 148 and the sacrificial support opening fill portions 118 selective to the materials of the second-tier alternating stack (232, 242) and the first-tier alternating stack (132, 142).

Upon removal of the sacrificial memory opening fill portions 148, each vertically adjoining pair of a second-tier memory opening 249 and a first-tier memory opening 149 forms a continuous cavity that extends through the first-tier alternating stack (132, 142) and the second-tier alternating stack (232, 242). Likewise, upon removal of the sacrificial support opening fill portions 118, each vertically adjoining pair of a second-tier support opening 219 and a first-tier support opening 119 forms a continuous cavity that extends through the first-tier alternating stack (132, 142) and the second-tier alternating stack (232, 242). The continuous cavities are herein referred to as memory openings (or inter-tier memory openings) and support openings (or inter-tier support openings), respectively. A top surface of the planar semiconductor material layer 10 can be physically exposed at the bottom of each memory opening and at the bottom of each support openings.

Figure 9:
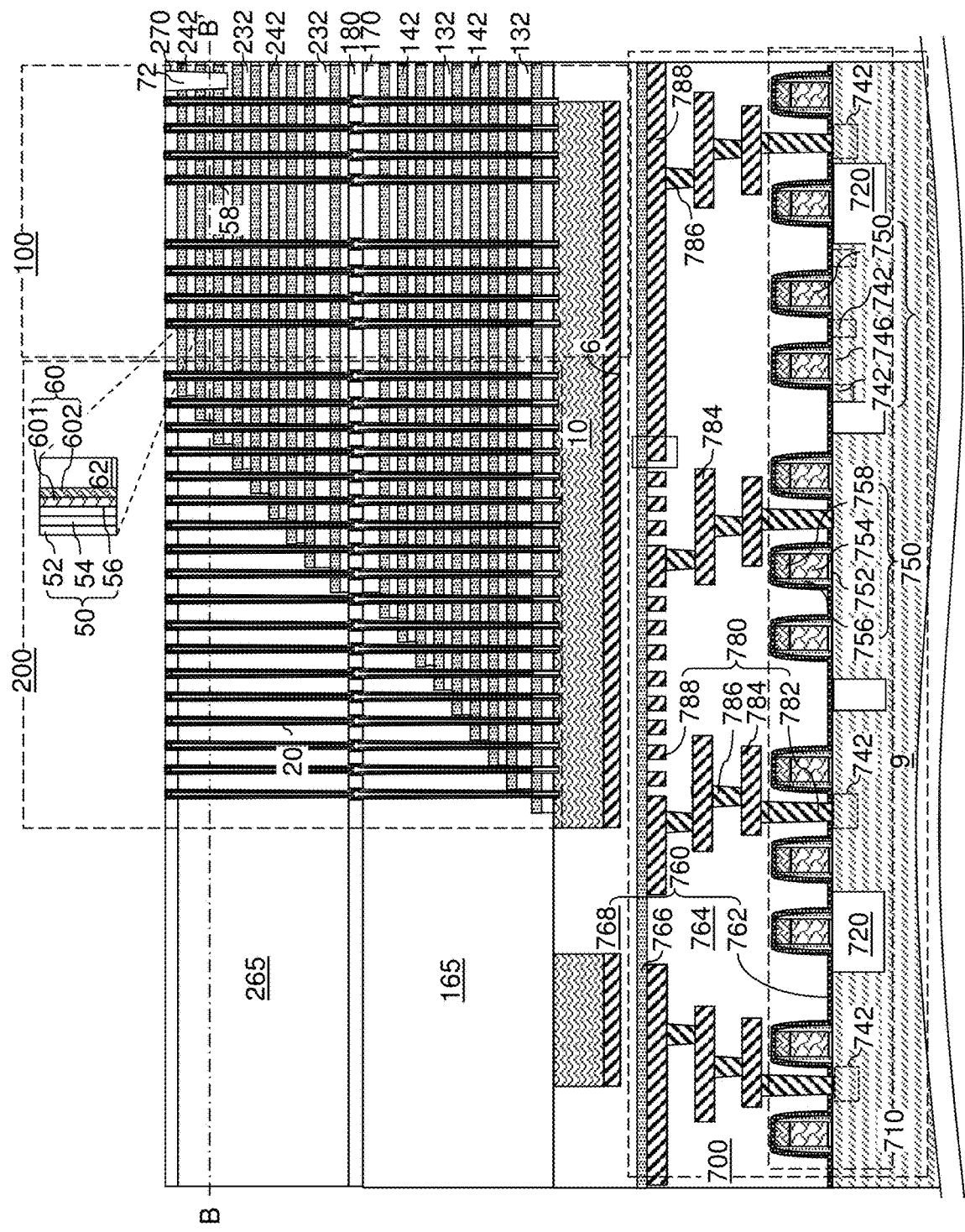
FIG. 9 is a vertical cross-sectional view of the exemplary structure after formation of memory stack structures according to an embodiment of the present disclosure.

Referring to FIG. 9, memory opening fill structures 58 are formed within each memory opening, and support pillar structures 20 are formed within each support opening. The memory opening fill structures 58 and the support pillar structures 20 can include a same set of components, and can be formed simultaneously.

FIGS. 10A-10H provide sequential cross-sectional views of a memory opening 49 or a support opening (119, 219) during formation of a memory opening fill structure 58 or a support pillar structure 20. While a structural change in a memory opening 49 is illustrated in FIGS. 10A-10H, it is understood that the same structural change occurs in each memory openings 49 and in each of the support openings (119, 219) during the same set of processing steps.

Referring to FIG. 10A, a memory opening 49 in the exemplary device structure of FIG. 14 is illustrated. The memory opening 49 extends through the first-tier structure and the second-tier structure. Likewise, each support opening (119, 219) extends through the first-tier structure and the second-tier structure.

Referring to FIG. 10B, an optional pedestal channel portion (e.g., an epitaxial pedestal) 11 can be formed at the bottom portion of each memory opening 49 and each support openings (119, 219), for example, by a selective semiconductor deposition process. A cavity 49' is present in the unfilled portion of the memory opening 49 (or of the support opening) above the pedestal channel portion 11. In one embodiment, the pedestal channel portion 11 can have a doping of the same as the conductivity type of the planar semiconductor material layer 10.

Referring to FIG. 10C, a stack of layers including a blocking dielectric layer 52, a charge storage layer 54, a tunneling dielectric layer 56, and an optional first semiconductor channel layer 601 can be sequentially deposited in the memory openings 49. The blocking dielectric layer 52 can include a single dielectric material layer or a stack of a plurality of dielectric material layers. The charge storage layer 54 can be a continuous layer or patterned discrete portions of a charge trapping material including a dielectric charge trapping material, which can be, for example, silicon nitride. The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The optional first semiconductor channel layer 601 includes a semiconductor material. A cavity 49' is formed in the volume of each memory opening 49 that is not filled with the deposited material layers (52, 54, 56, 601).

Referring to FIG. 10D, the optional first semiconductor channel layer 601, the tunneling dielectric layer 56, the charge storage layer 54, the blocking dielectric layer 52 are sequentially anisotropically etched using at least one anisotropic etch process. Each remaining portion of the first semiconductor channel layer 601 can have a tubular configuration. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56.

Figure 10F:
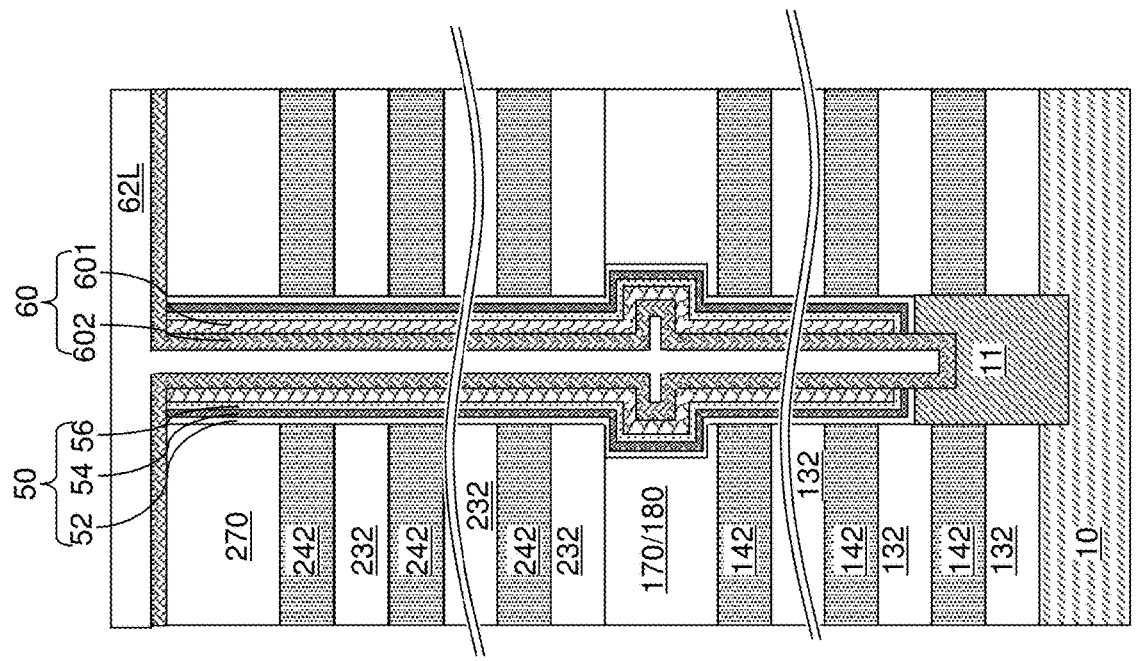
Figure 10E:
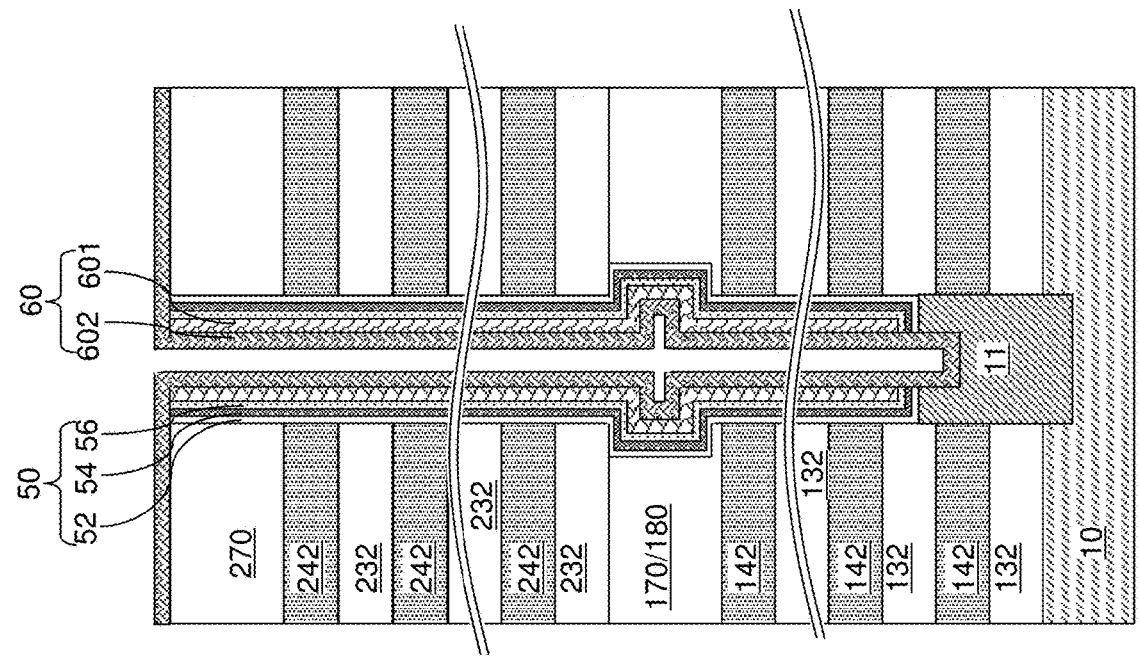

Referring to FIG. 10E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material. The materials of the first semiconductor channel layer 601 and the second semiconductor channel layer 602 are collectively referred to as a semiconductor channel material.

Referring to FIG. 10F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass.

Figure 10G:
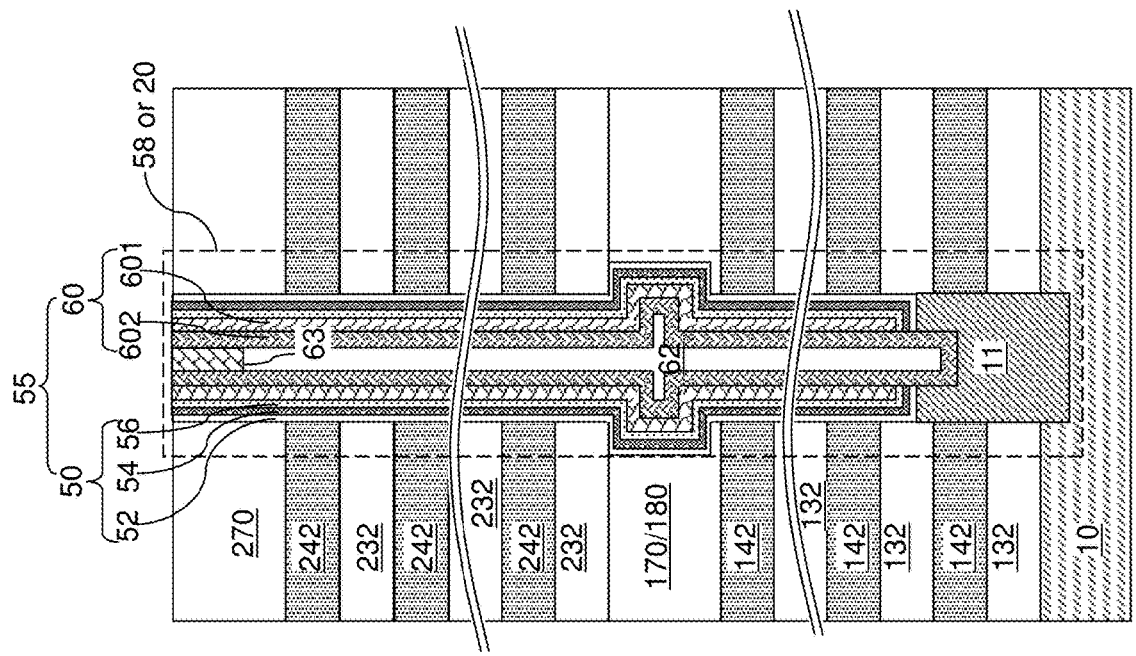

Referring to FIG. 10G, the horizontal portion of the dielectric core layer 62L can be removed, for example, by a recess etch from above the top surface of the second insulating cap layer 270. Each remaining portion of the dielectric core layer 62L constitutes a dielectric core 62. Each adjoining pair of a first semiconductor channel layer 601 and a second semiconductor channel layer 602 can collectively form a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. As used herein, a macroscopic retention time refers to a retention time suitable for operation of a memory device as a permanent memory device such as a retention time in excess of 24 hours.

Figure 10H:
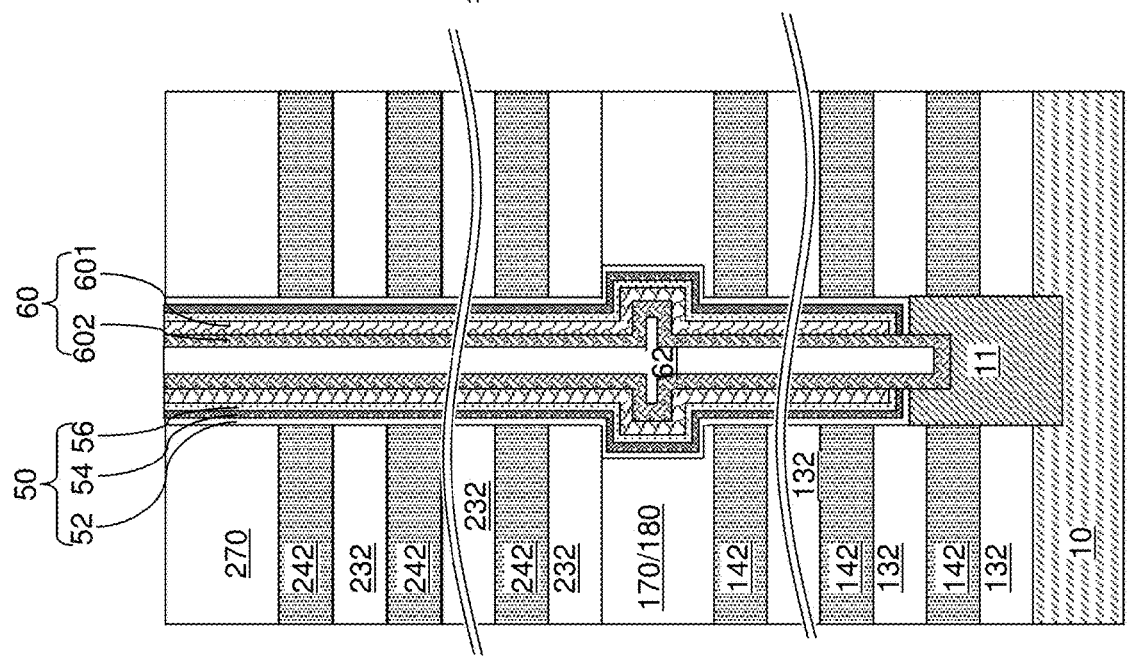

Referring to FIG. 10H, the top surface of each dielectric core 62 can be further recessed within each memory opening, for example, by a recess etch to a depth that is located between the top surface of the second insulating cap layer 270 and the bottom surface of the second insulating cap layer 270. Drain regions 63 can be formed by depositing a doped semiconductor material within each recessed region above the dielectric cores 62. The drain regions 63 can have a doping of a second conductivity type that is the opposite of the first conductivity type. Each combination of a memory film 50 and a vertical semiconductor channel 60 (which is a vertical semiconductor channel) within a memory opening 49 constitutes a memory stack structure 55. Each combination of a pedestal channel portion 11 (if present), a memory stack structure 55, a dielectric core 62, and a drain region 63 within a memory opening 49 constitutes a memory opening fill structure 58. Each combination of a pedestal channel portion 11 (if present), a memory film 50, a vertical semiconductor channel 60, a dielectric core 62, and a drain region 63 within each support opening (119, 219) fills the respective support openings (119, 219), and constitutes a support pillar structure 20.

The first-tier structure (132, 142, 170, 165), the second-tier structure (232, 242, 270, 265), the inter-tier dielectric layer 180, the memory opening fill structures 58, and the support pillar structures 20 collectively constitute a memory-level assembly. The memory-level assembly is formed over the planar semiconductor material layer 10 such that the planar semiconductor material layer 10 includes horizontal semiconductor channels electrically connected to vertical semiconductor channels 60 within the memory stack structures 55.

Figure 11A:
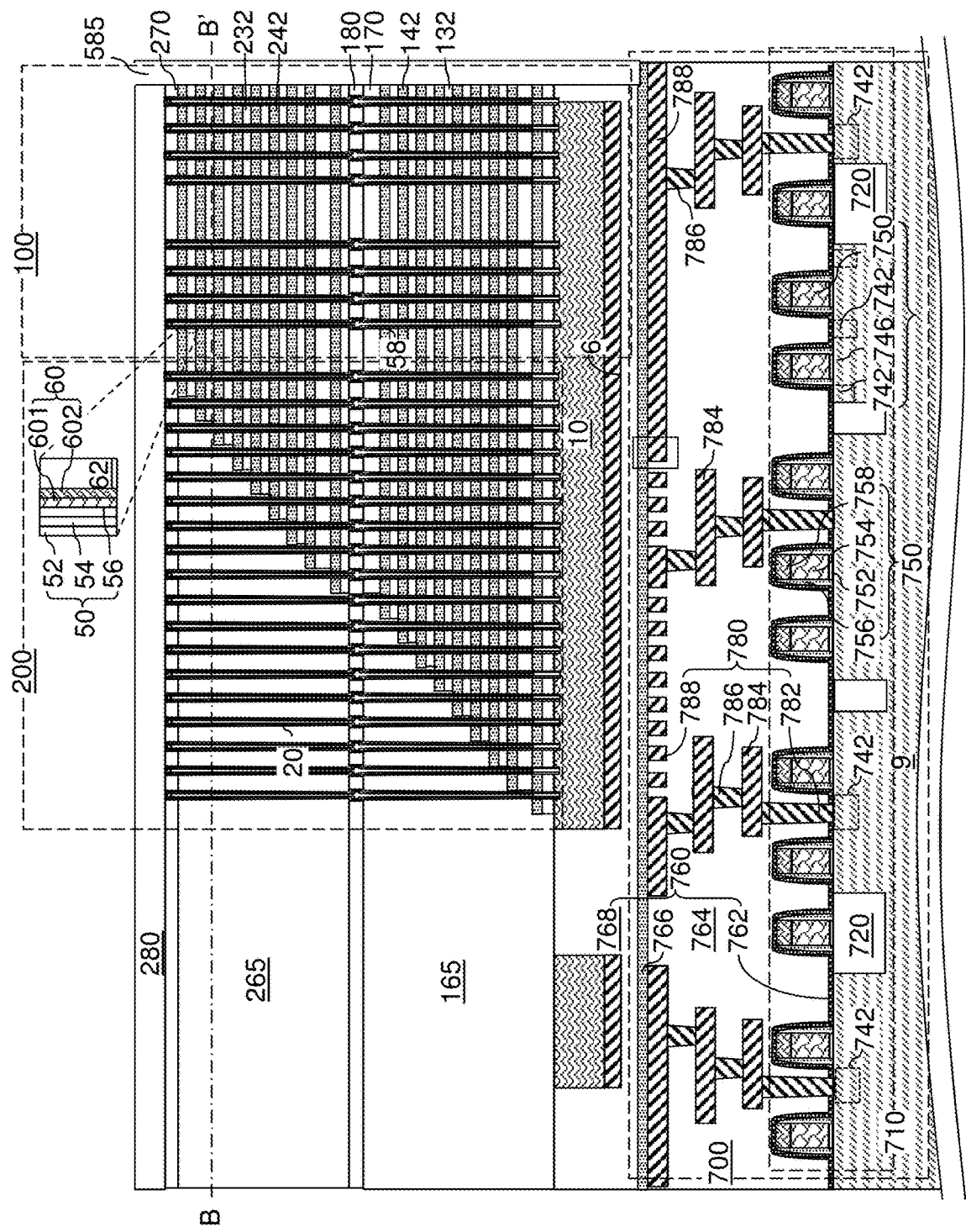
FIG. 11A is a vertical cross-sectional view of the exemplary structure after formation of first through-stack via cavities according to an embodiment of the present disclosure.
Figure 11B:
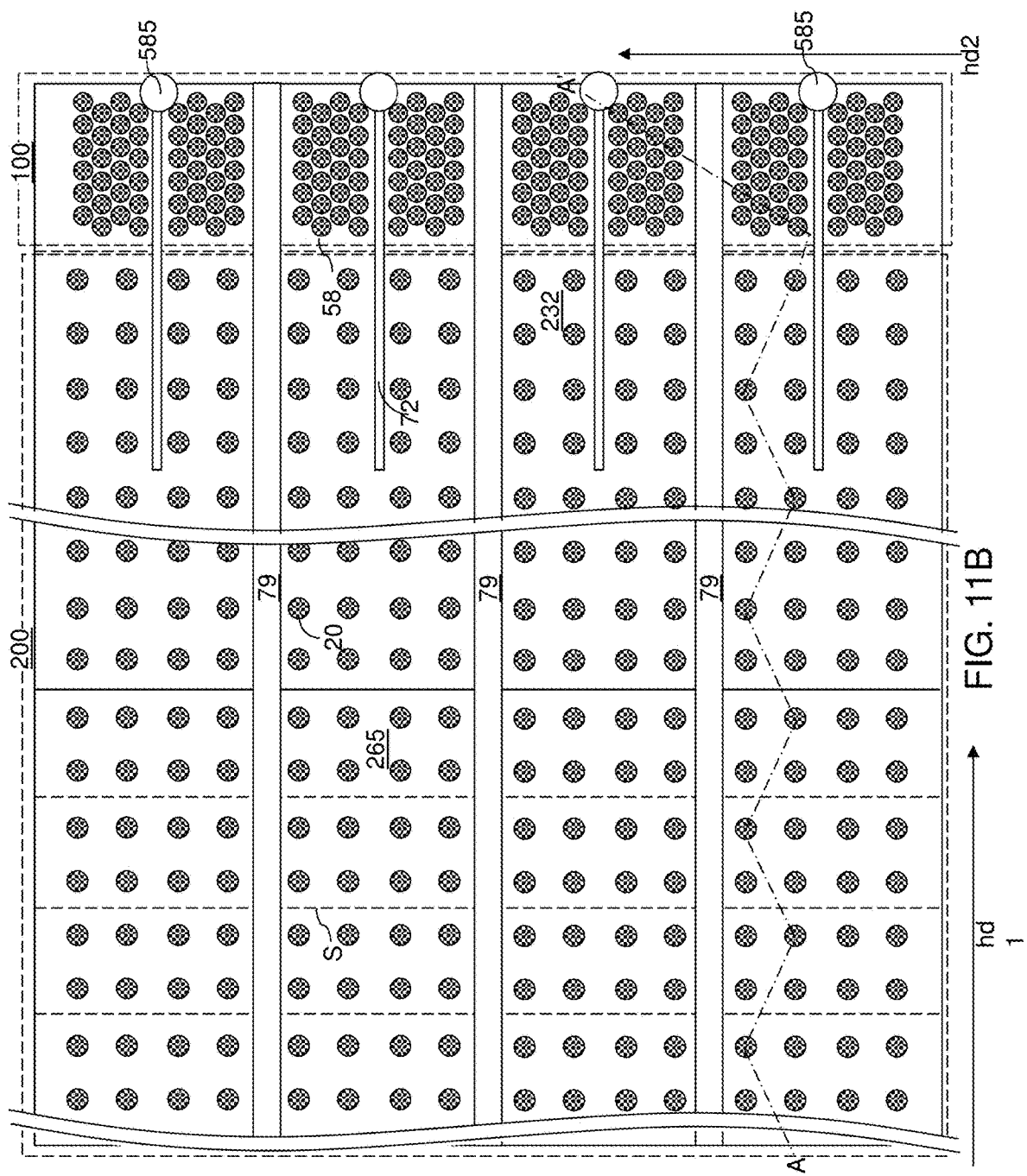
FIG. 11B is a horizontal cross-sectional view of the exemplary structure along the horizontal plane B-B' in FIG. 11A. The zig-zag vertical plane A-A' corresponds to the plane of the vertical cross-sectional view of FIG. 11A.

Referring to FIGS. 11A and 11B, a first contact level dielectric layer 280 can be formed over the memory-level assembly. The first contact level dielectric layer 280 is formed at a contact level through which various contact via structures are subsequently formed to the drain regions 63 and the various electrically conductive layers that replaces the sacrificial material layers (142, 242) in subsequent processing steps.

First through-stack via cavities 585 can be formed with the memory array region 100, for example, by applying and patterning of a photoresist layer to form openings therein, and by anisotropically etching the portions of the first contact level dielectric layer 280, the alternating stacks (132, 146, 232, 246), and the at least one second dielectric material layer 768 that underlie the openings in the photoresist layer. In one embodiment, each of the first through-stack via cavities 585 can be formed within a respective three-dimensional memory array so that each first through-stack via cavities 585 is laterally surrounded by memory opening fill structures 58. The bottom surface of each first through-stack via cavity 585 can be formed at, or above, the silicon nitride layer 766.

Figure 12:
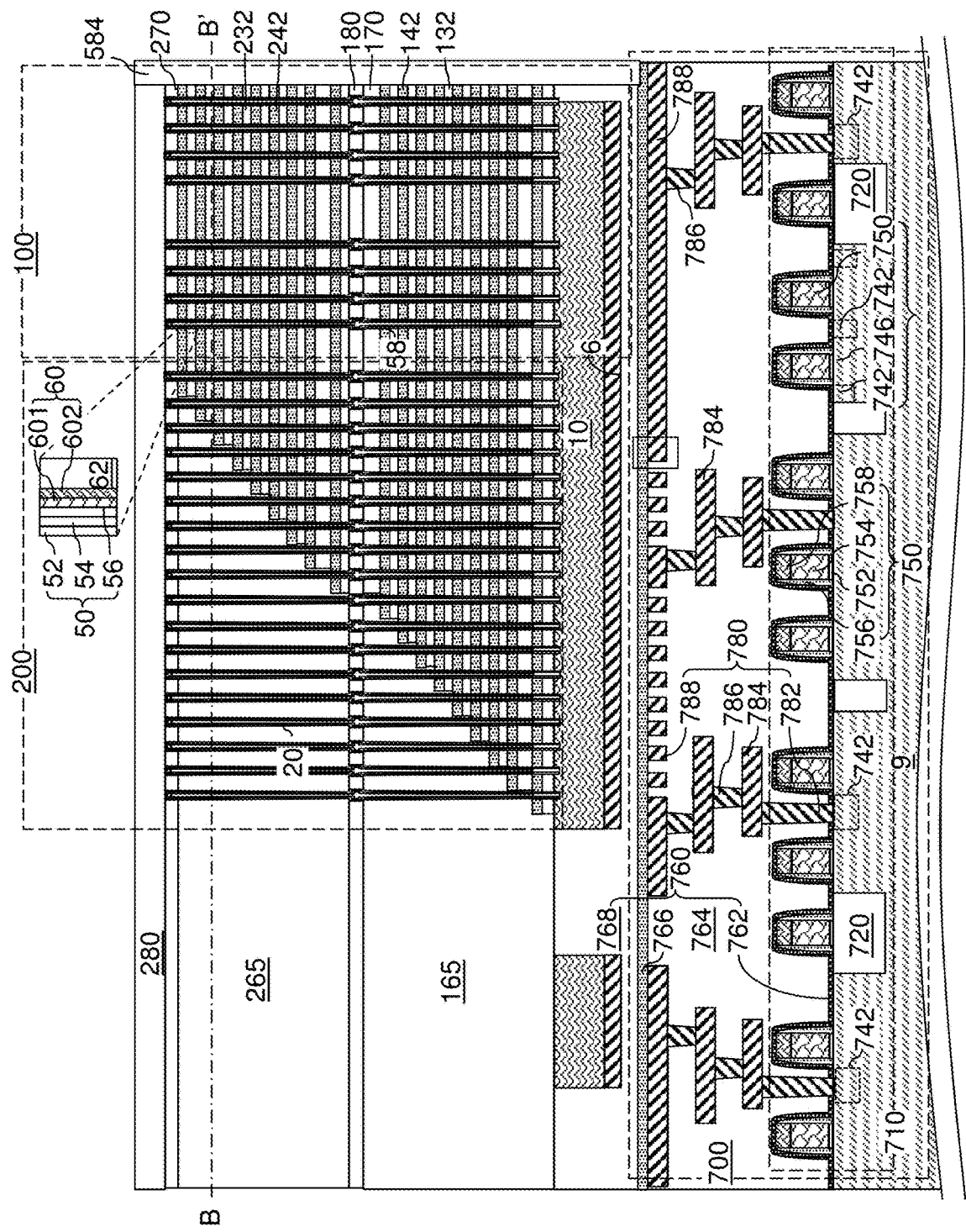
FIG. 12 is a vertical cross-sectional view of the exemplary structure after formation of through-stack insulating material portion according to an embodiment of the present disclosure.

Referring to FIG. 12, a dielectric material is deposited in the first through-stack via cavities 585. The dielectric material can include a silicon-oxide based material such as undoped silicate glass, doped silicate glass, or a flowable oxide material. The dielectric material can be deposited by a conformal deposition method such as chemical vapor deposition or spin coating. Excess portion of the deposited dielectric material may be removed from above a horizontal plane including the top surface of the first contact level dielectric layer 280. Each remaining dielectric material portion filling a respective one of the first through-stack via cavity 585 constitutes a through-stack insulating material portion 584.

Figure 13A:
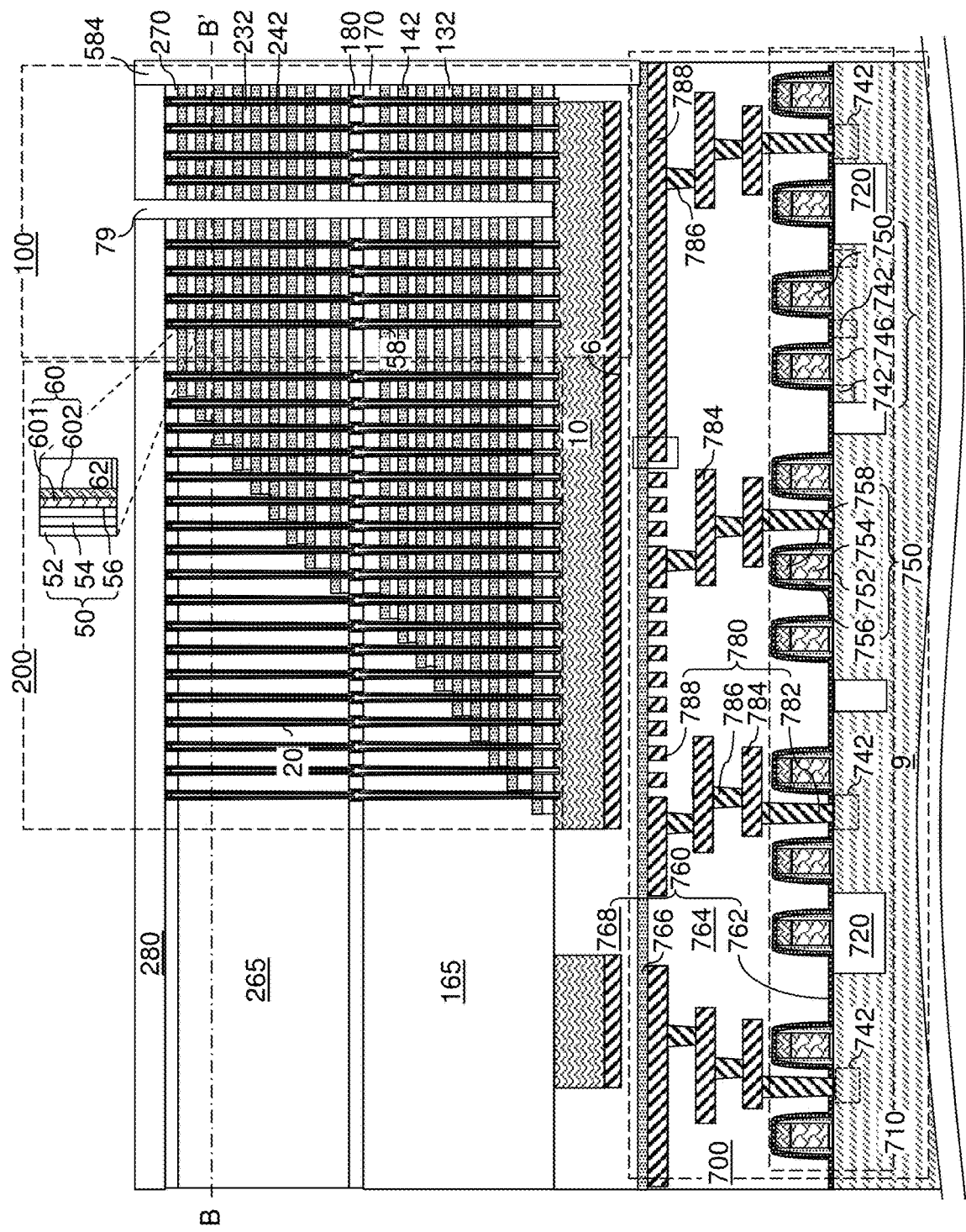
FIG. 13A is a vertical cross-sectional view of the exemplary structure after formation of backside contact trenches according to an embodiment of the present disclosure.
Figure 13B:
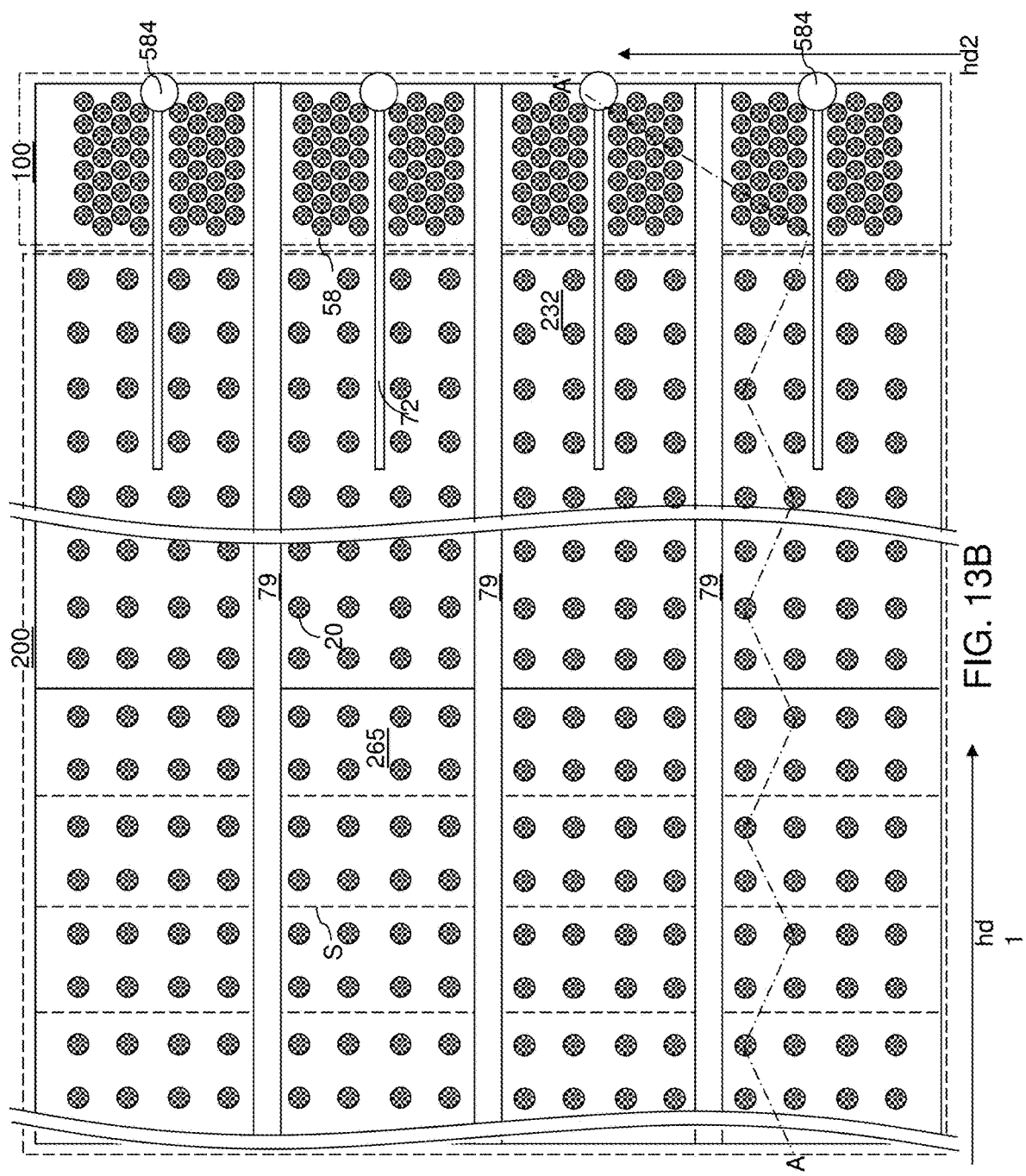
FIG. 13B is a horizontal cross-sectional view of the exemplary structure along the horizontal plane B-B' in FIG. 13A. The zig-zag vertical plane A-A' corresponds to the plane of the vertical cross-sectional view of FIG. 13A.

Referring to FIGS. 13A and 13B, backside contact trenches 79 are subsequently formed through the first contact level dielectric layer 280 and the memory-level assembly. For example, a photoresist layer can be applied and lithographically patterned over the first contact level dielectric layer 280 to form elongated openings that extend along a first horizontal direction hd1. An anisotropic etch is performed to transfer the pattern in the patterned photoresist layer through the first contact level dielectric layer 280 and the memory-level assembly to a top surface of the planar semiconductor material layer 10. The photoresist layer can be subsequently removed, for example, by ashing.

The backside contact trenches 79 extend along the first horizontal direction hd1, and thus, are elongated along the first horizontal direction hd1. The backside contact trenches 79 can be laterally spaced among one another along a second horizontal direction hd2, which can be perpendicular to the first horizontal direction hd1. The backside contact trenches 79 can extend through the memory array region (e.g., a memory plane) 100 and the word line contact via region 200. The first subset of the backside contact trenches 79 laterally divides the memory-level assembly (e.g., into memory blocks).

Figure 14A:
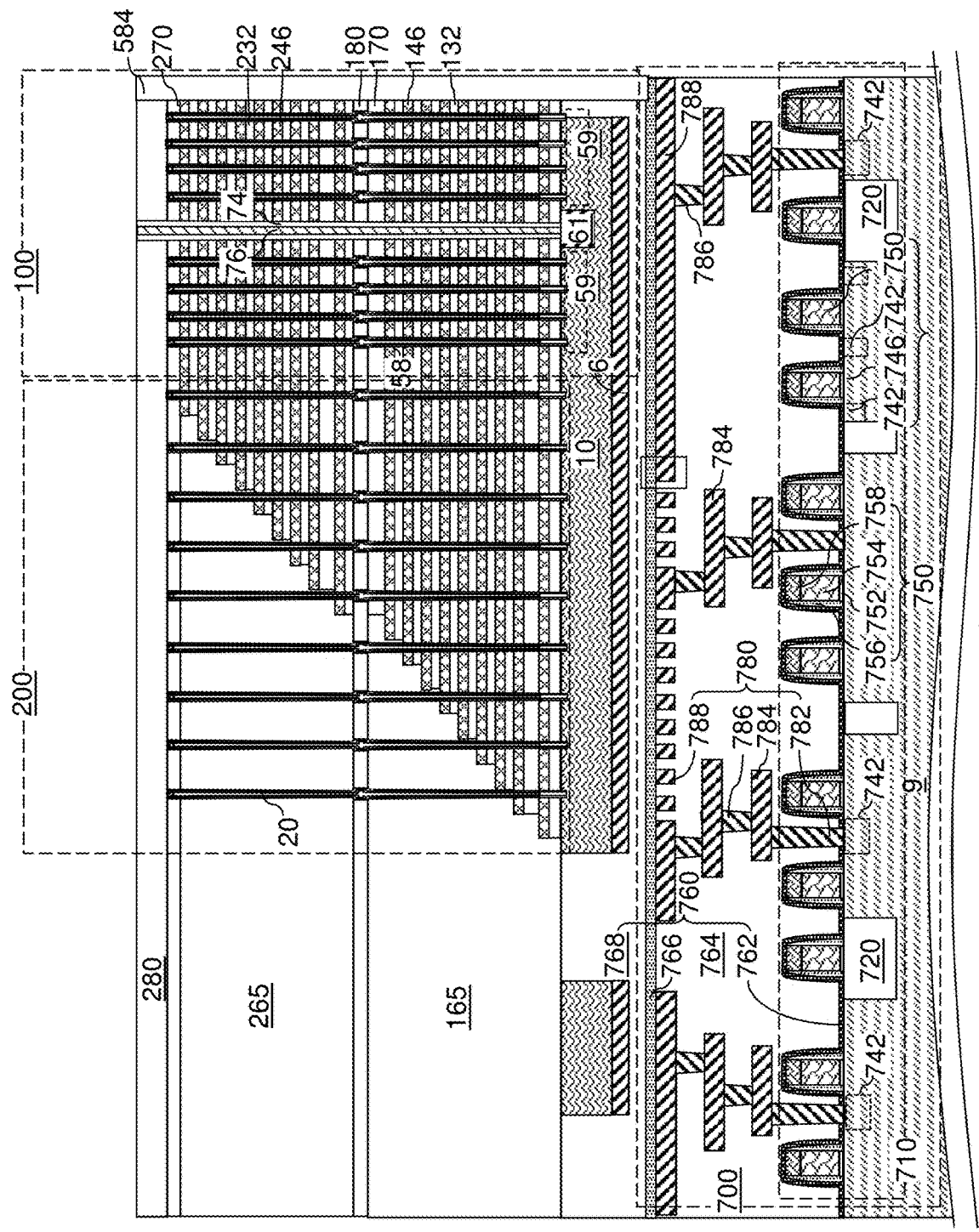
FIG. 14A is a vertical cross-sectional view of the exemplary structure after replacement of sacrificial material layers with electrically conductive layers and formation of insulating spacers and backside contact via structures according to an embodiment of the present disclosure.
Figure 14B:
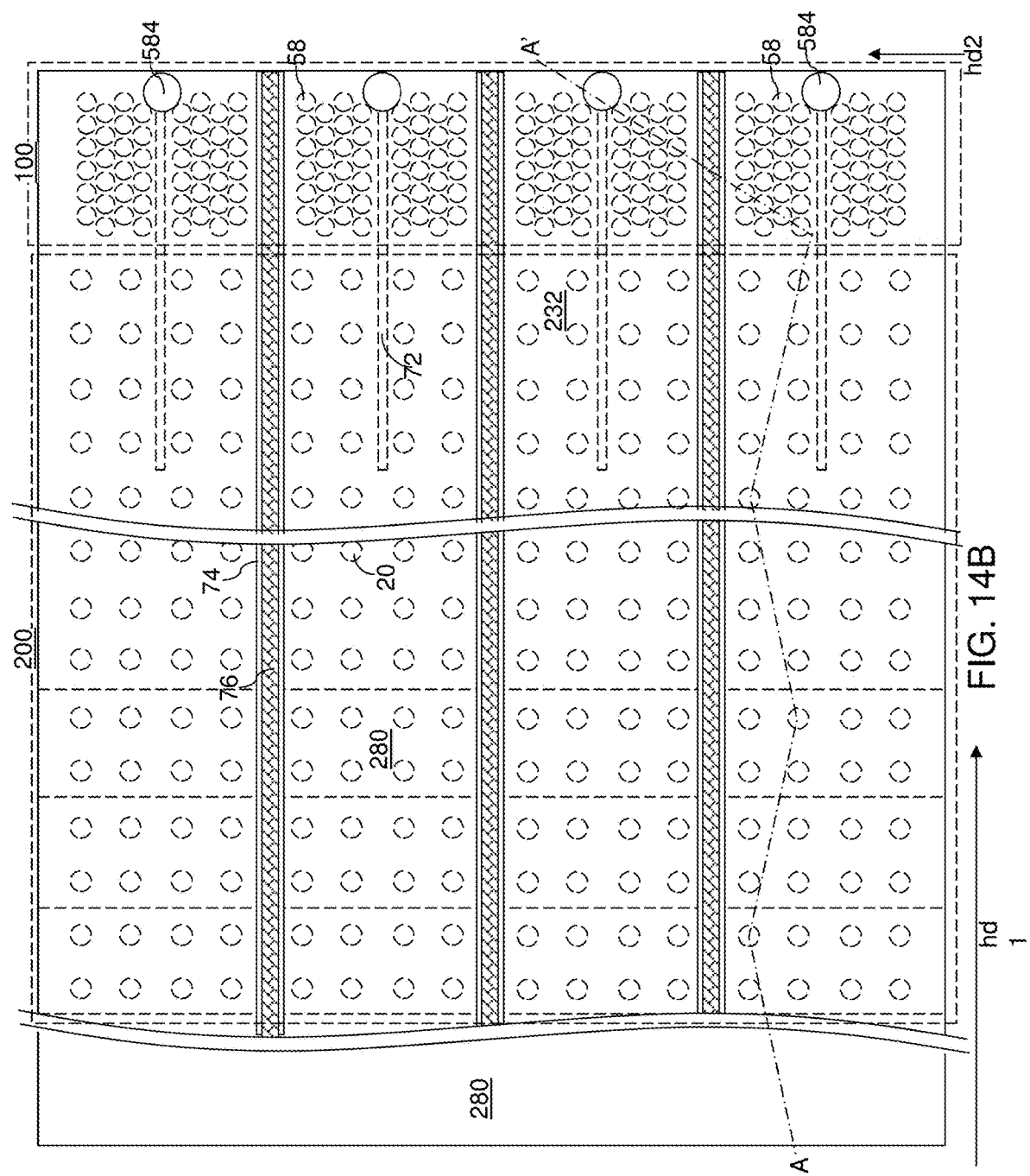
FIG. 14B is a horizontal cross-sectional view of the exemplary structure along the horizontal plane B-B' in FIG. 14A. The zig-zag vertical plane A-A' corresponds to the plane of the vertical cross-sectional view of FIG. 14A.

Referring to FIGS. 14A and 14B, an etchant that selectively etches the materials of the first and second sacrificial material layers (142, 242) with respect to the materials of the first and second insulating layers (132, 232), the first and second insulating cap layers (170, 270), and the material of the outermost layer of the memory films 50 can be introduced into the backside contact trenches 79, for example, using an isotropic etch process. First backside recesses are formed in volumes from which the first sacrificial material layers 142 are removed. Second backside recesses are formed in volumes from which the second sacrificial material layers 242 are removed. The isotropic etch process can be a wet etch process using a wet etch solution, or can be a gas phase (dry) etch process in which the etchant is introduced in a vapor phase into the backside contact trench 79.

A plurality of first backside recesses can be formed in the volumes from which the material of the first sacrificial material layers 142 is removed. A plurality of second backside recesses can be formed in the volumes from which the material of the second sacrificial material layers 242 is removed. In one embodiment, a sidewall surface of each pedestal channel portion 11 can be physically exposed at each bottommost first backside recess after removal of the first and second sacrificial material layers (142, 242). Further, a top surface of the planar semiconductor material layer 10 can be physically exposed at the bottom of each backside contact trench 79. An annular dielectric spacer (not shown) can be formed around each pedestal channel portion 11 by oxidation of a physically exposed peripheral portion of the pedestal channel portions 11. Further, a semiconductor oxide portion (not shown) can be formed from each physically exposed surface portion of the planar semiconductor material layer 10 concurrently with formation of the annular dielectric spacers.

A backside blocking dielectric layer (not shown) can be optionally deposited in the backside recesses and the backside contact trenches 79 and over the first contact level dielectric layer 280. At least one conductive material can be deposited in the plurality of backside recesses, on the sidewalls of the backside contact trench 79, and over the first contact level dielectric layer 280. The at least one conductive material can include at least one metallic material, i.e., an electrically conductive material that includes at least one metallic element. A plurality of first electrically conductive layers 146 can be formed in the plurality of first backside recesses, and a plurality of second electrically conductive layers 246 can be formed in the plurality of second backside recesses. A continuous metallic material layer (not shown) formed on the sidewalls of each backside contact trench 79 and over the first contact level dielectric layer 280 can be removed by a recess etch.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Dopants of a second conductivity type, which is the opposite of the first conductivity type of the planar semiconductor material layer 10, can be implanted into a surface portion of the planar semiconductor material layer 10 to form a source region 61 underneath the bottom surface of each backside contact trench 79. An insulating spacer 74 including a dielectric material can be formed at the periphery of each backside contact trench 79, for example, by deposition of a conformal insulating material (such as silicon oxide) and a subsequent anisotropic etch. A backside contact via structure 76 can be formed in the remaining volume of each backside contact trench 79.

Figure 15A:
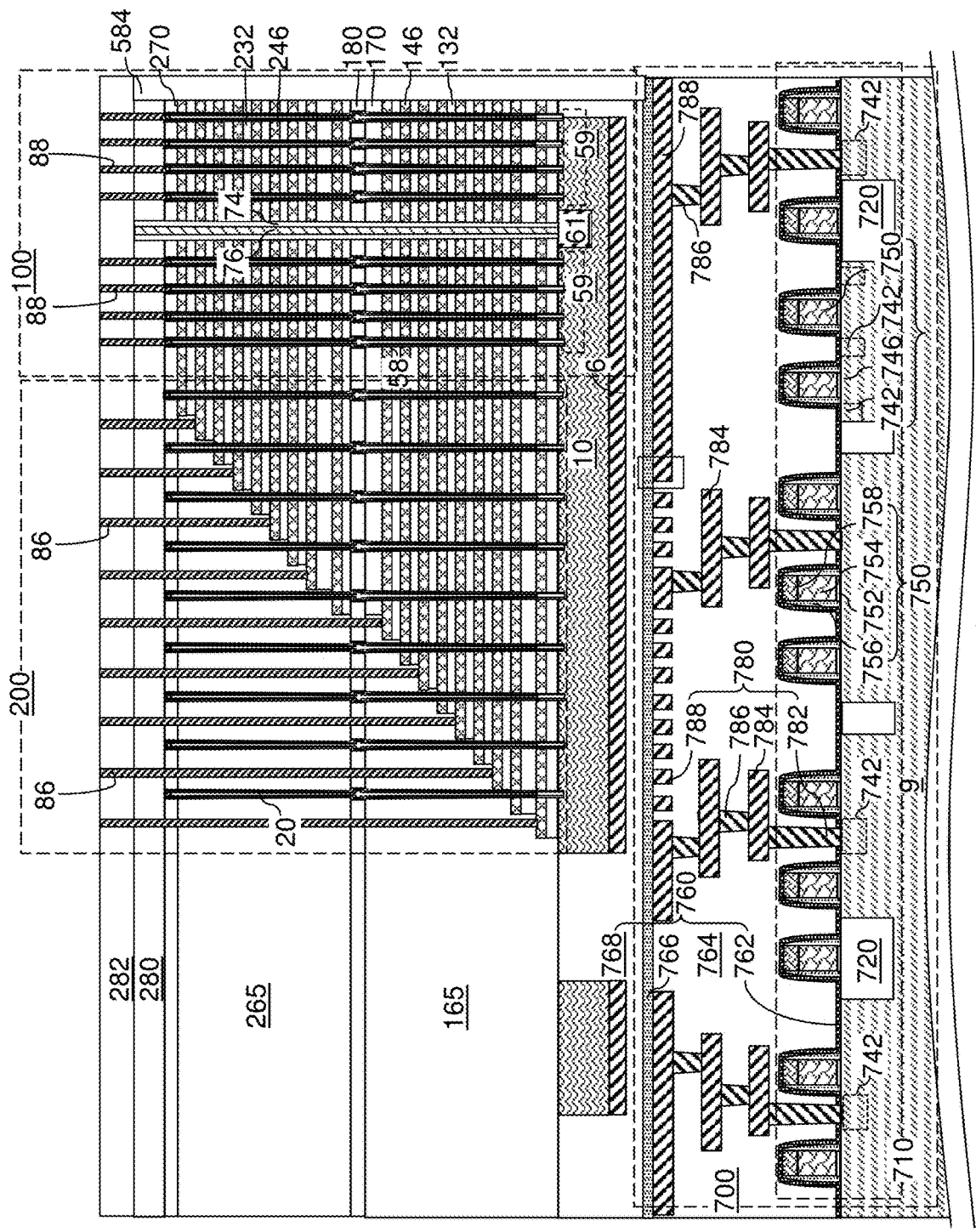
FIG. 15A is a vertical cross-sectional view of the exemplary structure after formation of drain contact via structures and word line contact via structures according to an embodiment of the present disclosure.
Figure 15B:
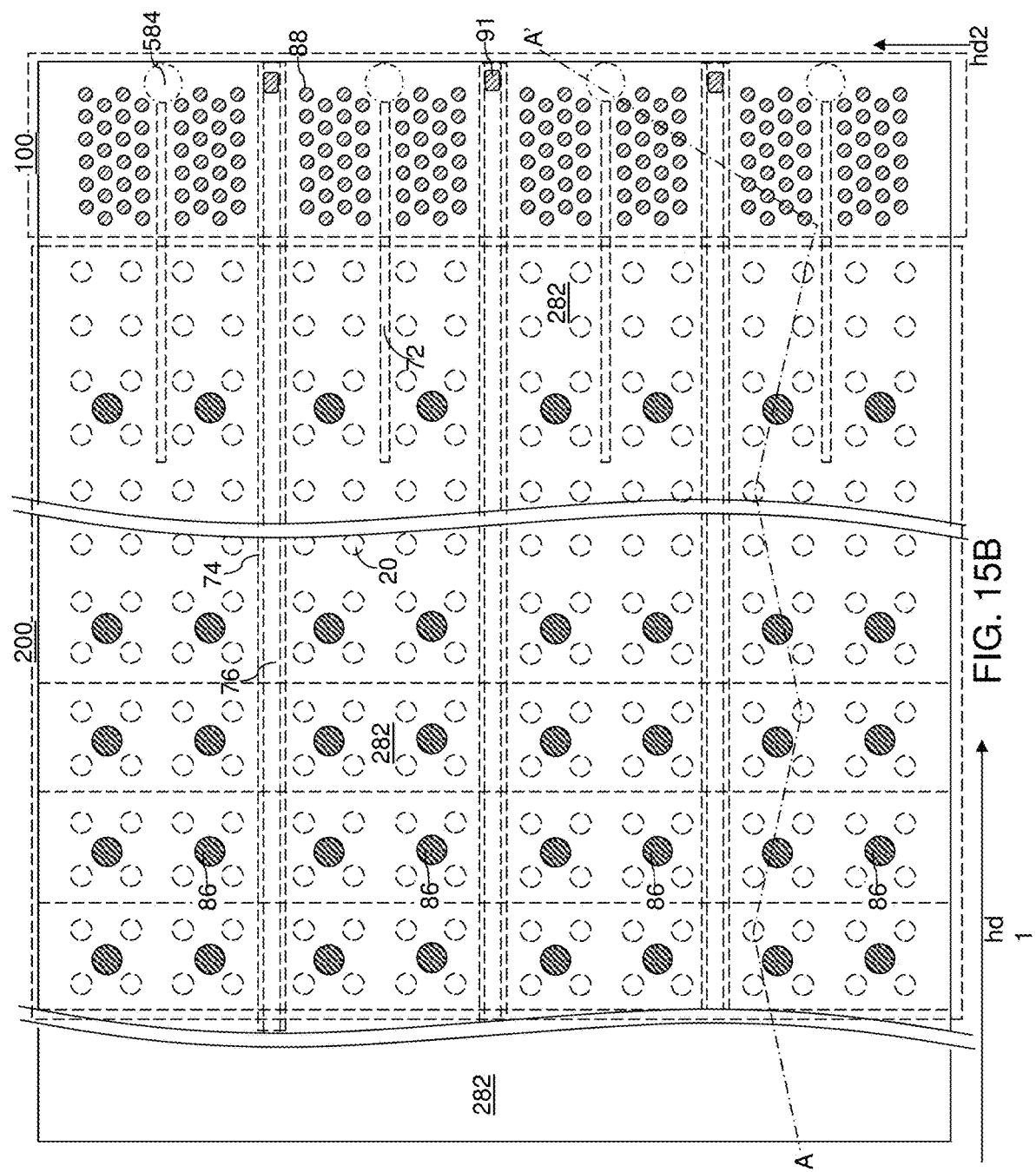
FIG. 15B is a horizontal cross-sectional view of the exemplary structure along the horizontal plane B-B' in FIG. 15A. The zig-zag vertical plane A-A' corresponds to the plane of the vertical cross-sectional view of FIG. 15A.

Referring to FIGS. 15A and 15B, a second contact level dielectric layer 282 can be optionally formed over the first contact level dielectric layer 280. Drain contact via structures 88 contacting the drain regions 63 can extend through the contact level dielectric layers (280, 282) and the second insulating cap layer 270 in the memory array region 100. A source connection via structure 91 can extend through the contact level dielectric layers (280, 282) to provide electrical connection to the laterally-elongated contact via structures 76.

Various contact via structures can be formed through the contact level dielectric layers (280, 282) and the retro-stepped dielectric material portions (165, 265). For example, word line contact via structures 86 can be formed in the word line contact region 200. A subset of the word line contact via structures 86 contacting the second electrically conductive layers 246 extends through the second-tier retro-stepped dielectric material portion 265 in the word line contact region 200, and does not extend through the first-tier retro-stepped dielectric material portion 165. Another subset of the word line contact via structures 86 contacting the first electrically conductive layers 146 extends through the second-tier retro-stepped dielectric material portion 265 and through the first-tier retro-stepped dielectric material portion 165 in the word line contact region 200.

Figure 16:
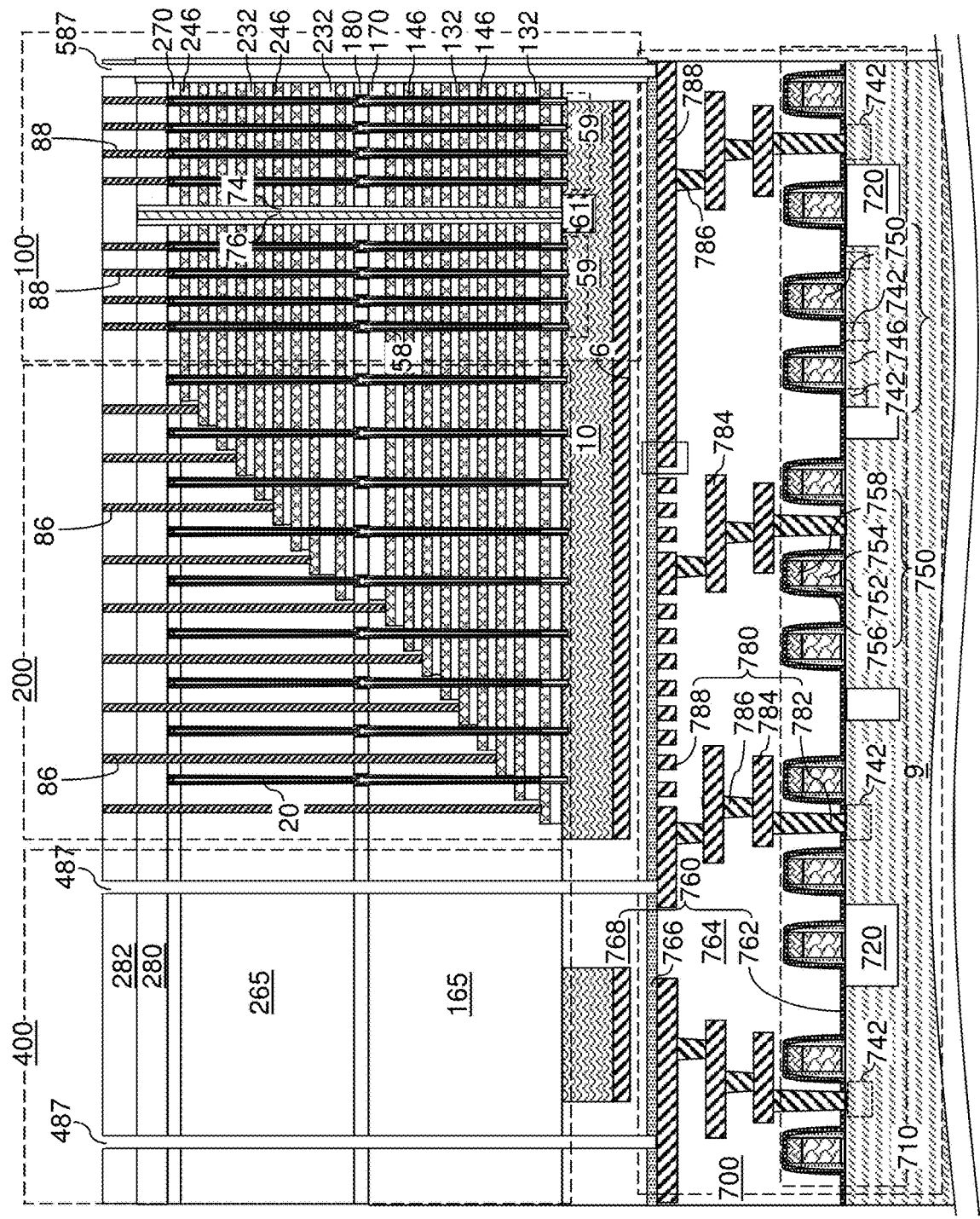
FIG. 16 is a vertical cross-sectional view of the exemplary structure after formation of second through-track via cavities and through-dielectric via cavities according to an embodiment of the present disclosure.

Referring to FIG. 16, a photoresist layer is applied over the second contact level dielectric layer 282, and is lithographically patterned to form openings that overlie the through-stack insulating material portions 584 in the memory array region 100, and additional memory openings in which layers of the alternating stacks (132, 146, 232, 246) are absent, i.e., in a peripheral region 400 located outside the memory array region 100 and the contact region 200.

Via cavities (487, 587) are formed by an anisotropic etch process that transfers the pattern of the openings in the photoresist layer to the top surfaces of the topmost lower metal line structures 788. For example, through-stack via cavities 587 are formed through the through-stack insulating material portions 584 such that a remaining portion of each through-stack insulating material portion 584 after formation of the through-stack via cavities 587 constitutes a through-stack insulating spacer 586. Further, through-dielectric via cavities 487 can be formed in the peripheral region through the contact level dielectric layers (280, 282), the retro-stepped dielectric material portions (165, 265), the at least one second dielectric material layer 768, and the silicon nitride layer 766 to a top surface of a respective one of the topmost lower metal liner structures 788.

Figure 17A:
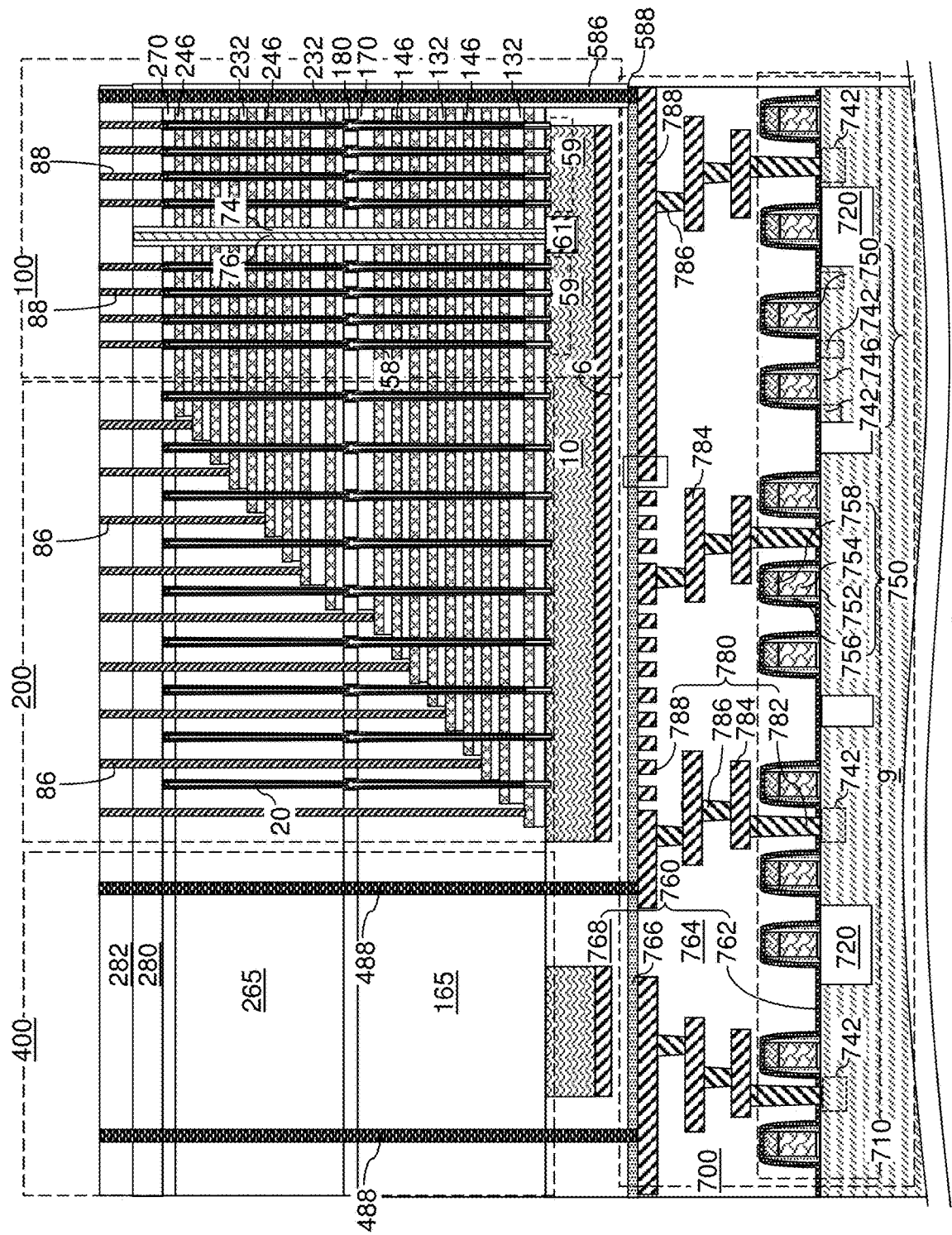
FIG. 17A is a vertical cross-sectional view of the exemplary structure after formation of through-stack contact via structures and through-dielectric contact via structures according to an embodiment of the present disclosure.
Figure 17B:
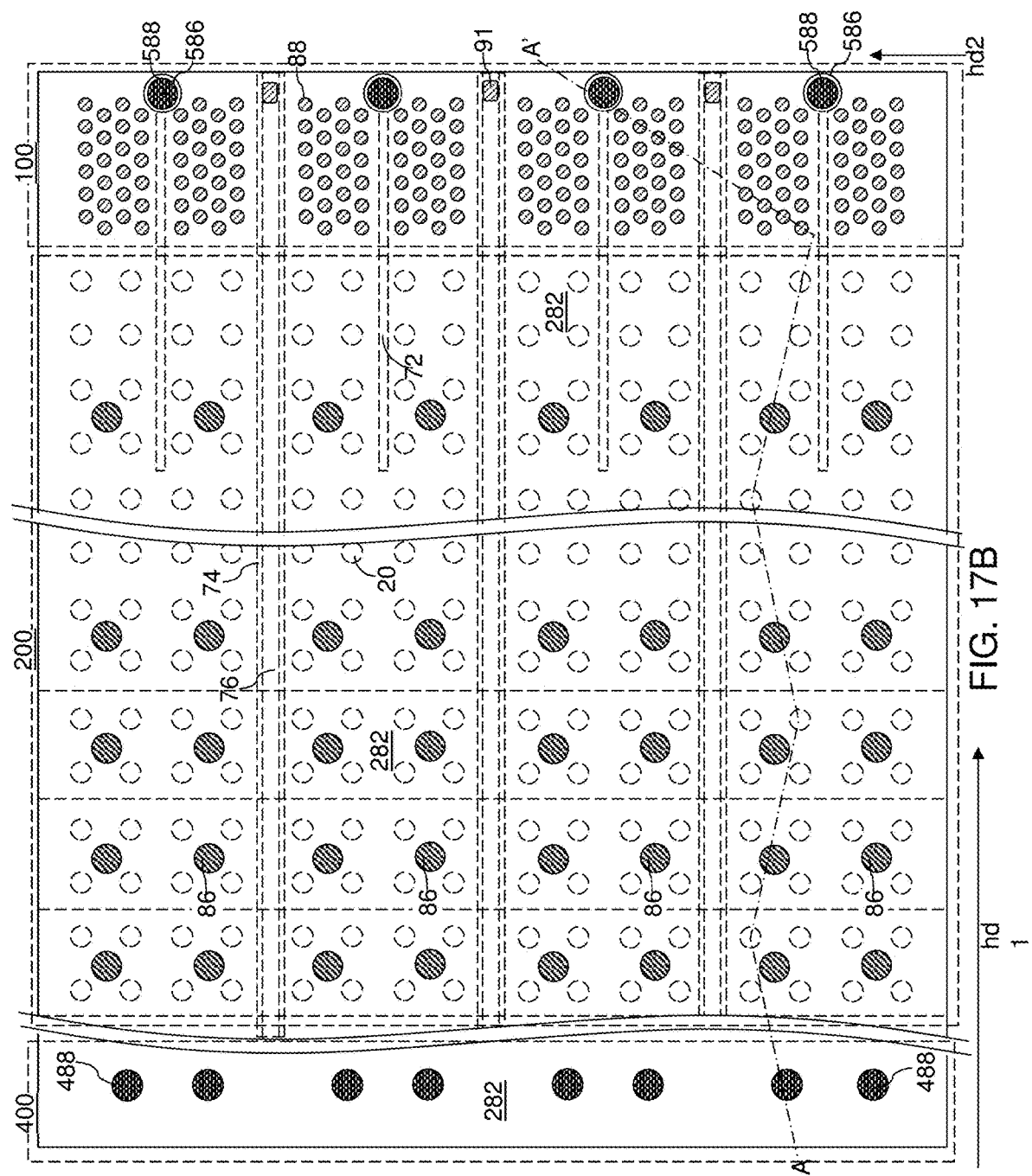
FIG. 17B is a top down view of the exemplary structure in FIG. 17A. The zig-zag vertical plane A-A' corresponds to the plane of the vertical cross-sectional view of FIG. 17A.

Referring to FIGS. 17A and 17B, at least one conductive material can be simultaneously deposited in the through-stack via cavities 587 and the through-dielectric via cavities 487. Excess portions of the at least one conductive material can be removed from outside the through-stack via cavities 587 and the through-dielectric via cavities 487. Each remaining portion of the at least one conductive material in the through-stack via cavities 587 constitutes a through-stack contact via structure 588 that contacts a top surface of a respective one of the topmost lower metal line structure 788. Each remaining portion of the at least one conductive material in the through-dielectric via cavities 487 that contacts a top surface of a respective one of the topmost lower metal line structure 788 constitutes a through-dielectric contact via structure 488.

Figure 18A:
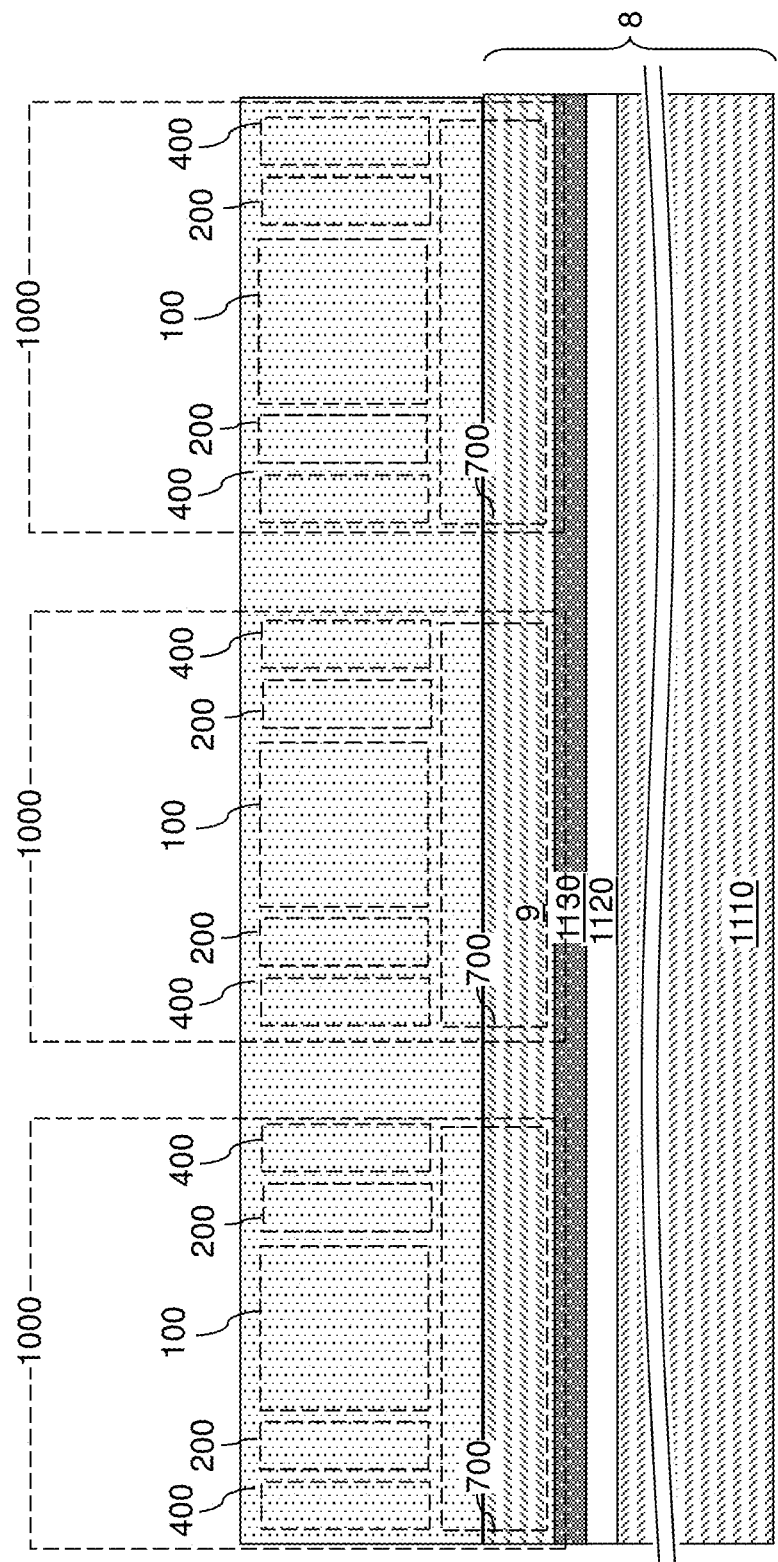
FIG. 18A is a vertical cross-sectional view of the exemplary structure after formation of upper metal interconnect structures and upper interconnect level dielectric layers at a low magnification according to an embodiment of the present disclosure.
Figure 18B:
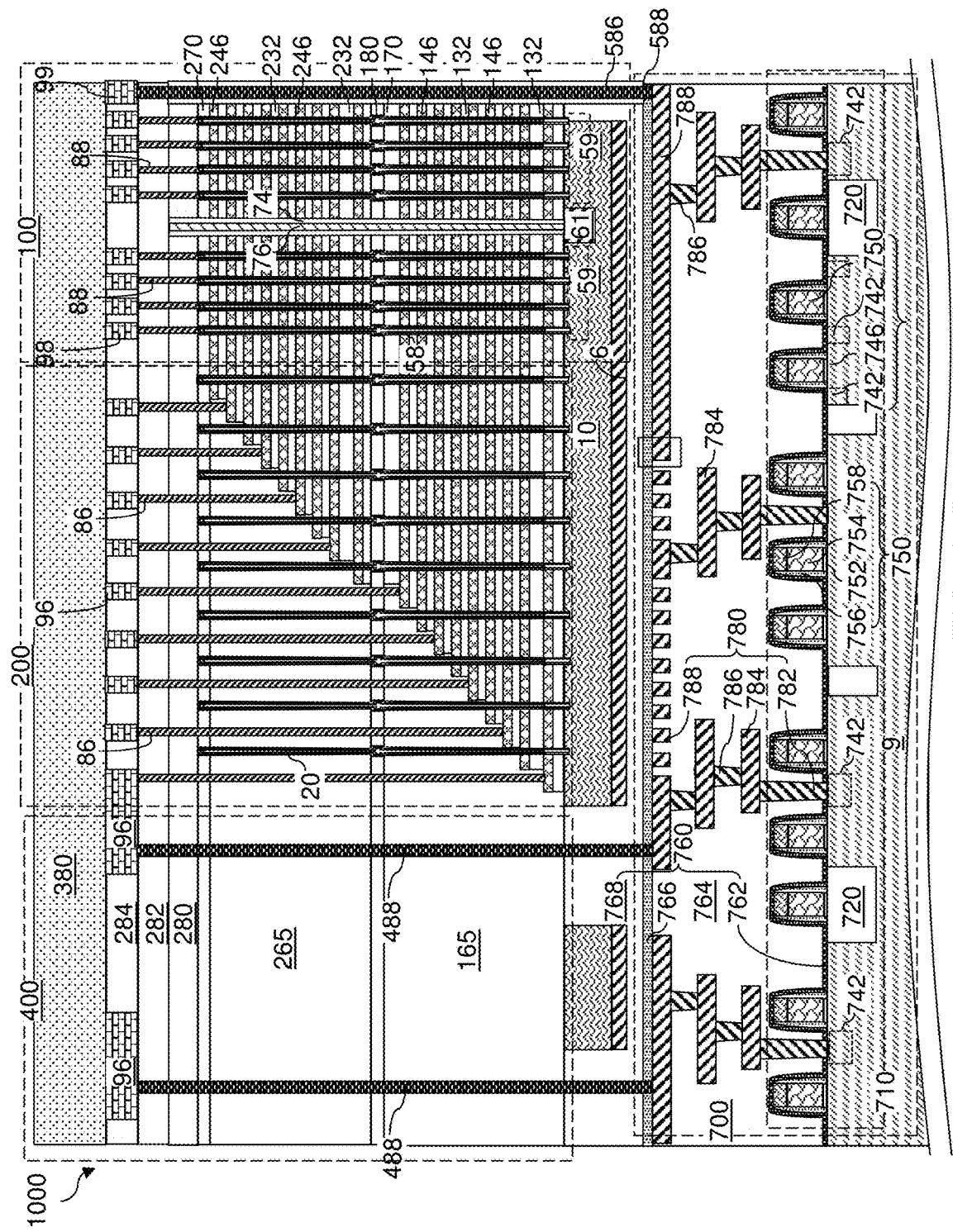
FIG. 18B is a vertical cross-sectional view of the exemplary structure of FIG. 18A at a medium magnification.

Referring to FIGS. 18A and 18B, at least one upper interconnect level dielectric layer 284 can be formed over the contact level dielectric layers (280, 282). Various upper interconnect level metal interconnect structures can be formed in the at least one upper interconnect level dielectric layer 284. For example, the various upper interconnect level metal interconnect structures can include line level metal interconnect structures (96, 98, 99). The line level metal interconnect structures (96, 98, 99) can include first upper metal line structures 99 that contact a top surfaces of a respective one of the through-stack contact via structures 588, second upper metal line structures 96 that contact a top surface of a respective one of the through-dielectric contact via structures 488, and bit lines 98 that contact a respective one of the drain contact via structures 88 and extend along the second horizontal direction (e.g., bit line direction) hd2 and perpendicular to the first horizontal direction (e.g., word line direction) hd1.

At least a subset of the upper metal interconnect structures (which include the line level metal interconnect structures (96, 98, 99)) is formed over the three-dimensional memory array. The upper metal interconnect structures comprise an upper metal line structure (such as a first upper metal line structure 99) that is formed directly on a through-stack contact via structure 588.

In one embodiment, the memory stack structures 55 can comprise memory elements of a vertical NAND device. The electrically conductive layers (146, 246) can comprise, or can be electrically connected to, a respective word line of the vertical NAND device. The substrate 8 can comprises a silicon substrate. The vertical NAND device can comprise an array of monolithic three-dimensional NAND strings over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising the word line driver circuit and a bit line driver circuit for the memory device. The array of monolithic three-dimensional NAND strings can comprise a plurality of semiconductor channels, wherein at least one end portion (such as a vertical semiconductor channel 60) of each of the plurality of semiconductor channels (59, 11, 60) extends substantially perpendicular to a top surface of the composite substrate 8, a plurality of charge storage elements (comprising portions of the memory material layer 54 located at each word line level), each charge storage element located adjacent to a respective one of the plurality of semiconductor channels (59, 11, 60), and a plurality of control gate electrodes (comprising a subset of the electrically conductive layers (146, 246) having a strip shape extending substantially parallel to the top surface of the substrate 8 (e.g., along the first horizontal direction hd1), the plurality of control gate electrodes comprise at least a first control gate electrode located in the first device level and a second control gate electrode located in the second device level.

Figure 18C:
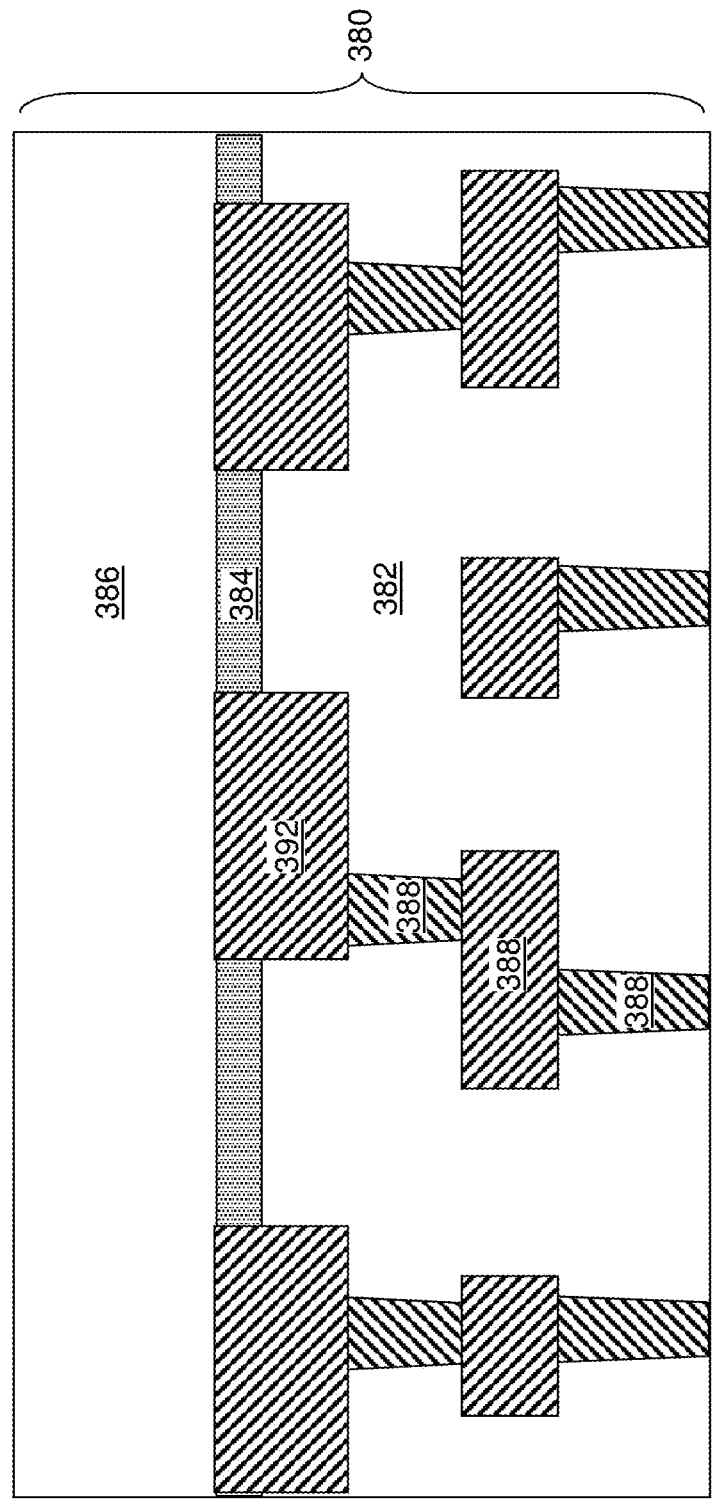
FIG. 18C is a vertical cross-sectional view of a portion of the upper metal interconnect structures and the upper interconnect level dielectric layers of FIG. 18B at a high magnification.

Referring to FIGS. 18A-18C, upper dielectric material layers 380 can be formed over the at least one upper interconnect level dielectric layer 284. The upper dielectric material layers 380 can include additional upper interconnect level dielectric layers 382 that include upper metal interconnect structures 388, a cap silicon nitride passivation layer 384 including openings in which metallic contact pads 392 are located, and a sacrificial cap silicon oxide layer 386 that overlies the cap silicon nitride passivation layer 384. The upper metal interconnect structures 388 can be electrically connected to various nodes of the underlying three-dimensional memory array and/or various nodes of the semiconductor devices 710. The metallic contact pads 392 can be included in the uppermost of the additional upper interconnect level dielectric layers 382. The cap silicon nitride passivation layer 384 and the metallic contact pads 392 can collectively form a continuous structure that covers the entire area of the exemplary structure. The cap silicon nitride passivation layer can laterally surround an upper portion of each of the metallic contact pads 392, or can contact top surfaces of the metallic contact pads 392 with openings therethrough such that metallic contact pads 392 can be subsequently bonded to a respective bonding structure such as a solder ball or a bonding wire. The thickness of the cap silicon nitride passivation layer 384 can be in a range from 100 nm to 500 nm, although lesser and greater thicknesses can also be used. The sacrificial cap silicon oxide layer 386 is optional, and can include a silicon oxide material that is used to temporarily protect the cap silicon nitride passivation layer 384. The sacrificial cap silicon oxide layer 386 includes silicon oxide, and can have a thickness in a range from 1 micron to 5 microns. In one embodiment, the sacrificial cap silicon oxide layer 386 can have a higher etch rate in dilute hydrofluoric acid than the material of the sacrificial bonding material layer 1120. For example, the sacrificial bonding material layer 1120 can include borosilicate glass, and the sacrificial cap silicon oxide layer 386 can include undoped silicate glass.

The exemplary structure includes a plurality of semiconductor dies 1000 between the sacrificial bonding material layer 1120 and the topmost surface of the upper dielectric material layers 380. The plurality of semiconductor dies is included within various continuous material layers (380, 284, 282, 280, 180, 760) located on a front side of the substrate semiconductor layer 9. Each of the continuous material layers (380, 284, 282, 280, 180, 760) continuously extends over areas of the plurality of semiconductor dies 1000. Each of the plurality of semiconductor dies 1000 comprises a respective set of semiconductor devices 710 formed within, or directly on, the substrate semiconductor layer 9.

A total thickness of the continuous material layers (380, 284, 282, 280, 180, 760), as measured from a bottom surface of a bottommost layer within the continuous material layers (380, 284, 282, 280, 180, 760) to a top surface of a topmost layer within the continuous material layers (380, 284, 282, 280, 180, 760), can have a total thickness in a range from 20 microns to 100 microns. Thus, the semiconductor dies 100 can have a sufficient thickness that can be mechanically handled without breakage upon dicing. It is noted that the three-dimensional memory devices accounts for a significant fraction of the total thickness of the continuous material layers (380, 284, 282, 280, 180, 760).

In one embodiment, each of the semiconductor dies 1000 can include a respective three-dimensional memory device included within the continuous material layers (380, 284, 282, 280, 180, 760). Thus, each of the semiconductor dies 1000 can include a respective three-dimensional array of memory elememts. In one embodiment, each of the three-dimensional memory devices comprises a two-dimensional array of vertical NAND strings that extend through an alternating stack {(132, 146), (232, 246)} of insulating layers (132, 232) and electrically conductive layers (146, 246). In one embodiment, each of the semiconductor dies 1000 can comprise a respective set of complementary metal oxide semiconductor (CMOS) devices formed directly on a front side surface of the substrate semiconductor layer 9, which can be components of the semiconductor devices 710.

In one embodiment, the continuous material layers (380, 284, 282, 280, 180, 760) comprise lower-level dielectric material layers 760 embedding lower-level metal interconnect structures 780 that are electrically connected to the CMOS devices and to the three-dimensional memory devices and located between the front side surface of the substrate semiconductor layer 9 and the three-dimensional memory devices. In one embodiment, the continuous material layers (380, 284, 282, 280, 180, 760) comprise upper interconnect level dielectric layers (382, 284, 282, 280) that include metal interconnect structures, such as the upper metal interconnect structures (388, 96. 98. 99), within the plurality of semiconductor dies 1000, and a cap silicon nitride passivation layer 384 contacting metallic contact pads 392 electrically connected to the metal interconnect structures (388, 96. 98. 99).

Referring to FIGS. 19A-19D, a patterned etch mask layer 1077 can be formed over the exemplary structure to cover each of the plurality of semiconductor dies 1000, while not covering areas of dicing channels that separate neighboring pairs of semiconductor dies 1000. The patterned etch mask layer 1077 may be a lithographically patterned photoresist material layer, or may be a disposable hard mask material layer that is patterned by application and patterning of a photoresist layer thereabove and by a subsequent pattern transfer into the disposable hard mask material layer. If a photoresist material layer is used for the patterned etch mask layer 1077, the thickness of the photoresist material layer can be in a range from 5 microns to 100 microns, although lesser and greater thicknesses can also be used.

Figure 19A:
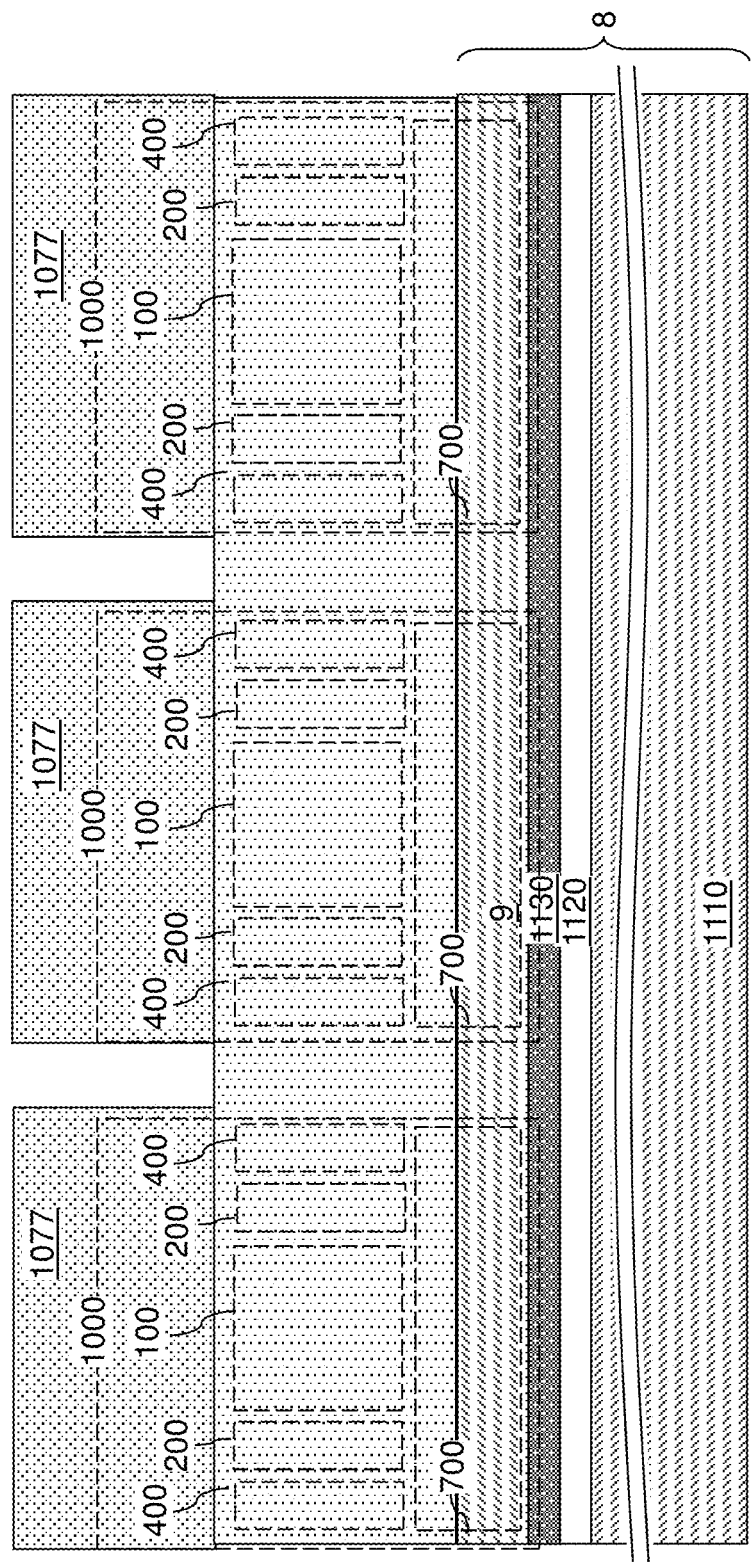
FIG. 19A is a vertical cross-sectional view of the exemplary structure after formation of a patterned etch mask layer according to an embodiment of the present disclosure.
Figure 19B:
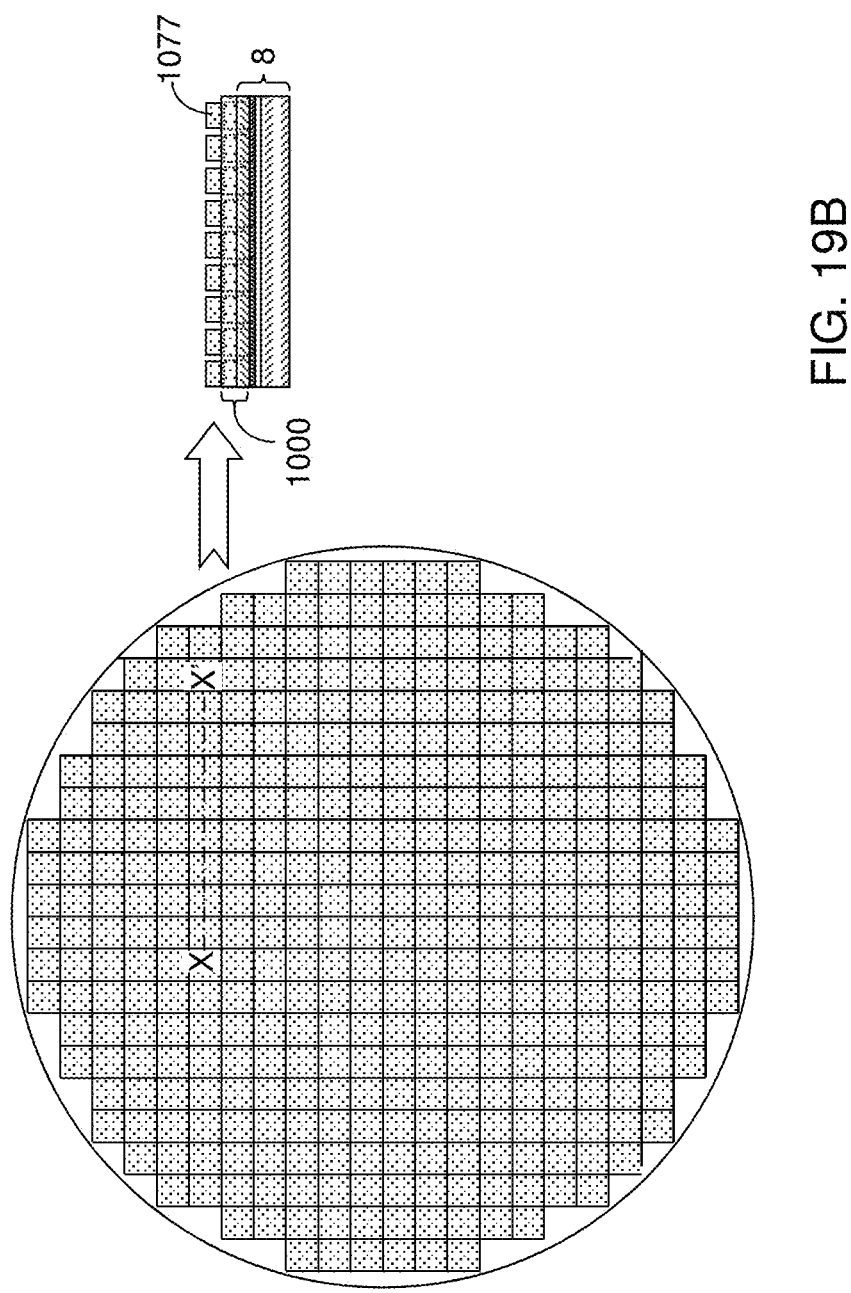
FIG. 19B is a top-down view of the exemplary structure of FIG. 19A at a low magnification. A vertical cross-sectional view of the exemplary structure along the plane X-X' is also shown.
Figure 19C:
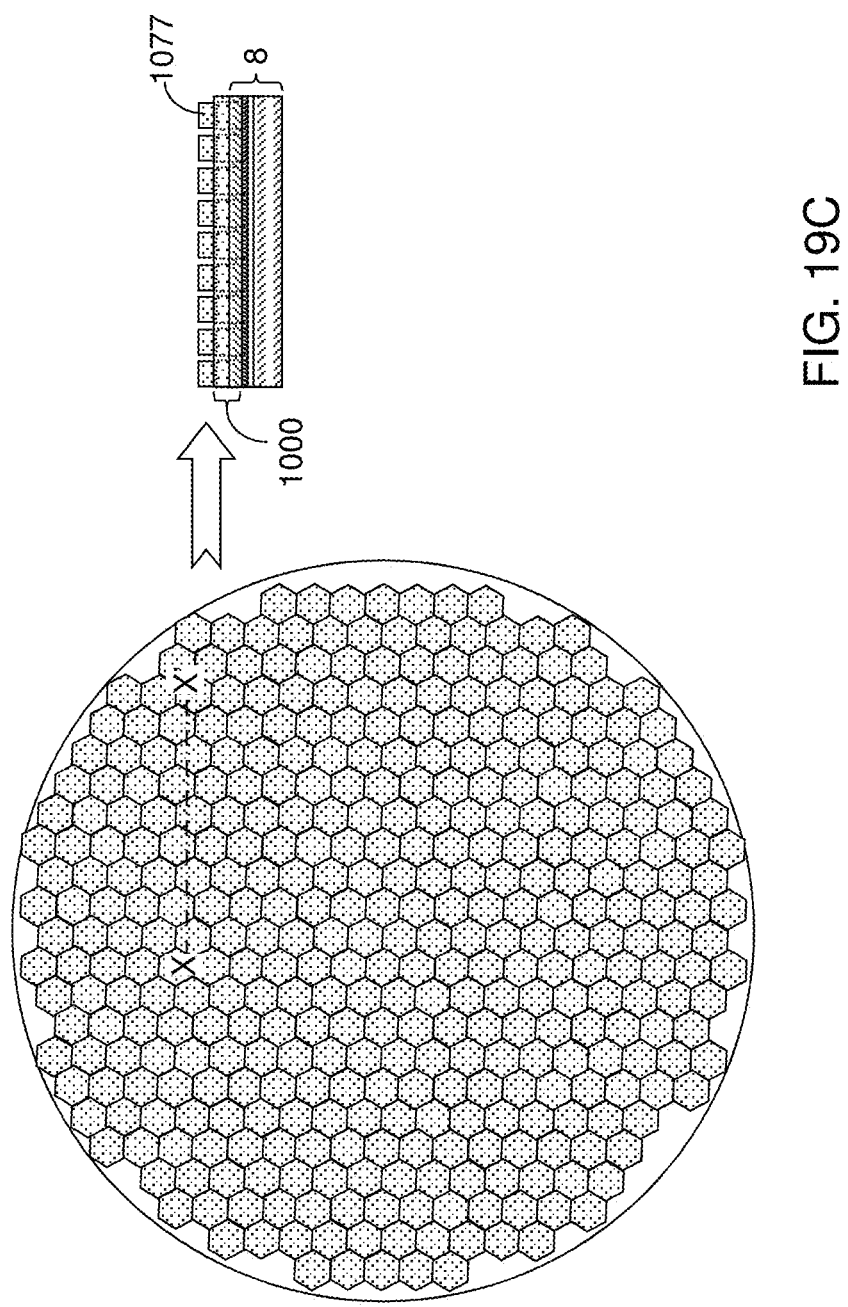
FIG. 19C is a top-down view of a first alternative configuration of the exemplary structure of FIG. 19A at a low magnification. A vertical cross-sectional view of the exemplary structure along the plane X-X' is also shown.
Figure 19D:
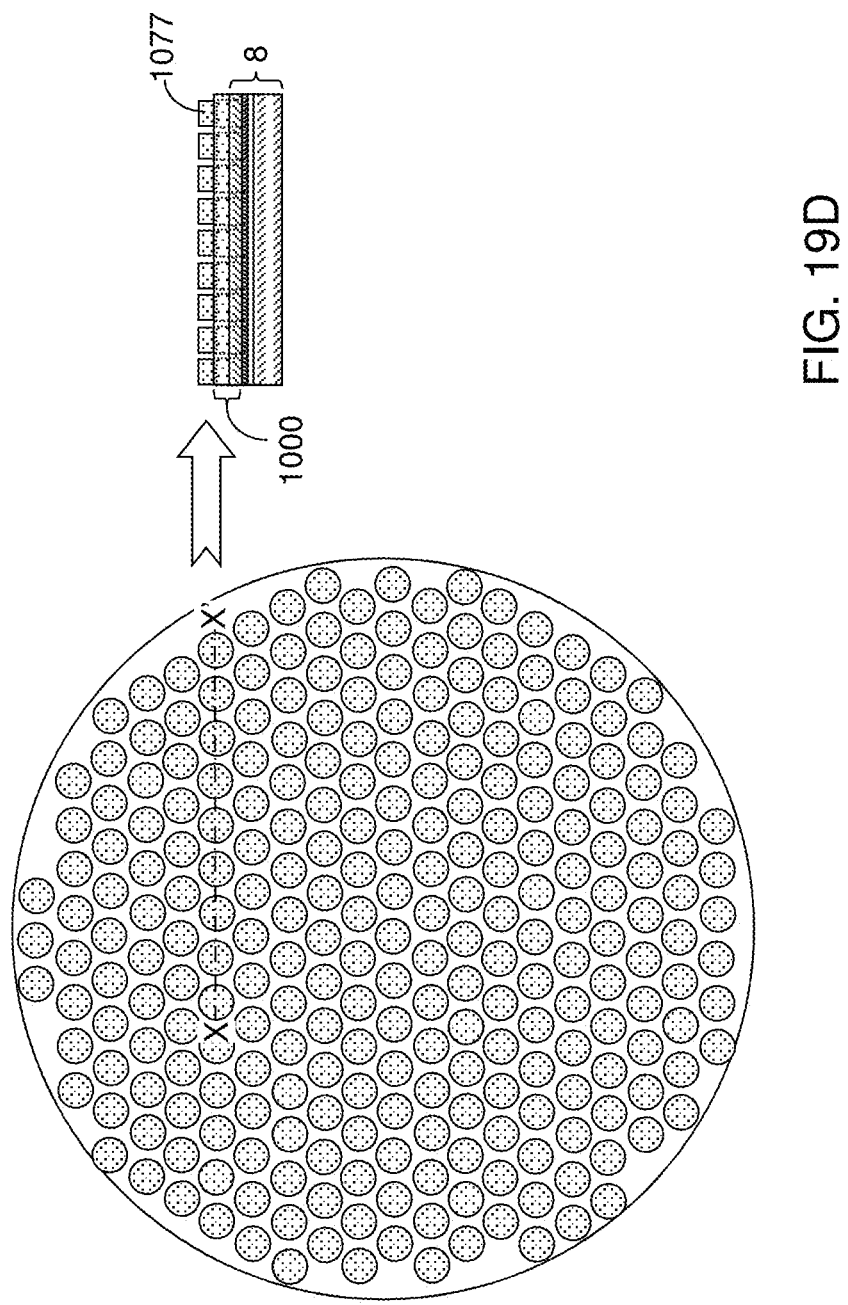
FIG. 19D is a top-down view of a second alternative configuration of the exemplary structure of FIG. 19A at a low magnification. A vertical cross-sectional view of the exemplary structure along the plane X-X' is also shown.

According to an aspect of the present disclosure, the areas and directions of the dicing channels between neighboring pairs of semiconductor dies 1000 are not limited to rectangular grid shapes. The horizontal cross-sectional shape of each semiconductor die 1000 may be a rectangular shape, or a non-rectangular shape. Generally, the horizontal cross-sectional shape of each semiconductor die 1000 can be any two-dimensional closed shape that defines a single continuous isolated area. In one embodiment, each of the plurality of semiconductor dies 1000 can have a rectangular horizontal cross-sectional shape as illustrated in FIG. 19B. In one embodiment, each of the plurality of semiconductor dies 1000 can have a non-rectangular horizontal cross-sectional shape as illustrated in FIGS. 19C and 19D. In one embodiment, the plurality of dicing channels can laterally extend along at least three different horizontal directions (for example, along directions of sides of a hexagon) as illustrated in FIG. 19C. In one embodiment, at least one of the plurality of semiconductor dies 1000 can have a curved horizontal cross-sectional shape (such as a circle, an oval, or an ellipse) as illustrated in FIG. 19D. The spacing between neighboring pairs of semiconductor dies 1000 may be uniform as illustrated in FIGS. 19B and 19C, or may be non-uniform as illustrated in FIG. 19D. Thus, semiconductor dies 1000 having any two-dimensional cross-sectional shape defining a single continuous area can be formed. Further, each semiconductor die 1000 may be formed as a set two or more disjoined structures having the same, or different, shapes.

Figure 19F:
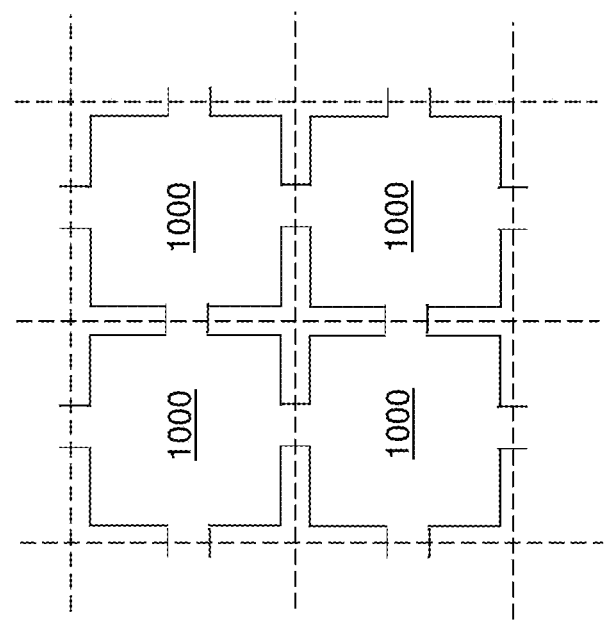
FIG. 19F is a schematic diagram illustrating a second dicing channel configuration for the exemplary structures of FIGS. 19A-19D.
Figure 19E:
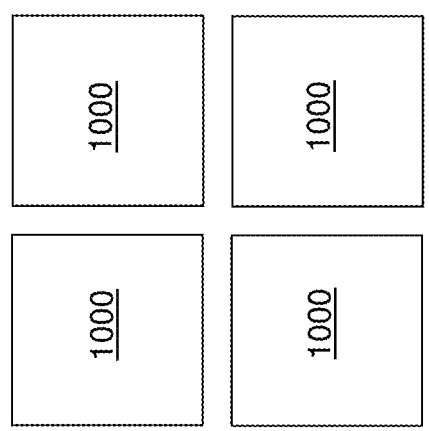
FIG. 19E is a schematic diagram illustrating a first dicing channel configuration for the exemplary structures of FIGS. 19A-19D.

FIGS. 19E and 19F illustrate dicing channel configurations that can be employed for the exemplary structure illustrated in FIGS. 19A-19D. In one embodiment, the dicing channels may completely laterally surround each semiconductor die 1000 after the processing steps of FIGS. 19A-19D as illustrated in FIG. 19E. In another embodiment, bridges connecting neighboring pairs of semiconductor dies 1000 may be present after the processing steps of FIGS. 19A-19D as illustrated in FIG. 19F. In case the dicing channel configuration of FIG. 19E is employed, the semiconductor dies 1000 can be completely physically isolated from one another after subsequent removal of the sacrificial bonding material layer 1120. In case the dicing channel configuration of FIG. 19F is employed, additional wafer level processing steps (such as wafer bumping or attachment of a cohesive and/or adhesive material for die stacking) may be performed after subsequent removal of the sacrificial bonding material layer 1120.

Figure 20:
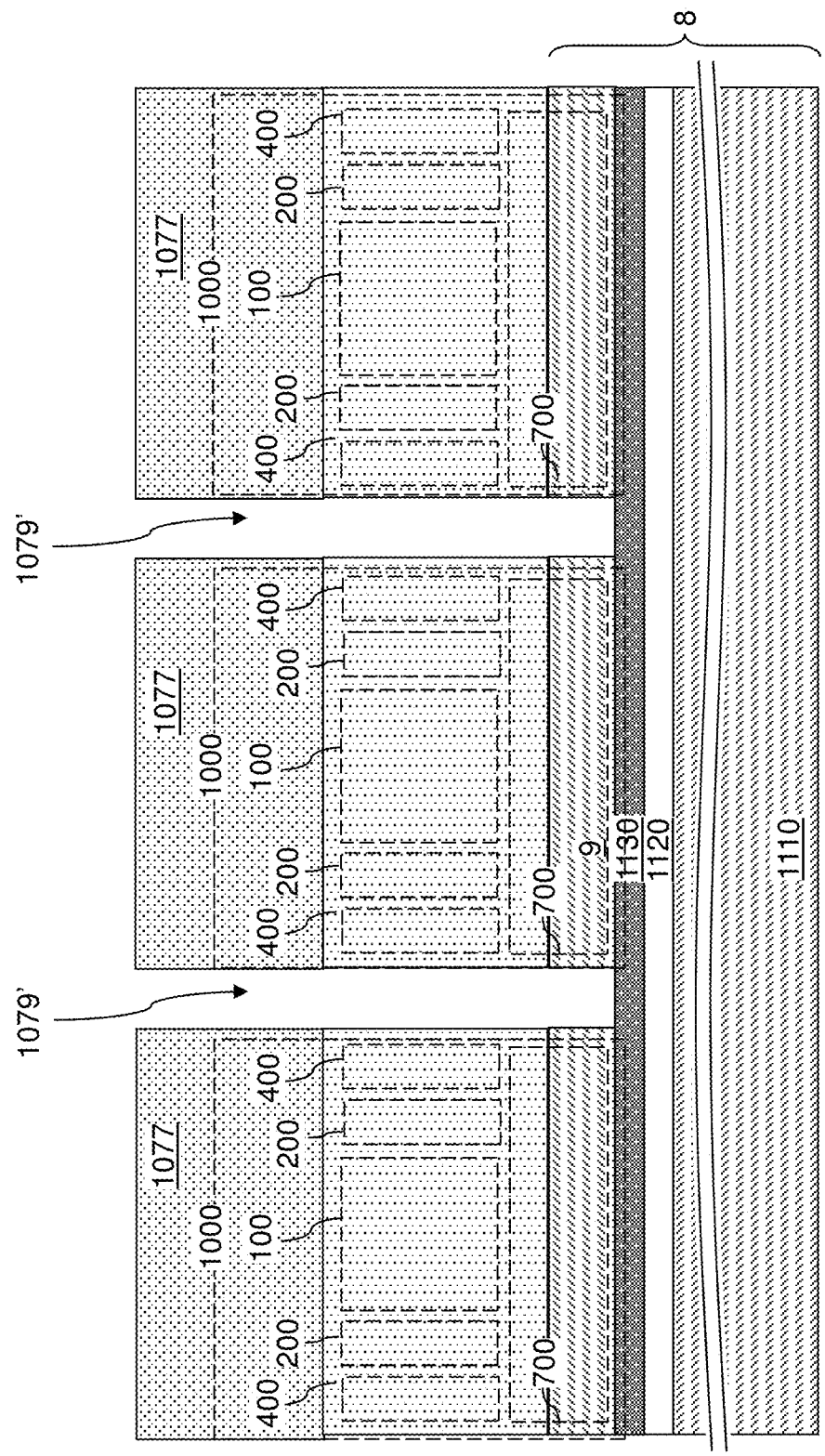
FIG. 20 is a vertical cross-sectional view of the exemplary structure after formation of dicing channels according to an embodiment of the present disclosure.

Referring to FIG. 20, an anisotropic etch is performed through all material layers of the semiconductor dies 1000 using the patterned etch mask layer 1077 as an etch mask, i.e., a mask that protects underlying material portions from etchants of the anisotropic etch process. The pattern in the patterned etch mask layer 1077 is transferred through all material portions of the exemplary structures that are located above the backside silicon nitride passivation layer 1130 and are not masked by the patterned etch mask layer 1077 to form in-process dicing channels 1079'. Each of the in-process dicing channels 1079' includes a pair of straight sidewalls that extend from a top surface of the backside silicon nitride passivation layer 1130 to a topmost surface of the upper dielectric material layers 380. The straight sidewalls of the in-process dicing channels 1079' may be vertical or substantially vertical with a taper angle less than 3 degrees with respect to the vertical direction. Generally, the plurality of in-process dicing channels 1079 can be formed between neighboring pairs among the plurality of semiconductor dies 1000 by anisotropically etching portions of the continuous material layers (380, 284, 282, 280, 180, 760) located between neighboring pairs of semiconductor dies 1000 and not masked by the patterned etch mask layer 1077. The plurality of in-process dicing channels 1079' extends to a top surface of the backside silicon nitride passivation layer 1130.

Figure 21:
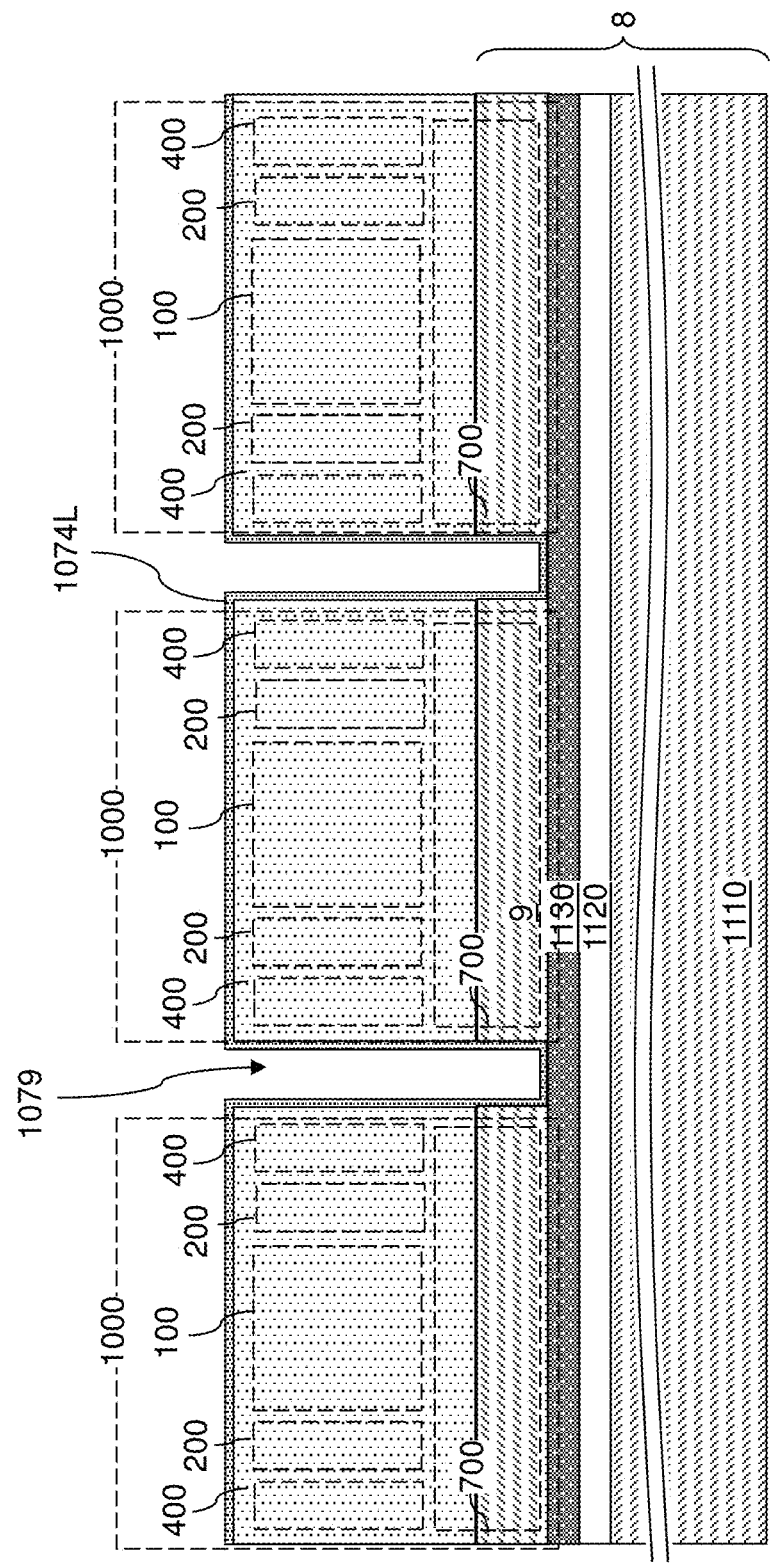
FIG. 21 is a vertical cross-sectional view of the exemplary structure after formation of a continuous silicon nitride liner according to an embodiment of the present disclosure.

Referring to FIG. 21, the patterned etch mask layer 1077 can be removed selective to materials of the various physically exposed sidewall surfaces of the semiconductor dies 1000. For example, if the patterned etch mask layer 1077 includes a photoresist material, the patterned etch mask layer 1077 can be removed by ashing. If the patterned etch mask layer 1077 includes a polymer material, the patterned etch mask layer 1077 may be dissolved in an organic solvent.

A continuous silicon nitride liner 1074L can be deposited on physically exposed surfaces of the semiconductor dies 1000 and on physically exposed portions of the top surface of the backside silicon nitride passivation layer 1130. The continuous silicon nitride liner 1074L can be formed on sidewalls of the plurality of semiconductor dies 1000 and over the plurality of semiconductor dies 1000. A chemical vapor deposition process can be used to deposit the continuous silicon nitride liner 1074L. The continuous silicon nitride liner 1074L may, or may not, be conformal. The average thickness of the continuous silicon nitride liner 1074L on the sidewalls of the semiconductor dies 1000 can be in a range from 100 nm to 1,000 nm, although lesser and greater thicknesses can also be used.

Figure 22:
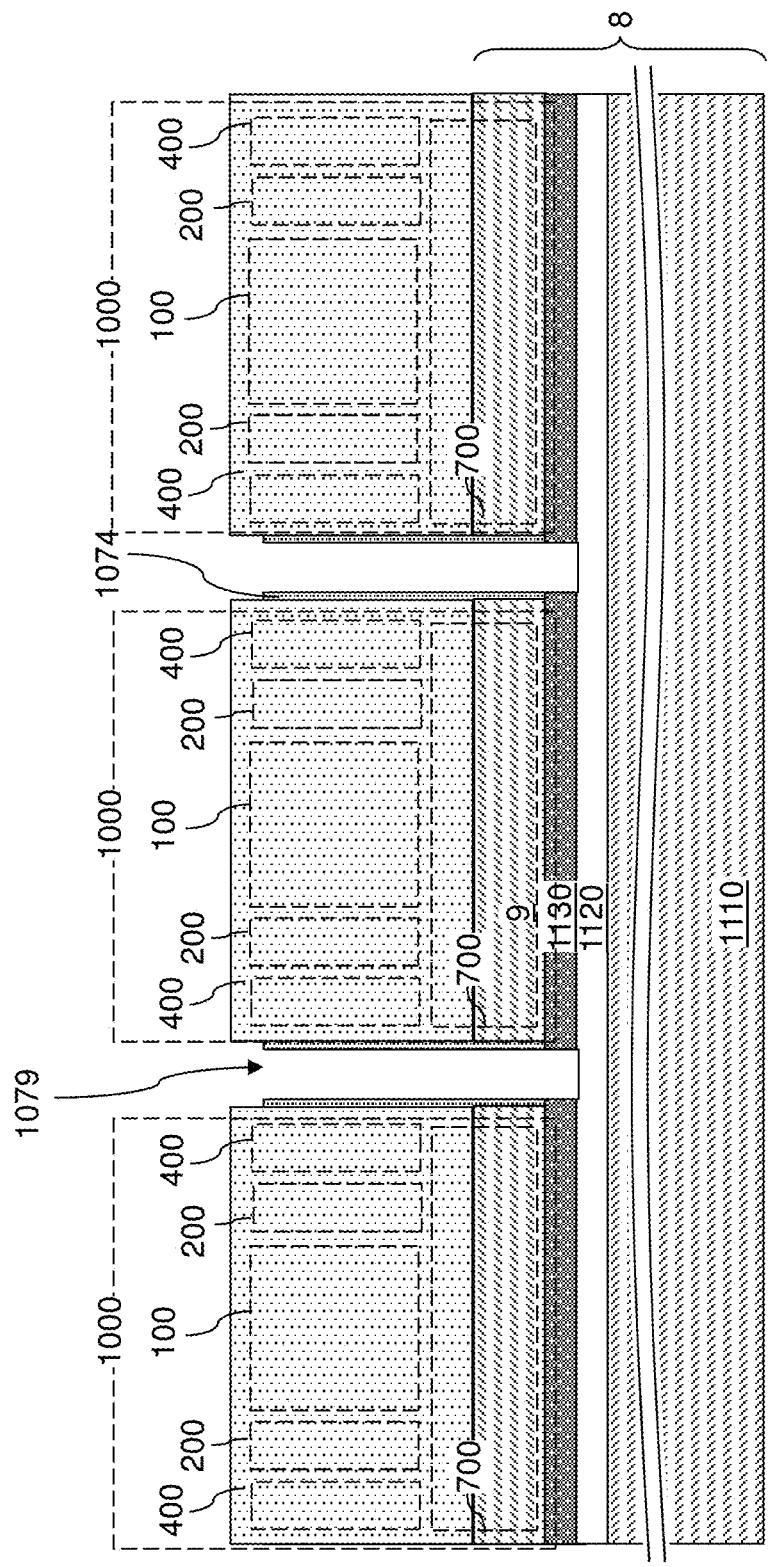
FIG. 22 is a vertical cross-sectional view of the exemplary structure after anisotropically etching the continuous silicon nitride liner and a backside silicon nitride passivation layer according to an embodiment of the present disclosure.

Referring to FIG. 22, the continuous silicon nitride liner 1074L and portions of the backside silicon nitride passivation layer 1130 that underlie the in-process dicing channels 1079' are etched by an anisotropic etch process. The anisotropic etch process anisotropically etches the continuous silicon nitride liner 1074L and the backside silicon nitride passivation layer 1130 to vertically extend the in-process dicing channels 1079'. A top surface of the sacrificial cap silicon oxide layer 386 can be physically exposed upon removal of horizontal portions of the continuous silicon nitride liner 1074L from above each semiconductor die 1000. The vertically-extended in-process dicing channels 1079' constitute a plurality of dicing channels 1079. The plurality of dicing channels 1079 extends to a top surface of the sacrificial bonding material layer 1120.

Remaining portions of the continuous silicon nitride liner 1074L include discrete tubular portions that laterally surround a respective one of the semiconductor dies 1000. Each remaining portion of the continuous silicon nitride liner 1074L is herein referred to as silicon nitride passivation liners 1074, which can function as diffusion barrier layers that protect each semiconductor die 1000 from ingress of moisture or contaminants through sidewalls of the semiconductor die 1000. Sidewalls of the plurality of dicing channels 1079 comprises outer sidewalls of the silicon nitride passivation liners 1074 and sidewalls of remaining portions of the silicon nitride passivation layer 1130. Each silicon nitride passivation liner 1074 laterally surrounds a respective one of the plurality of semiconductor dies 1000. Portions of the top surface of the sacrificial bonding material layer 1120 are physically exposed between each neighboring pair of semiconductor dies 1000.

In one embodiment, top surfaces of the silicon nitride passivation liners 1074 can be adjoined to remaining portions of the cap silicon nitride passivation layer 384, and bottom surfaces of silicon nitride passivation liners 1074 can be adjoined to the backside silicon nitride passivation layer 1130. In this case, each semiconductor die 1000 can be entirely encapsulated by a combination of a remaining portion of a cap silicon nitride passivation layer 384, a silicon nitride passivation liner 1074, the backside silicon nitride passivation layer 1130, and a respective set of metallic contact pads 392.

Figure 23:
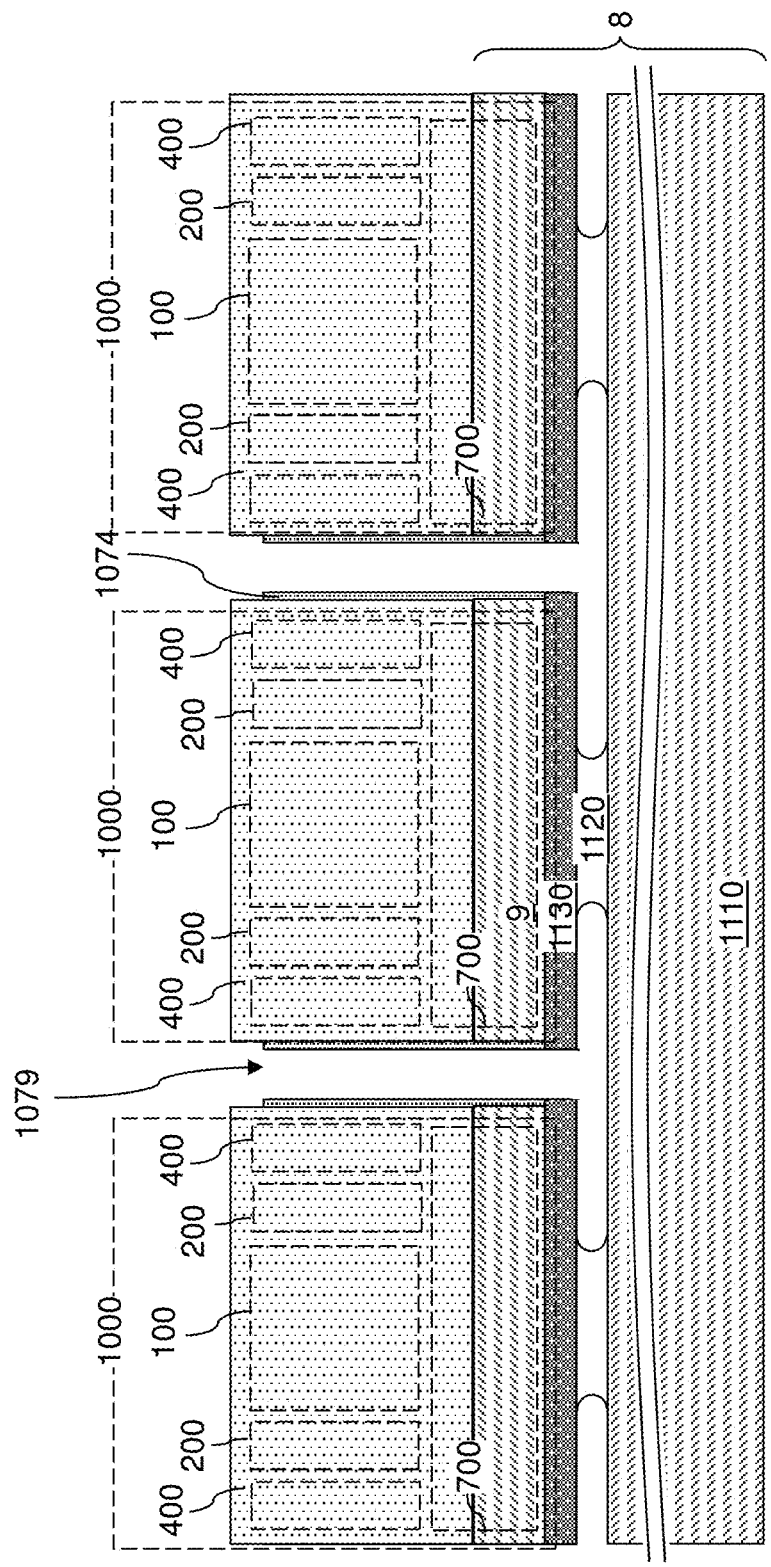
FIG. 23 is a vertical cross-sectional view of the exemplary structure after partially isotropically etching a sacrificial bonding material layer according to an embodiment of the present disclosure.

Referring to FIG. 23, the sacrificial bonding material layer 1120 can be removed selective to materials of surface portions of the plurality of semiconductor dies 1000 using an isotropic etch process. FIG. 23 illustrates the exemplary structure during the isotropic etch process after the sacrificial bonding material layer 1120 is partially removed after the etchant of the isotropic etch process etches proximal portions of the sacrificial bonding material layer 1120 from the dicing channels 1079 and before the etchant of the isotropic etch process etches distal portions of the sacrificial bonding material layer 1120.

For example, the material of the sacrificial bonding material layer 1120 can be etched selective to materials of the cap silicon nitride passivation layer 384, the silicon nitride passivation liners 1074, the remaining portions of the backside silicon nitride passivation layer 1130, and the metallic contact pads 392 using an isotropic etch process. The isotropic etch process can use an etch chemistry that removes the material of the sacrificial bonding material layer 1120 selective to silicon nitride. If the sacrificial bonding material layer 1120 includes a silicon oxide-based material such as a doped silicate glass (e.g., borosilicate glass), undoped silicate glass, organosilicate glass, and thermal silicon oxide, the isotropic etch process can use a wet etch chemical comprising at least one of hydrofluoric acid, sodium hydroxide, and potassium hydroxide. The sacrificial cap silicon oxide layer 386 can be collaterally removed selective to the remaining portions of the backside silicon nitride passivation layer 1130 and the metallic contact pads 392 during the isotropic etch process.

Figure 24A:
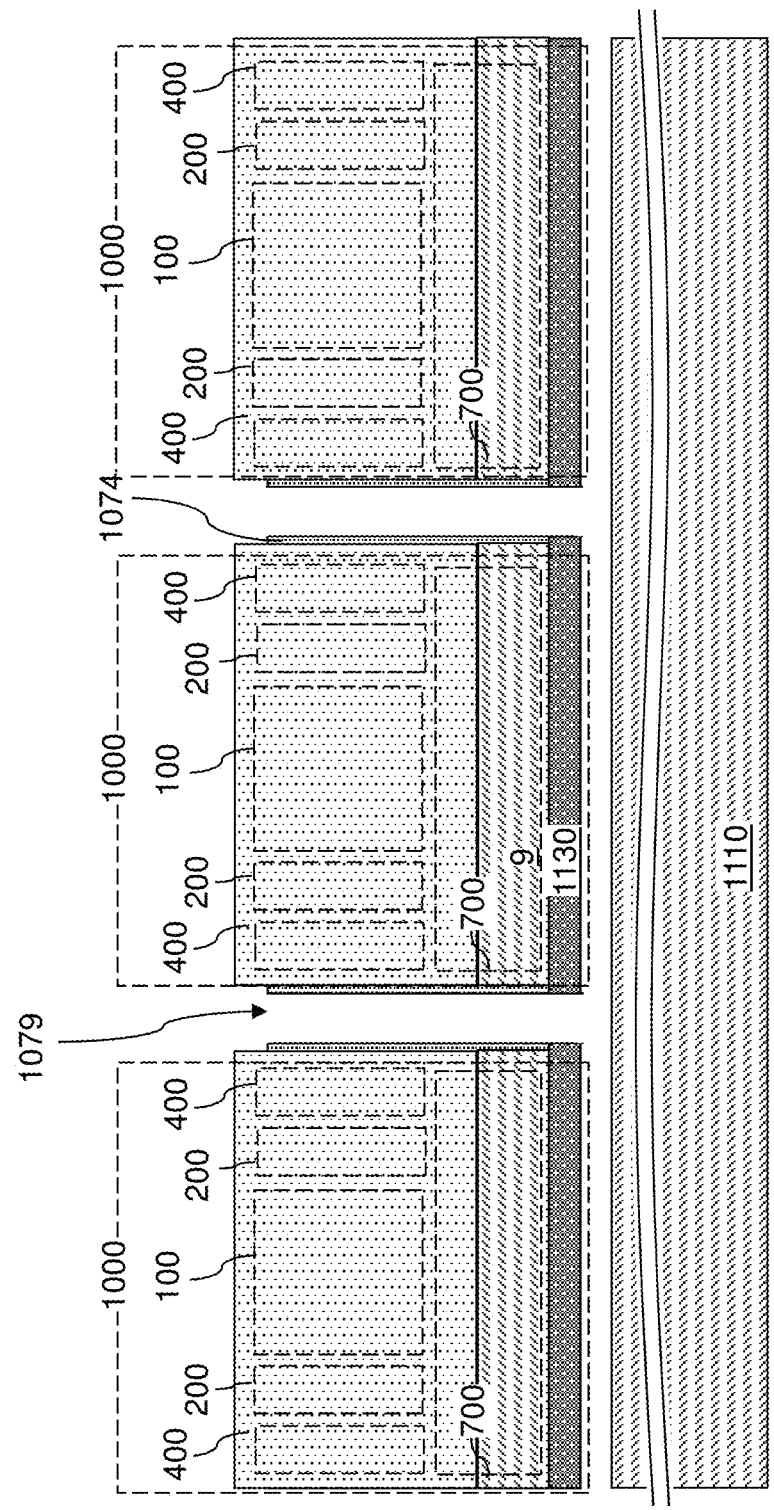
FIG. 24A is a vertical cross-sectional view of the exemplary structure after completely removing the sacrificial bonding material layer according to an embodiment of the present disclosure.
Figure 24B:
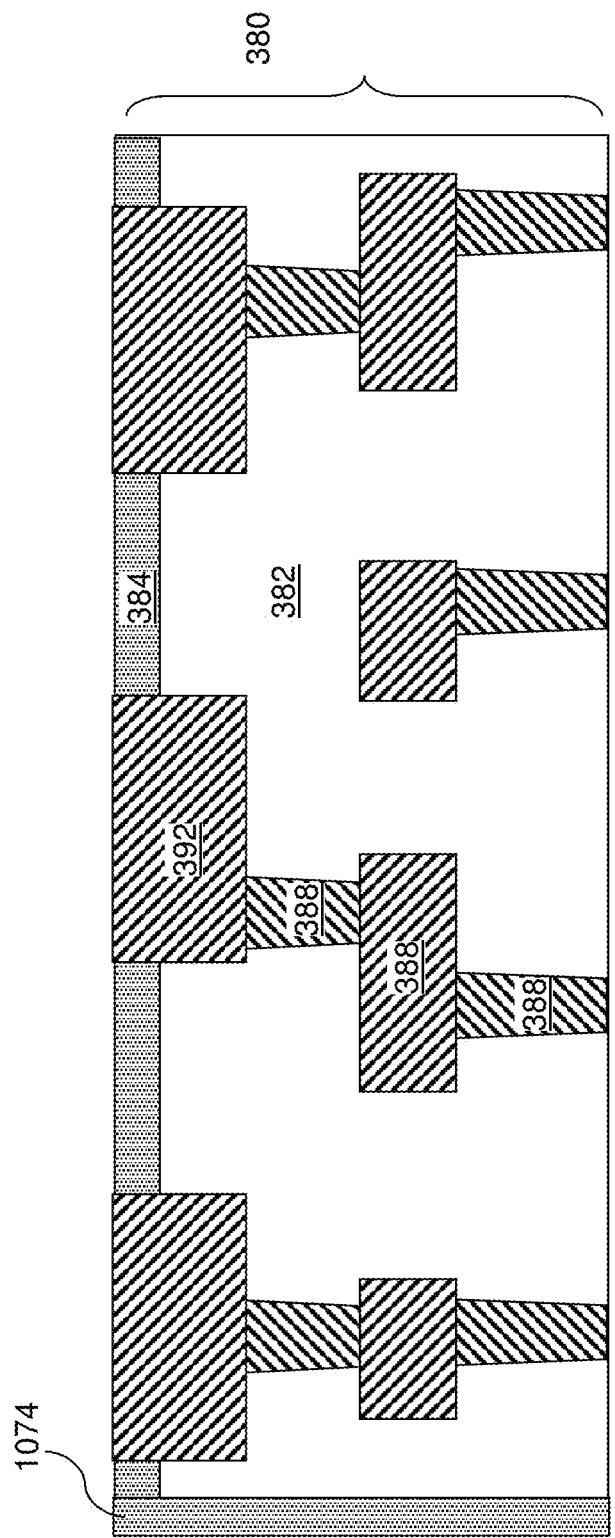
FIG. 24B is a vertical cross-sectional view of a portion of the upper metal interconnect structures and the upper interconnect level dielectric layers of a semiconductor die in FIG. 24A at a high magnification.

Referring to FIGS. 24A and 24B, the isotropic etch process can proceed further until the sacrificial bonding material layer 1120 is completely removed. The plurality of semiconductor dies 1000 is singulated from one another upon removal of the sacrificial bonding material layer 1120. Thus, the semiconductor dies 1000 can be singulated without applying external mechanical force that is typically associated with physical cutting or grinding as known in the art. Because the semiconductor dies 1000 are not subjected to mechanical stress during singulation, the semiconductor dies 1000 are less prone to stress-induced device failure, and the reliability of the semiconductor devices in the semiconductor dies 1000 is enhanced.

In one embodiment, physically exposed surfaces of each of the plurality of semiconductor dies 1000 after singulation include surfaces of remaining portions of the backside silicon nitride passivation layer 1130, surfaces of a silicon nitride passivation liner 1074, surfaces of a remaining portion of the cap silicon nitride passivation layer 384, and surfaces of a subset of the metallic contact pads 392. The carrier substrate 1110 may be reused for bonding to another semiconductor substrate layer 9 through a sacrificial bonding material layer, and the processing steps of the embodiment methods of the present disclosure can be used again to provide additional singulated semiconductor dies 1000.

The backside silicon nitride passivation layer 1130 can function as a passivation layer that blocks diffusion of impurity materials and moisture from the backside into each semiconductor die 1000. In addition, the backside silicon nitride passivation layer 1130 may be formed with an internal tensile stress or an internal compressive stress such that the backside silicon nitride passivation layer 1130 compensates for, or balances, a built-in stress in an upper portion of each semiconductor die 1000. Further, the backside silicon nitride passivation layer 1130 may be patterned and/or may be provided with a suitable thickness gradient or variation across the backside of each semiconductor die 1000 (for example, by employing a combination of a lithographic backside masking and an etch process) to function as a patterned stress balance layer. In case the backside silicon nitride passivation layer 1130 functions as a patterned stress balance layer, local stress applied by the backside silicon nitride passivation layer 1130 can be modulated by the pattern or the thickness variation in the backside silicon nitride passivation layer 1130 across the backside of a semiconductor die 1000. The stress applied by the backside silicon nitride passivation layer 1130 as a patterned stress balance layer may be anisotropic within the plane of the backside surface of the semiconductor die 1000. In other words, the stress applied by the backside silicon nitride passivation layer 1130 as a patterned stress balance layer may have different magnitudes and/or polarity depending on the azimuthal orientation around the geometrical center of a semiconductor die 1000 within the plane including the backside surface of the semiconductor die 1000. In this case, warpage of the semiconductor die 1000 may be effectively countered by the thickness modulation of the backside silicon nitride passivation layer 1130 as a patterned stress balance layer. In one embodiment, the stress applied by the backside silicon nitride passivation layer 1130 as a patterned stress balance layer may comprises local compressive stress that has the effect of enhancing the die strength for the semiconductor die 1000.

Referring to all drawings and according to various embodiments of the present disclosure, a method of forming singulated semiconductor dies is provided, which can comprising: forming a sacrificial bonding material layer on a front side surface of a carrier substrate; attaching a substrate semiconductor layer to a front side of the sacrificial bonding material layer; forming a plurality of semiconductor dies included within continuous material layers on a front side of the substrate semiconductor layer, each of the continuous material layers continuously extending over areas of the plurality of semiconductor dies; forming a plurality of dicing channels between neighboring pairs among the plurality of semiconductor dies at least by anisotropically etching portions of the continuous material layers located between neighboring pairs of semiconductor dies, wherein the plurality of dicing channels extends to a top surface of the sacrificial bonding material layer; and removing the sacrificial bonding material layer selective to materials of surface portions of the plurality of semiconductor dies using an isotropic etch process, wherein the plurality of semiconductor dies is singulated from one another upon removal of the sacrificial bonding material layer.

Referring to all drawings and according to various embodiments of the present disclosure, a three-dimensional memory device on a singulated semiconductor die 1000 is provided, which can comprise: three-dimensional memory device structures 710 located on a front side surface of a semiconductor substrate layer 9; a silicon nitride passivation layer 1130 (such as the backside silicon nitride passivation layer 1130) contacting an entirety of a backside surface of the semiconductor substrate layer 9; interconnect level dielectric layers (760, 380, 282, 284, 282) that include metal interconnect structures (780, 96, 98, 99, 388) and located over the substrate semiconductor layer 9; a cap silicon nitride passivation layer 384 contacting metallic +–s 392 electrically connected to the metal interconnect structures (780, 96, 98, 99, 288) and located over the interconnect level dielectric layers (780, 96, 98, 99, 288); and a silicon nitride passivation liner 1074 contacting an entirety of outer sidewalls of the interconnect level dielectric layers (780, 96, 98, 99, 288) and vertically extending between the silicon nitride passivation layer 1130 and the cap silicon nitride passivation layer 384.

Referring to all drawings and according to various embodiments of the present disclosure, a singulated semiconductor die 1000 is provided, which can comprise: semiconductor devices 710 located on a front side surface of a semiconductor substrate layer 9; interconnect level dielectric layers (780, 96, 98, 99, 288) that include metal interconnect structures (780, 96, 98, 99, 288) and located over the substrate semiconductor layer 9; and a silicon nitride passivation liner 1074 contacting an entirety of outer sidewalls of the interconnect level dielectric layers (780, 96, 98, 99, 288) and an entirety of outer sidewalls of the semiconductor substrate layer 9, wherein the singulated semiconductor die 1000 has a non-rectangular horizontal cross-sectional shape.

As semiconductor dies, such as dies including three-dimensional memory devices, are singulated through removal of a sacrificial bonding material layer and an anisotropic channel etch process, the various embodiments form singulated semiconductor dies without generating mechanical stress during the singulation process. As a result, yields are improved as damage from mechanical stress is reduced or eliminated. Further the costs and time of sawing are eliminated. Thus, various embodiments can increase the dicing yield and die reliability, as well as reduce manufacturing costs.

Figure 25:
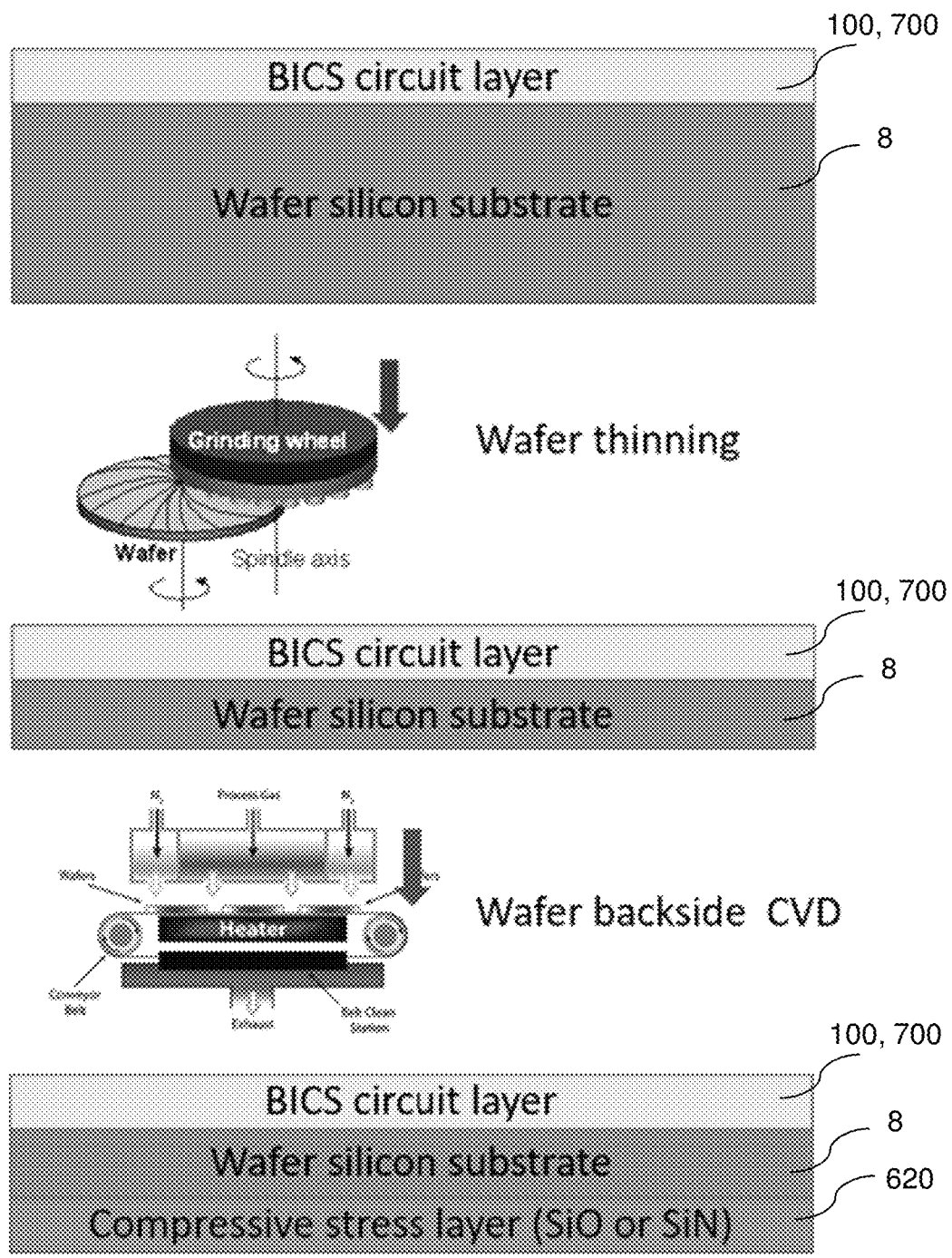
FIG. 25 illustrates a processing sequence for forming a backside stress layer on a wafer according to an embodiment of the present disclosure.

Referring to FIG. 25, a processing sequence is illustrated for forming a backside stress layer 620 on a backside surface of a substrate 8 after a thinning process according to an embodiment of the present disclosure. The substrate 8 of the various embodiments of the present disclosure can be thinned (e.g., by grinding) prior to dicing, and the backside stress layer 620 can be deposited (e.g., by CVD) on the backside surface of the thinned substrate 8. The backside stress layer 620 includes a stress-generating dielectric material such as silicon nitride or silicon oxide. In one embodiment, the semiconductor structure (100, 700) (e.g., the memory array region 100 and the peripheral device region 700 and optionally the contact region 200 and peripheral region 400) formed on the front side of the substrate 8 can generate a compressive stress, and the backside stress layer 620 can apply a compressive stress that balances the warpage (e.g., strain caused by the stress imposed by the semiconductor structure (100, 700) on the front side of the substrate 8 to minimize warpage of the substrate 8.

Referring to FIGS. 26A-26C, the backside stress layer 620 can be patterned or can employ multiple layers applying different stress. Localized stress can be generated to reduce wafer warpage before dicing of the wafer. FIG. 26A illustrates a configuration in which portions of the backside stress layer 620 are thinned only in selected areas over the backside surface of a substrate, i.e., a wafer. FIG. 26B illustrates an embodiment in which a composite layer is employed for the backside stress layer 620 over a wafer. Specifically, a first backside stress layer applying a lower level of compressive stress can be formed and patterned on the backside of the substrate 8, and a second backside stress layer applying a higher level of compressive stress can be formed over the patterned first backside stress layer. The second backside stress layer can be planarized, for example, with chemical mechanical planarization to provide a backside stress layer 60 formed as a composite material layer and having a compositional modulation. FIG. 26C illustrates a configuration in which portions of the backside stress layer 620 are completely removed.

Figure 27A:
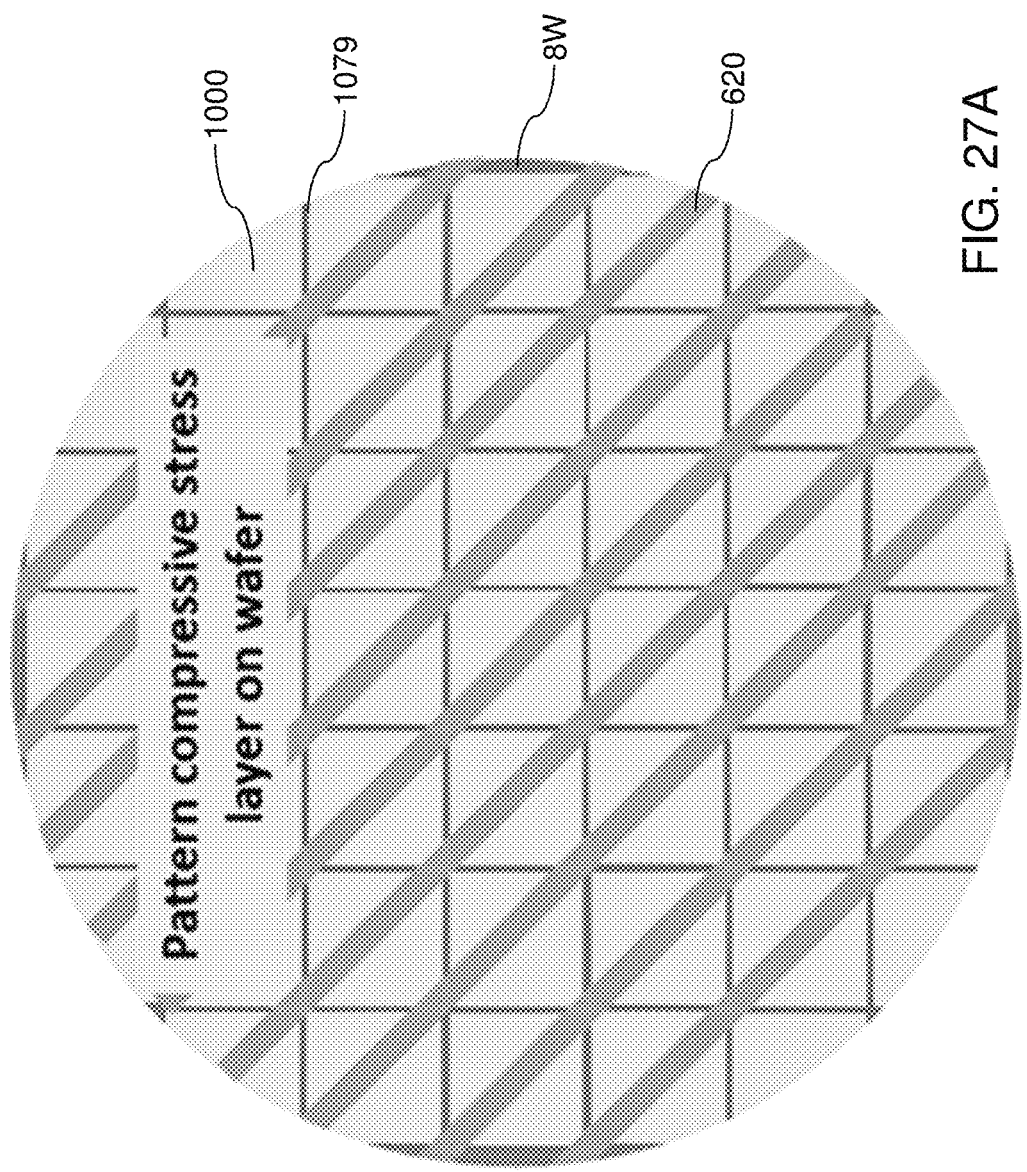
FIGS. 27A and 27B are additional configurations for a patterned backside stress layer on a semiconductor wafer according to embodiments of the present disclosure.
Figure 27B:
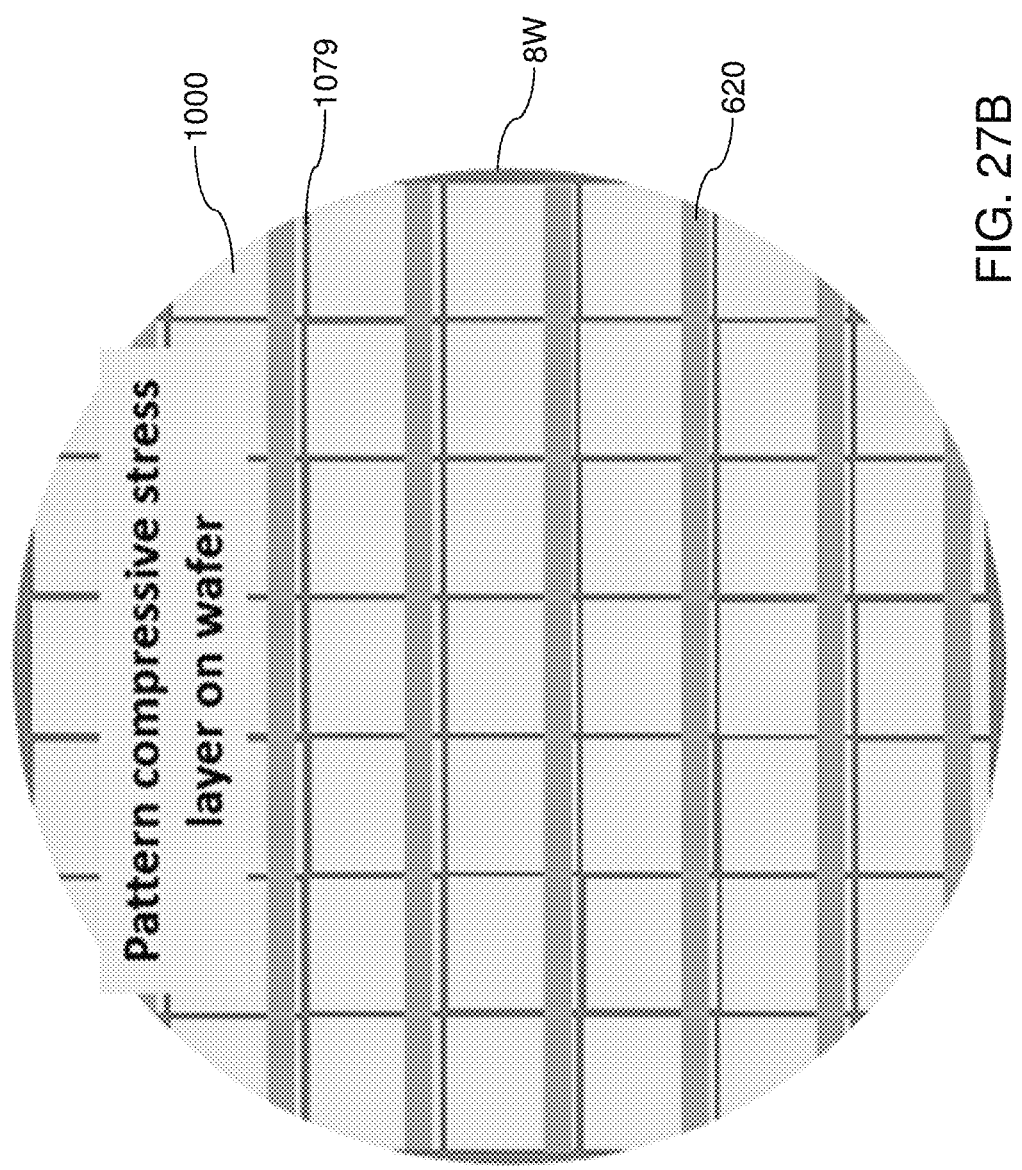

FIGS. 27A and 27B illustrate exemplary layouts for a patterned backside stress layer 620 on a silicon wafer 8W. The stress layer 620 can be patterned into strips which extend non-parallel (e.g., at an angle between 30 and 60 degrees, such as 45 degrees) to the die dicing direction along dicing channels 1079 between semiconductor die 1000, as shown in FIG. 27A. Alternatively, the stress layer 620 can be patterned into strips which extend parallel to one die dicing direction along dicing channels 1079 between semiconductor die 1000, as shown in FIG. 27B.

Figure 28:
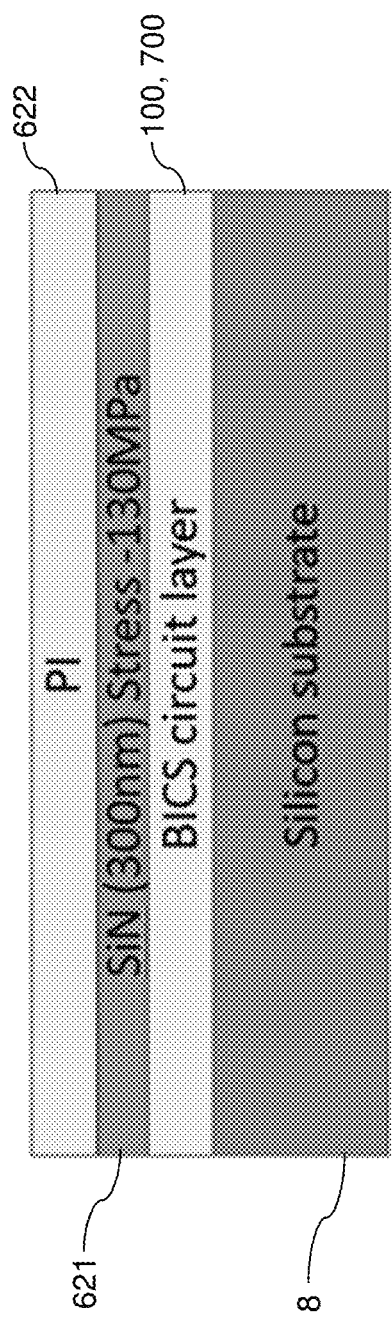
FIG. 28 is a vertical cross-sectional view of a semiconductor wafer with a front-side stress layer according to an embodiment of the present disclosure.

Referring to FIG. 28, a vertical cross-sectional view of a semiconductor wafer is illustrated, which includes a frontside stress layer 621 and an overlying insulating layer 622.

The front-side stress layer 621 can include silicon nitride, and can have a thickness in a range from 150 nm to 600 nm, such as 300 nm. The front-side stress layer can generate a stress, that is the opposite type of stress that the semiconductor structure (100, 700) formed on the front side of the substrate 8 generates. For example, if the semiconductor structure formed on the front side of the substrate 8 generates a compressive stress, the front-side stress layer can generate a tensile stress. The magnitude of the stress that the front-side stress layer generates 621 can be in a range from 100 MPa to 2 GPa, such as 130 MPa.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming singulated semiconductor dies, comprising:
    forming a sacrificial bonding material layer on a front side surface of a carrier substrate;
    attaching a substrate semiconductor layer to a front side of the sacrificial bonding material layer;
    forming a plurality of non-singulated semiconductor dies included within one or more continuous material layers on a front side of the substrate semiconductor layer;
    forming a plurality of dicing channels, a respective one of the plurality of dicing channels located between neighboring pairs among the plurality of non-singulated semiconductor dies at least by anisotropically etching one or more portions of the one or more continuous material layers located between the neighboring pairs of the plurality of non-singulated semiconductor dies, wherein the plurality of dicing channels extend to the front side of the sacrificial bonding material layer; and
    removing the sacrificial bonding material layer selective to any exposed surface portions of the plurality of non-singulated semiconductor dies using an isotropic etch process, wherein the plurality of non-singulated semiconductor dies is singulated from one another upon removal of the sacrificial bonding material layer to form the plurality of singulated semiconductor dies.

2. The method of claim 1, wherein attaching the substrate semiconductor layer to the front side of the sacrificial bonding material layer comprises bonding the substrate semiconductor layer to the sacrificial bonding material layer directly or through an intermediate dielectric material layer.

3. The method of claim 2, wherein:
    the substrate semiconductor layer comprises a single crystalline semiconductor material; and
    each of the plurality of semiconductor dies comprises a respective set of semiconductor devices formed directly on the substrate semiconductor layer.

4. The method of claim 3, further comprising:
    bonding a source semiconductor substrate including a buried hydrogen implantation layer to the front side of the sacrificial bonding material layer; and
    separating a distal portion of the source semiconductor substrate from the sacrificial bonding material layer by cleaving the source semiconductor substrate at the buried hydrogen implantation layer, wherein a remaining proximal portion of the source semiconductor substrate that is attached to the sacrificial bonding material layer constitutes the substrate semiconductor layer.

5. The method of claim 2, wherein:
    the substrate semiconductor layer is bonded to the sacrificial bonding material layer through the intermediate dielectric material layer; and
    the intermediate dielectric material layer comprises a silicon nitride passivation layer.

6. The method of claim 5, further comprising:
    depositing a continuous silicon nitride liner on a top surface of the silicon nitride passivation layer; and
    performing an anisotropic etch process that anisotropically etches the continuous silicon nitride liner and the silicon nitride passivation layer to form the plurality of dicing channels, wherein remaining portions of the continuous silicon nitride liner comprise silicon nitride passivation liners that laterally surround a respective one of the plurality of non-singulated semiconductor dies, and portions of the top surface of the sacrificial bonding material layer are physically exposed between each neighboring pair of semiconductor dies of the plurality of non-singulated semiconductor dies.

7. The method of claim 6, wherein the isotropic etch process uses an etch chemistry that removes a material of the sacrificial bonding material layer selective to the silicon nitride passivation liners and the silicon nitride passivation layer.

8. The method of claim 7, wherein the isotropic etch process uses a wet etch chemical comprising at least one of hydrofluoric acid, sodium hydroxide, and potassium hydroxide.

9. The method of claim 7, wherein the sacrificial bonding material layer comprises one of a doped silicate glass, undoped silicate glass, organosilicate glass, or thermal silicon oxide.

10. The method of claim 6, wherein the continuous material layers comprise:
    interconnect level dielectric layers;
    metal interconnect structures located within the interconnect level dielectric layers;
    metallic contact pads electrically connected to the metal interconnect structures; and
    a cap silicon nitride passivation layer contacting the metallic contact pads.

11. The method of claim 10, wherein the surface portions of each of the plurality of semiconductor dies exposed after singulation consist of side surfaces of remaining portions of the silicon nitride passivation layer, surfaces of the silicon nitride passivation liner, surfaces of a remaining portion of the cap silicon nitride passivation layer, and surfaces of a subset of the metallic contact pads.

12. The method of claim 1, wherein:
    the sacrificial bonding material layer has a first thickness in a range from 5 microns to 20 microns; and
    the substrate semiconductor layer has a second thickness in a range from 200 nm to 10 microns.

13. The method of claim 1, wherein:
the continuous material layers have a total thickness in a range from 20 microns to 100 microns; and
each of the plurality of non-singulated semiconductor dies includes a respective three-dimensional memory device included within the continuous material layers.

14. The method of claim 13, wherein:
each respective three-dimensional memory device comprises a two-dimensional array of vertical NAND strings that extend through an alternating stack of insulating layers and electrically conductive layers;
each of the semiconductor dies of the plurality of semiconductor dies further comprises a respective set of complementary metal oxide semiconductor (CMOS) devices formed directly on the front side of the substrate semiconductor layer; and
the continuous material layers comprise:
lower-level dielectric material layers; and
lower-level metal interconnect structures which are electrically connected to the respective set of CMOS devices and to the three-dimensional memory device.

15. The method of claim 1, wherein each of the plurality of semiconductor dies has a non-rectangular horizontal cross-sectional shape.

16. The method of claim 15, wherein at least one of the plurality of semiconductor dies has a curved horizontal cross-sectional shape.

17. The method of claim 1, wherein the plurality of dicing channels laterally extends along at least three different horizontal directions.

\* \* \* \* \*